US008085964B2

(12) United States Patent
Cohen et al.

(10) Patent No.: US 8,085,964 B2
(45) Date of Patent: Dec. 27, 2011

(54) APPARATUS AND METHODS FOR GENERATING PRESSURE WAVES

(75) Inventors: Yuval Cohen, Rehovot (IL); Daniel Lewin, Tel Aviv (IL); Shay Kaplan, Givat Ela (IL)

(73) Assignee: Audio Pixels Ltd., Tel Aviv (IL)

( * ) Notice: Subject to any disclaimer, the term of this patent is extended or adjusted under 35 U.S.C. 154(b) by 611 days.

(21) Appl. No.: 12/301,951

(22) PCT Filed: May 21, 2007

(86) PCT No.: PCT/IL2007/000622
§ 371 (c)(1),
(2), (4) Date: Nov. 21, 2008

(87) PCT Pub. No.: WO2007/135680
PCT Pub. Date: Nov. 29, 2007

(65) Prior Publication Data
US 2010/0002900 A1 Jan. 7, 2010

Related U.S. Application Data

(60) Provisional application No. 60/802,126, filed on May 22, 2006, provisional application No. 60/907,450, filed on Apr. 2, 2007, provisional application No. 60/924,203, filed on May 3, 2007.

(51) Int. Cl.
*H04R 1/00* (2006.01)
(52) U.S. Cl. ........................................ 381/334; 381/396
(58) Field of Classification Search .................. 381/334, 381/333, 396, 191, 412, 332, 337, 41
See application file for complete search history.

(56) References Cited

U.S. PATENT DOCUMENTS

| 4,131,363 | A | 12/1978 | Shea et al. |
| 4,194,095 | A | 3/1980 | Doi et al. |
| 4,337,379 | A | 6/1982 | Nakaya |

(Continued)

FOREIGN PATENT DOCUMENTS

EP 0 437 999 A2 12/1990

(Continued)

OTHER PUBLICATIONS

Lagorce, L. K. and M. G. Allen, "Magnetic and Mechanical Properties of Micro-machined Strontium Ferrite/Polyimide Composites", IEEE Journal of Micro-electromechanical Systems, vol. 6, No. 4, Dec. 1977.

(Continued)

*Primary Examiner* — Savitri Mulpuri
(74) *Attorney, Agent, or Firm* — Oliff & Berridge, PLC

(57) ABSTRACT

Actuator apparatus for generating a physical effect, at least one attribute of which corresponds to at least one characteristic of a digital input signal sampled periodically in accordance with a clock, the apparatus comprising at least one array of moving elements each constrained to travel alternately back and forth along a respective axis in response to an alternating electromagnetic force applied to the array of moving elements, at least one latch operative to selectively latch at least one subset of said moving elements in at least on latching position there by to prevent the individual moving elements from responding to the electromagnetic force, an electromagnetic field control system operative to receive the clock and, accordingly, to control application of the electromagnetic force to the array of moving elements and a latch controller operative to receive the digital input signal and to control the latch accordingly.

43 Claims, 39 Drawing Sheets

U.S. PATENT DOCUMENTS

| | | | |
|---|---|---|---|
| 4,515,997 | A | 5/1985 | Stinger, Jr. |
| 5,517,570 | A | 5/1996 | Taylor |
| 5,574,792 | A | 11/1996 | Konno |
| 5,580,639 | A | 12/1996 | Togawa et al. |
| 5,953,200 | A | 9/1999 | Haley et al. |
| 6,094,116 | A | 7/2000 | Tai et al. |
| 6,125,189 | A | 9/2000 | Yasuno et al. |
| 6,289,106 | B1 | 9/2001 | Wong |
| 6,373,955 | B1 | 4/2002 | Hooley |
| 6,403,995 | B2 | 6/2002 | Thomas |
| 6,795,561 | B1 | 9/2004 | Bank |
| 6,959,096 | B2 | 10/2005 | Boone et al. |
| 6,963,654 | B2 | 11/2005 | Sotme et al. |
| 6,975,740 | B2 | 12/2005 | Rautio et al. |
| 7,016,186 | B2 | 3/2006 | Ueda et al. |
| 7,286,681 | B2 | 10/2007 | Gerkinsmeyer |
| 2001/0048123 | A1 | 12/2001 | Thomas |
| 2002/0073856 | A1 | 6/2002 | Davis et al. |
| 2002/0106093 | A1 | 8/2002 | Azima et al. |
| 2002/0151171 | A1 | 10/2002 | Furusawa |
| 2003/0068054 | A1 | 4/2003 | Sotme et al. |
| 2003/0129814 | A1 | 7/2003 | Mizukoshi |
| 2004/0122543 | A1 | 6/2004 | Lee et al. |
| 2005/0008171 | A1 | 1/2005 | Hosoi et al. |
| 2005/0207588 | A1 | 9/2005 | Biegelsen |
| 2006/0145059 | A1 | 7/2006 | Lee et al. |
| 2010/0008521 | A1 | 1/2010 | Cohen et al. |
| 2010/0166242 | A1 | 7/2010 | Cohen et al. |
| 2010/0316242 | A1 | 12/2010 | Cohen et al. |

FOREIGN PATENT DOCUMENTS

| | | | |
|---|---|---|---|
| EP | 1 063 866 | A1 | 12/2000 |
| EP | 1 065 725 | A2 | 1/2001 |
| EP | 1 465 211 | A2 | 10/2004 |
| EP | 1 653 614 | A1 | 5/2006 |
| GB | 1 106 750 | A | 4/1983 |
| GB | 2 393 601 | A | 3/2004 |
| JP | A-51-120710 | | 10/1976 |
| JP | A-57-185790 | | 11/1982 |
| JP | A-09-266599 | | 10/1997 |
| JP | A-20001-016675 | | 1/2001 |
| JP | A-2005-087929 | | 4/2005 |
| NL | 6613713 | A | 4/1968 |
| WO | WO 84/00460 | | 2/1984 |
| WO | WO 98/24544 | | 6/1998 |
| WO | WO 01/23104 | A2 | 4/2001 |
| WO | WO 01/87458 | A1 | 11/2001 |
| WO | WO 03/059005 | A2 | 7/2003 |
| WO | WO 2007/135678 | A2 | 11/2007 |
| WO | WO 2007/135680 | A1 | 11/2007 |

OTHER PUBLICATIONS

Lagorce, L. K., Brand, O. and M. G. Allen, "Magnetic micro actuators based on polymer magnets", IEEE Journal of Micro-electromechanical Systems, vol. 8, No. 1, Mar. 1999.

BBE Sound, Inc., "DS48 Digital Speaker Processor", BBE Professional Products.

Diamond, A. M., et al. "Digital Sound Reconstruction using Arrays of CMOS-MEMS Microspeakers", Transducers, Solid-State Sensors, Actuators and Microsystems, $12^{th}$ International Conference, Piscataway, NJ, US, IEEE, vol. 9, Jun. 9, 2003, p. 238-241.

Hawksford, M.O.J., "Smart Digital Loudspeaker Arrays", Journal of the Audio Engineering Society, New York, NY, US, vol. 51, No. 12, Dec. 2003, p. 1133-1162.

Huang, Y., et al., "Distortion and Directivity in a Digital Transducer Array Loudspeaker", Journal of the Audio Engineering Society, New York, NY, US, vol. 49, No. 5, May 2001, p. 337-352.

Meyer, D.G., "Digital Control of Loudspeaker Array Directivity", Journal of the Audio Engineering Society, New York, NY, US, vol. 32, No. 10, Oct. 1984, pp. 747-754.

Crocker, M.J., "Encyclopedia of Acoustics", Wiley-Interscience, Apr. 22, 1997.

Kinsler, L.E., et al., "Fundamentals of Acoustics".

Raichel, D.R., "The science and Applications of Acoustics".

Rossing, T. D., et al., "Principles of Vibration and Sound".

Fahy, F., "Foundations of Engineering Acoustics".

Neumann, J.J., Jr., "MEMS (Microelectromechanical Systems) Audio Devices—Dreams and Realities", Audio Engineering Society, Convention paper, Oct. 10-13, 2003.

Yamaha, "Multi-channel Surround Sound from a single component", Digital Sound Projections.

May 10, 2007 International Search Reports issued in PCT/IL2007/000622.

May 11, 2007 International Search Report issued in PCT/IL2007/000618.

Mar. 3, 2008 International Search Report issued in PCT/IL2007/000621.

Jun. 18, 2009 International Search Report issued in PCT/IL2008/001524.

Mar. 3, 2010 International Preliminary Report on Patentability issued in PCT/IL2008/001524.

| Hatching | | Represents |
|---|---|---|
|  | I | Electrostatic latch |
|  | II | Gasket |
|  | III | Magnet |
|  | IV | Flexure |
|  | V | Top spacer |
|  | VI | Bottom spacer |

701
702
703
706

704
705

APPARATUS AND METHODS FOR GENERATING PRESSURE WAVES

REFERENCE TO CO-PENDING APPLICATIONS

Priority is claimed from U.S. provisional application No. 60/802,126 filed 22 May 2006 and entitled "An apparatus for generating pressure" and from a U.S. provisional application No. 60/907,450 filed 2 Apr. 2007 and entitled "Apparatus for generating pressure and methods of manufacture thereof" and from U.S. provisional application 60/924,203 filed 3 May 2007 and entitled "Apparatus and Methods for Generating Pressure Waves".

FIELD OF THE INVENTION

The present invention relates generally to actuators and specifically to speakers.

BACKGROUND OF THE INVENTION

The state of the art for actuators comprising an array of micro actuators is believed to be represented by the following, all of which are US patent documents unless otherwise indicated:
  2002/0106093: The Abstract, FIGS. 1-42 and paragraphs 0009, 0023, and 0028 show electromagnetic radiation, actuators and transducers and electrostatic devices.
  U.S. Pat. No. 6,373,955: The Abstract and column 4, line 34-column 5, line 55 show an array of transducers.
  JP 2001016675: The Abstract shows an array of acoustic output transducers.
  U.S. Pat. No. 6,963,654: The Abstract, FIGS. 1-3, 7-9 and column 7, line 41-column 8, line 54 show the transducer operation based on an electromagnetic force.
  U.S. Pat. No. 6,125,189: The Abstract; FIGS. 1-4 and column 4, line 1-column 5, line 46, show an electro-acoustic transducing unit including electrostatic driving.
  WO 8400460: The Abstract shows an electromagnetic-acoustic transducer having an array of magnets.
  U.S. Pat. No. 4,337,379: The Abstract; column 3, lines 28-40, and FIGS. 4, 9 show electromagnetic forces.
  U.S. Pat. No. 4,515,997: The Abstract and column 4, lines 16-20, show volume level.
  U.S. Pat. No. 6,795,561: Column 7, lines 18-20, shows an array of micro actuators.
  U.S. Pat. No. 5,517,570: The Abstract shows mapping aural phenomena to discrete, addressable sound pixels.
  JP 57185790: The Abstract shows eliminating the need for a D/A converter.
  JP 51120710: The Abstract shows a digital speaker system which does not require any D-A converter.
  JP 09266599: The Abstract shows directly applying the digital signal to a speaker.
  U.S. Pat. No. 6,959,096: The Abstract and column 4, lines 50-63 show a plurality of transducers arranged within an array.
Methods for manufacturing polymer magnets are described in the following publications:
  Lagorce, L. K. and M. G. Allen, "Magnetic and Mechanical Properties of Micro-machined Strontium Ferrite/Polyimide Composites", IEEE Journal of Micro-electromechanical Systems, 6(4), December 1997; and
  Lagorce, L. K., Brand, O. and M. G. Allen, "Magnetic micro actuators based on polymer magnets", IEEE Journal of Micro-electromechanical Systems, 8(1), March 1999.

U.S. Pat. No. 4,337,379 to Nakaya describes a planar electrodynamics electro-acoustic transducer including, in FIG. 4A, a coil-like structure.

U.S. Pat. No. 6,963,654 to Sotme et al describes a diaphragm, flat-type acoustic transducer and flat-type diaphragm. The Sotme system includes, in FIG. 7, a coil-like structure.

The disclosures of all publications and patent documents mentioned in the specification, and of the publications and patent documents cited therein directly or indirectly, are hereby incorporated by reference.

SUMMARY OF THE INVENTION

The present invention provides, in accordance with a preferred embodiment thereof, an array of micro speakers for generating a sound that corresponds to received sound intensity, coded into a digital input signal, wherein each micro speaker includes a moving element; substantially all the moving elements are configured to move in a long oscillating stroke in response to applying an alternating electromagnetic force; selected elements from the array are restrained from or are allowed to respond to the oscillating stroke in response to electrostatic force which is applied thereto and which prevails over the electromagnetic force and, typically, the spring retraction force, whereby the number of oscillating elements is substantially proportional to the intensity of the sound coded into the digital signal.

Further in accordance with a preferred embodiment of the present invention, selected elements are addressed individually. Alternatively or in addition, selected elements are addressed in groups.

Further in accordance with a preferred embodiment of the present invention, $2^n$ elements are configured to move or are restrained from moving in response to the value of the (n+k)th bit of the input signal.

Still further in accordance with a preferred embodiment of the present invention, the element comprises a plate restrained by compliant flexures.

Further in accordance with a preferred embodiment of the present invention, the element is configured as a round plate with serpentine flexures.

Additionally in accordance with a preferred embodiment of the present invention, the element flexures are made of a material of sufficient elasticity.

Further in accordance with a preferred embodiment of the present invention, the element comprises a free floating moving element.

Still further in accordance with a preferred embodiment of the present invention, the electromagnetic force is generated using a coil that surrounds the array.

The array may be manufactured using layer laminating technology, and/or PCB production technology, and/or wafer bonding technology and/or a suitable combination of these technologies.

Also provided, in accordance with a preferred embodiment of the present invention, is an actuator apparatus comprising an electromagnet generating a magnetic field, an electrode, a magnetic force-driven movable part operative to move toward and away from the electrode along a gradient of the magnetic field, the movable part including a permanent magnet disposed within the magnetic field, at least a portion of the movable part having a first electrical potential, and wherein the electrode is selectively charged by a second electrical potential which differs from the first electrical potential and is operative to provide selective motion of the movable part in the desired direction of motion responsive to the magnetic field by selectively electrostatically latching the movable part thereby to selectively prevent motion of the movable part responsive to the magnetic field.

In yet other embodiments, the actuation electromagnetic coil may be constructed as a conductor line passing and carrying electrical current along a line, which is located on the sides of the elements, either as a part of an electrode layer, as a spacer layer or on a separate PCB like layer with openings corresponding to the tunnels in the spacer layer located below or above or both below and above the actuator structure.

There is thus provided, in accordance with a preferred embodiment of the present invention, an actuator apparatus for generating a physical effect, at least one attribute of which corresponds to at least one characteristic of a digital input signal sampled periodically in accordance with a clock, the apparatus comprising at least one actuator device, each actuating device including an array of moving elements, wherein each individual moving element is responsive to alternating magnetic fields and is constrained to travel alternately back and forth along a respective axis responsive to an electromagnetic force operative thereupon when in the presence of an alternating magnetic field, at least one latch operative to selectively latch at least one subset of said moving elements in at least one latching position thereby to prevent said individual moving elements from responding to said electromagnetic force, a magnetic field control system operative to receive the clock and, accordingly, to control application of said electromagnetic force to said array of moving elements; and a latch controller operative to receive said digital input signal and to control said at least one latch accordingly.

Further in accordance with a preferred embodiment of the present invention, the array of moving elements is disposed within a fluid medium and wherein at least one of the magnetic field control system and the latch controller is operative to define at least one attribute of the sound to correspond to at least one characteristic of the digital input signal.

Still further in accordance with a preferred embodiment of the present invention, the sound has at least one wavelength thereby to define a shortest wavelength present in the sound and wherein each the moving element defines a cross section which is perpendicular to its axis of movement and which defines a largest dimension thereof and wherein the largest dimension of each the cross-section is small relative to the shortest wavelength.

Further in accordance with a preferred embodiment of the present invention, the largest dimension of each the cross-sections is an order of magnitude smaller than the shortest wavelength.

Still further in accordance with a preferred embodiment of the present invention, at least one latch comprises an electrostatic latch.

Further in accordance with a preferred embodiment of the present invention, at least one latch comprises at least one electrode and at least one space maintainer disposed between the array of moving elements and the at least one electrode.

Still further in accordance with a preferred embodiment of the present invention, at least one space maintainer is formed of an insulating material.

Further in accordance with a preferred embodiment of the present invention, at least one latch comprises two latches for each moving element operative to latch the moving element in two latching positions respectively.

Still further in accordance with a preferred embodiment of the present invention, at least one of the moving elements comprises a permanent magnet.

Further in accordance with a preferred embodiment of the present invention, at least one of the moving elements comprises a conductor.

Further in accordance with a preferred embodiment of the present invention, at least one of the moving elements is formed of a ferro magnetic material.

Still further in accordance with a preferred embodiment of the present invention, the latch controller, in at least one mode of latch control operation, is operative to set the number of moving elements which oscillate freely responsive to the electromagnetic force to be substantially proportional to sound signal intensity information coded in the digital input signal.

Further in accordance with a preferred embodiment of the present invention, the array comprises a plurality of rows of moving elements wherein consecutive rows are mutually skewed.

Still further in accordance with a preferred embodiment of the present invention, the axis comprises a first half-axis and a second co-linear half-axis and the two latching positions includes a first latching position disposed within the first half-axis and a second latching position disposed within the second half-axis.

Further in accordance with a preferred embodiment of the present invention, the latch controller is operative to address at least some of the moving elements individually.

Additionally in accordance with a preferred embodiment of the present invention, the latch controller is operative to collectively address at least one group of moving elements which is a subset of the array of moving elements.

Further in accordance with a preferred embodiment of the present invention, the latch controller is operative to collectively address each of a sequence of groups characterized in that each n'th group in the sequence contains M times as many moving elements as the preceding (n−1)th group where M is an integer.

Still further in accordance with a preferred embodiment of the present invention, at least one of the moving elements has a cross section defining a periphery and is restrained by at least one flexure attached to the periphery.

Further in accordance with a preferred embodiment of the present invention, at least one moving element and its restraining flexures are formed from a single sheet of material.

Still further in accordance with a preferred embodiment of the present invention, at least one flexure is serpentine.

Additionally in accordance with a preferred embodiment of the present invention, at least one flexure is formed of an elastic material.

Still further in accordance with a preferred embodiment of the present invention, the moving element comprises a free floating element.

Additionally in accordance with a preferred embodiment of the present invention, the electromagnetic force is generated using a coil that surrounds the array.

Further in accordance with a preferred embodiment of the present invention, the latch is operative to selectively latch at least individual ones of the moving elements in a selectable one of two latching positions thereby to prevent the individual moving elements from responding to the electromagnetic force.

Also provided, in accordance with another preferred embodiment of the present invention, is an actuation method for generating a physical effect, at least one attribute of which corresponds to at least one characteristic of a digital input signal sampled periodically in accordance with a clock, the method comprising providing at least one array of moving elements each constrained to travel alternately back and forth along a respective axis in response to an electromagnetic force operative thereupon when in the presence of an alternating magnetic field, selectively latching at least one subset of the moving elements in at least one latching position thereby to prevent individual moving elements from responding to the electromagnetic force, receiving the clock and, accordingly, controlling application of the electromagnetic force to the array of moving elements, and receiving the digital input signal and controlling the latching step accordingly.

Further in accordance with a preferred embodiment of the present invention, the latch comprises a pair of electrostatic latches and at least one space maintainer separates the pair of latches and is formed of an insulating material and wherein the latch and at least one space maintainer are manufactured using PCB production technology.

Still further in accordance with a preferred embodiment of the present invention, the array of moving elements comprises a magnetic layer sandwiched between a pair of electrode layers spaced from the magnetic layer by a pair of dielectric spacer layers.

Further in accordance with a preferred embodiment of the present invention, at least one of the layers is manufactured using wafer bonding technology.

Still further in accordance with a preferred embodiment of the present invention, at least one of the layers is manufactured using layer laminating technology.

Additionally in accordance with a preferred embodiment of the present invention, at least one of the layers is manufactured using PCB production technology.

Still further in accordance with a preferred embodiment of the present invention, at least one latch has a notched configuration.

Additionally in accordance with a preferred embodiment of the present invention, at least one latch has an annular configuration.

Further in accordance with a preferred embodiment of the present invention, at least one latch has a perforated configuration.

Still further in accordance with a preferred embodiment of the present invention, at least one latch has a configuration which includes a central area which prevents air from passing so as retard escape of air thereby to cushion contact between the moving element and the latch.

Further in accordance with a preferred embodiment of the present invention, at least one of the moving elements is configured to prevent leakage of air through the at least one flexure.

Still further in accordance with a preferred embodiment of the present invention, the apparatus also comprises at least one space maintainer disposed between the array of moving elements and the latch, the space maintainer defining a cylinder having a cross section, and wherein at least one of the moving elements comprises an elongate element whose cross-section is small enough to avoid the flexures and a head element mounted thereupon whose cross-section is similar to the cross-section of the cylinder.

Further in accordance with a preferred embodiment of the present invention, at least one permanent magnet is annular.

Still further in accordance with a preferred embodiment of the present invention, the moving element has first and second sides facing the first and second ends of the axis respectively and wherein at least one permanent magnet is disposed on at least one of the first and second sides.

Further in accordance with a preferred embodiment of the present invention, the method also comprises putting the array of moving elements into motion including bringing the array of moving elements into at least one latching position.

Still further in accordance with a preferred embodiment of the present invention, the at least one latching position comprises a top latching position and a bottom latching position and wherein the step of bringing the array into at least one latching position comprises bringing a first subset of the moving elements in the array into their top latching positions and a second subset, comprising all remaining elements in the array into their bottom latching positions, wherein the first and second subsets are selected such that when the moving elements in the first and second subsets are in their top and bottom latching positions respectively, the total pressure produced by the moving elements in the first subset is equal in magnitude and opposite in direction to the total pressure produced by the moving elements in the second subset.

Further in accordance with a preferred embodiment of the present invention, the moving elements bear a charge having a predetermined polarity and the moving elements each define an individual natural resonance frequency thereby to define a natural resonance frequency range for the array of moving elements, wherein first and second electro-static latches are provided which are operative to latch the moving elements into the top and bottom latching positions respectively when charged with a polarity opposite to the predetermined polarity.

Still further in accordance with a preferred embodiment of the present invention, the step of putting the array of moving elements into motion comprises charging the first electro-static latch of each moving element included in the first subset with a polarity opposite to the predetermined polarity, charging the second electro-static latch of each moving element included in the second subset with a polarity opposite to the predetermined polarity, and applying a sequence of electromagnetic forces of alternating polarities to the array of moving elements, wherein the time interval between consecutive applications of force of the same polarity varies over time, thereby to define a changing frequency level for the sequence, thereby to increase, at any time t, amplitude of oscillation of all moving elements whose individual natural resonance frequency is sufficiently similar to the frequency level at time t, wherein the frequency level varies sufficiently slowly to enable the set S of all moving elements whose natural resonance frequency is similar to the current frequency level to be latched before the frequency level becomes so dis-similar to their natural resonance frequency as to cease increasing the amplitude of oscillation of the set S of moving elements, and wherein the extent of variation of the frequency level corresponds to the natural resonance frequency range.

Further in accordance with a preferred embodiment of the present invention, the array comprises a plurality of rows of moving elements wherein consecutive rows are mutually aligned.

Still further in accordance with a preferred embodiment of the present invention, the at least one actuating device comprises a plurality of actuating devices.

Further in accordance with a preferred embodiment of the present invention, the magnetic field control system also comprises a magnetic field generator generating a magnetic field across at least a portion of the array of moving elements and a magnetic field controller which controls the generator according to the clock.

Still further in accordance with a preferred embodiment of the present invention, the step of selectively latching is synchronized to the clock.

Further in accordance with a preferred embodiment of the present invention, the array has a center and wherein the step of selectively latching comprises latching specific moving elements at a time determined by the distance of the specific moving elements from the center of the array.

Still further in accordance with a preferred embodiment of the present invention, the magnetic field generator comprises at least one conductor.

Additionally in accordance with a preferred embodiment of the present invention, the conductor comprises a coil having at least one turn.

Further in accordance with a preferred embodiment of the present invention, the magnetic field generator comprises at least one power source connected to at least one conductor.

Still further in accordance with a preferred embodiment of the present invention, at least one flexure consists of 3 flexures.

Additionally in accordance with a preferred embodiment of the present invention, the 3 flexures are separated respectively by 120 degrees.

Optionally, addressing of electrodes in the apparatus of FIGS. 1-19 is achieved by providing two patterned layers of perpendicular interconnects between select electrodes and suitable signal processing methods and a memory device at each junction, which effectively allow addressing each electrode through its own unique X, Y coordinate.

Additionally in accordance with a preferred embodiment of the present invention, the flexures are non-uniform in cross-section.

Further in accordance with a preferred embodiment of the present invention, the flexures include first and second portions having different cross-sectional widths.

Still further in accordance with a preferred embodiment of the present invention, the flexures include first and second portions having different cross-sectional thicknesses.

Regarding Terminology Used Herein:

Array: This term is intended to include any set of moving elements whose axes are preferably disposed in mutually parallel orientation and flush with one another so as to define a surface which may be planar or curved.

Above, Below: It is appreciated that the terms "above" and "below" and the like are used herein assuming that, as illustrated by way of example, the direction of motion of the moving elements is up and down however this need not be the case and alternatively the moving elements may move along any desired axis such as a horizontal axis.

Actuator: This term is intended to include transducers and other devices for inter-conversion of energy forms. When the term transducers is used, this is merely by way of example and it is intended to refer to all suitable actuators such as speakers, including loudspeakers.

Actuator element: This term is intended to include any "column" of components which, typically in conjunction with many other such columns, forms an actuator, each column typically including a moving element, a pair of latches or "latching elements" therefor, each latching element including one or more electrodes and insulative spacing material separating the moving element from the Coil: It is appreciated that the alternating electromagnetic force applied to the array of moving elements in accordance with a preferred embodiment of the present invention may be generated by an alternating electric current oriented to produce a magnetic field gradient which is co-linear to the desired axes of motion of the moving elements. This electric current may comprise current flowing through a suitably oriented conductive coil or conductive element of any other suitable configuration. The term "coil" is used throughout the present specification as an example however it is appreciated that there is no intention to limit the invention which is intended to include all apparatus for applying an alternating electromagnetic force e.g. as described above. When "coil" is used to indicate a conductor, it is appreciated that the conductor may have any suitable configuration such as a circle or other closed figure or substantial portion thereof and is not intended to be limited to configurations having multiple turns.

Channels, also termed "holes" or "tunnels": These are illustrated as being cylindrical merely by way of example, this need not be the case.

Electrode: An electro-static latch. Includes either the bottom or top electro-static latch which latches its corresponding moving element by virtue of its being oppositely charged such that each latch and its moving element constitute a pair of oppositely charged electrodes.

Flexure: at least one flexible element on which an object is mounted, imparting at least one degree of freedom of motion to that object, for example, one or more flexible thin or small elements peripheral to and typically integrally formed e.g. from a single sheet of material, with a central portion on which another object may or may not be mounted, thereby to impart at least one degree of freedom of motion to the central portion and objects mounted thereupon.

Latch, latching layer, latching mechanism: This term is intended to include any device for selectively locking one or more moving elements into a fixed position. Typically, "top" and "bottom" latching layers are provided, which may be side by side and need not be one atop the other, and each latching layer includes one or many latching mechanisms which may or may not correspond in number to the number of moving elements to be latched. The term "latch pair" is a pair of latches for an individual moving element e.g. including a top latch and a bottom latch, which may be side by side and need not be one atop the other.

Moving elements: These are intended to include any moving elements each constrained to travel alternately back and forth along an axis in response to an alternating electromagnetic force applied thereto. Moving elements are also termed herein "micro-speakers", "pixels", "micro-actuators", "membranes" (individually or collectively) and "pistons".

Spacers, also termed "space maintainers": Include any element or elements mechanically maintaining the respective positions of the electrodes and moving elements

BRIEF DESCRIPTION OF THE DRAWINGS

Preferred embodiments of the present invention are illustrated in the following drawings.

DETAILED DESCRIPTION OF PREFERRED EMBODIMENTS

The technical field of the invention is that of a digital transducer array of long-stroke electromechanical micro actuators constructed using fabrication materials and techniques to produce low cost devices for a wide variety of applications, such as audio speakers, biomedical dispensing applications, medical and industrial sensing systems, optical switching, light reflection for display systems and any other application that requires or can derive benefit from longer-travel actuation and/or the displacement of greater volumes of fluid e.g. air or liquid relative to the transducer size.

A preferred embodiment of the present invention seeks to provide a transducer structure, a digital control mechanism and various fabrication techniques to create transducer arrays with a number, N, of micro actuators. The array is typically constructed out of a structure of typically three primary layers which in certain embodiments would comprise of a membrane layer fabricated out of a material of particular low-fatigue properties that has typically been layered on both sides with particular polar aligned magnetic coatings and etched with a number, N, of unique "serpentine like" shapes, so as to enable portions of the membrane bidirectional linear freedom of movement (the actuator). The bidirectional linear travel of each moving section of the membrane is confined within a chamber (actuator channels) naturally formed typically by sandwiching the membrane layer between two mirror image support structures constructed out of dielectric, Silicon, Polymer or any other like insulating substrate, are typically fabricated with N precisely sized through holes equal in number to the N serpentine etchings of the membrane and typically precisely positioned in a pattern which precisely aligns each through hole with each serpentine etching of the membrane. Further affixed to the outer surfaces of both the top and bottom layers of the support structure are, typically, conductive overhanging surfaces such as conductive rings or discs ("addressable electrodes"), which serve to attract and hold each actuator as it reaches its end of stroke typically by applying electrostatic charge.

A device constructed and operative in accordance with a preferred embodiment of the present invention is now described with reference to FIGS. 1B, 2A-2C, 3A-3C, 4A, 5, 6A, 7A-7B, 8A-8B, 9, 10A, 11A, 12A, 13, 14, 15A, 16A-C, 17-19.

Figure 1A:
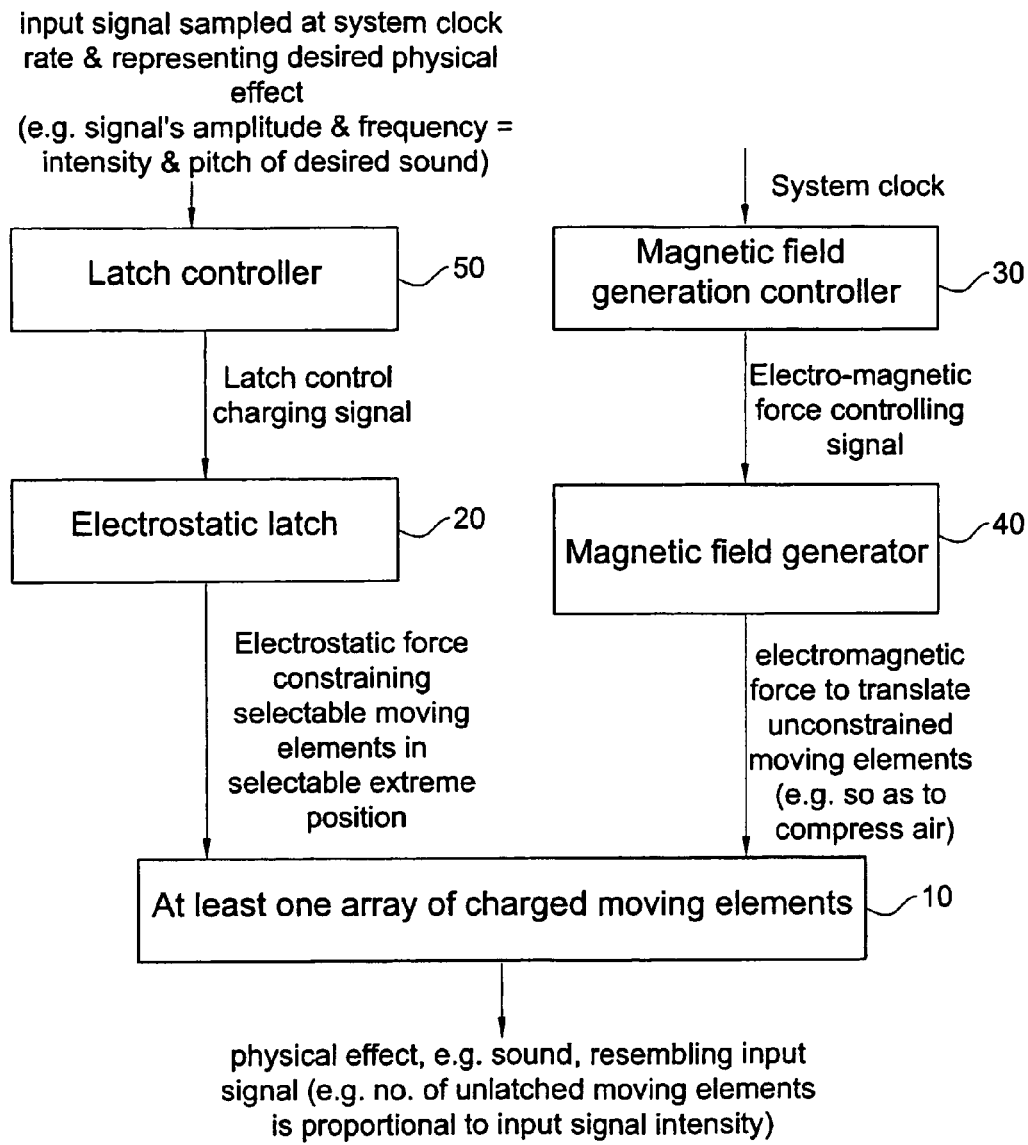
FIG. 1A is a simplified functional block diagram illustration of actuator apparatus constructed and operative in accordance with a preferred embodiment of the present invention.
Figure 1B:
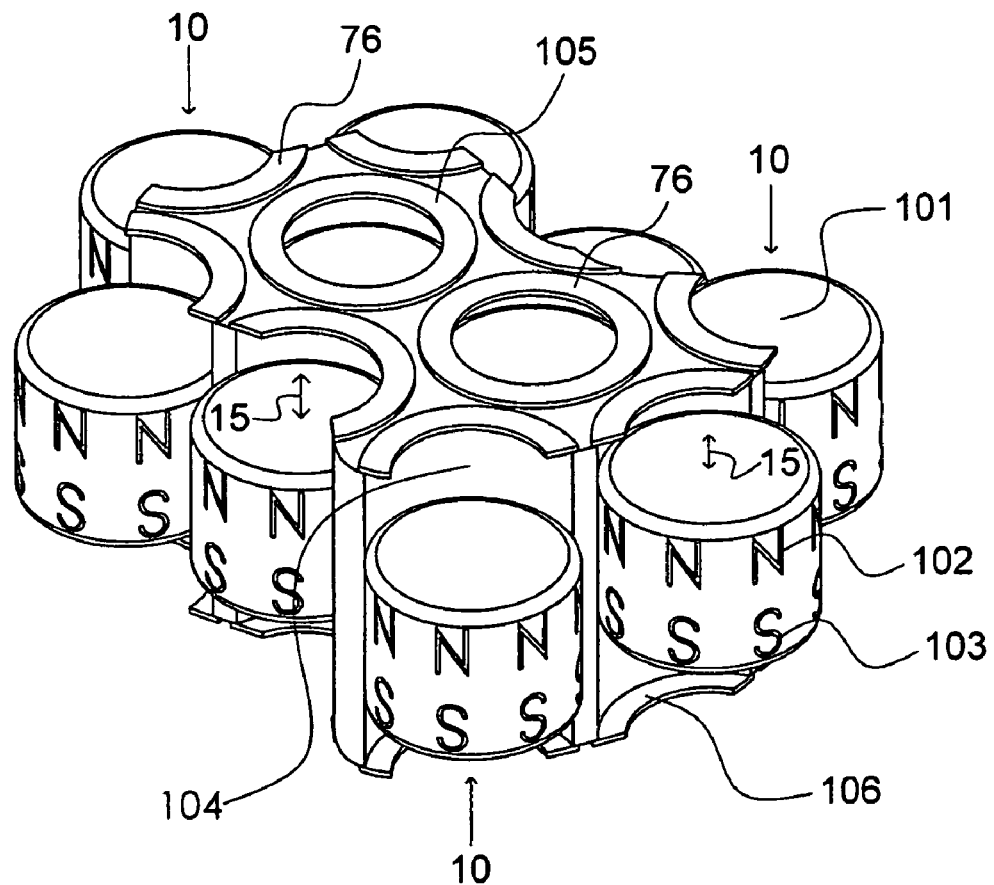
FIG. 1B is an isometric illustration of the array of moving elements of FIG. 1A constructed and operative in accordance with a preferred embodiment of the present invention in which each moving element comprises a magnet and each is constrained to travel, except when latched, alternately back and forth along a respective axis in response to an alternating electromagnetic force applied to the array of moving elements.
Figure 2A:
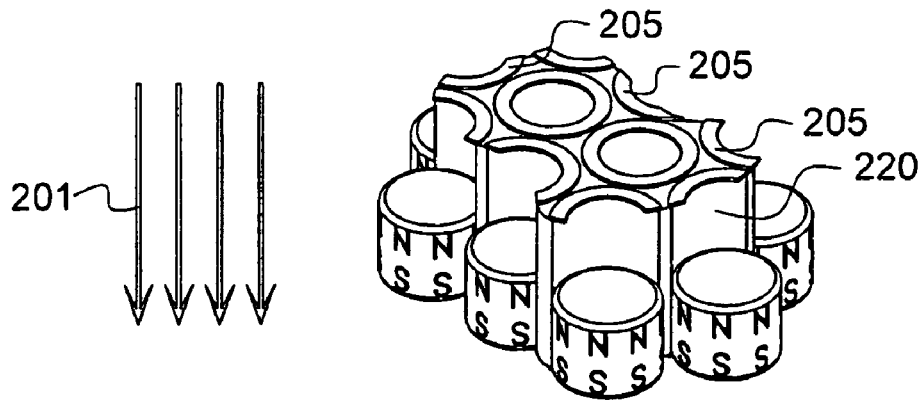
FIG. 2A shows the array of FIG. 1B in a first, bottom extreme position responsive to an electromagnetic force applied downward to FIG. 2B shows the array of FIG. 1B in a second, top extreme position responsive to an electromagnetic force applied upward.
Figure 2B:
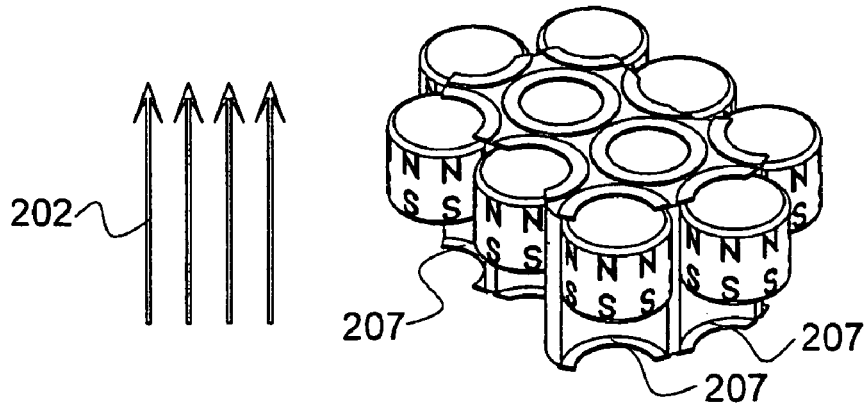
FIG. 2C is similar to FIG. 2B except that one of the individual moving magnets is not responding to the upward force because that individual magnet is latched into its top extreme position by a corresponding electric charge disposed above the individual moving magnet and functioning as a top latch.
Figure 2C:
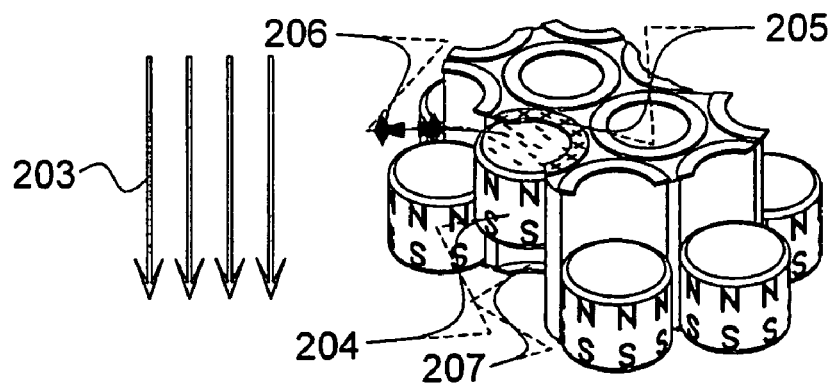
Figure 3A:
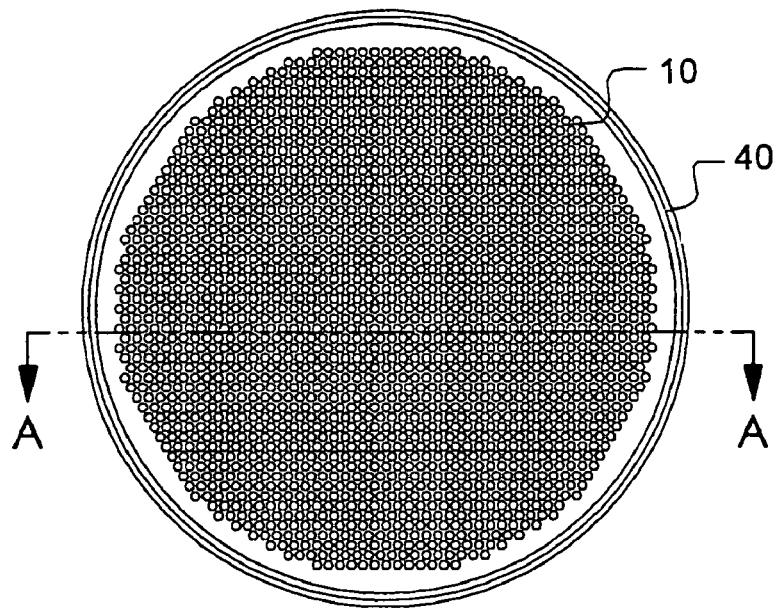
FIGS. 3A-3C are respective top, cross-sectional and isometric views of a skewed array of moving elements each constrained to travel alternately back and forth along a respective axis in response to an alternating electromagnetic force applied to the array of moving elements by a coil wrapped around the array.
Figure 3B:
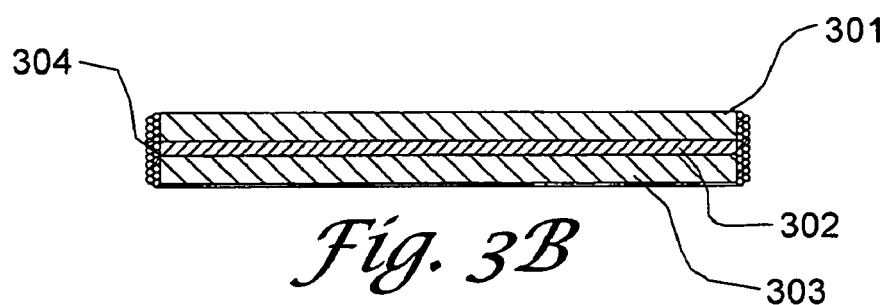
Figure 3C:
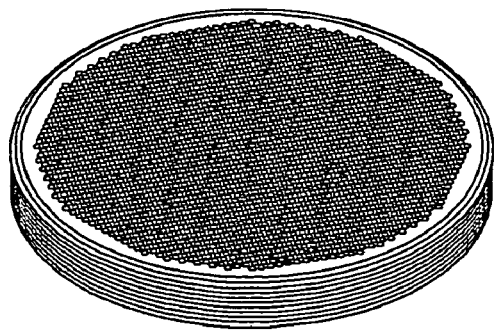

FIG. 1B is a conceptual overview of a small section of the device. FIG. 2A depicts the movement of the moving elements under magnetic field. FIG. 2B depicts the movement of the same moving elements under an opposite magnetic field. FIG. 2C depicts the movement of the moving elements under a magnetic field while one electrode is charged. FIGS. 3A-3C are respective top, cross-sectional and perspective views of one preferred embodiment of the present invention.

Figure 4A:
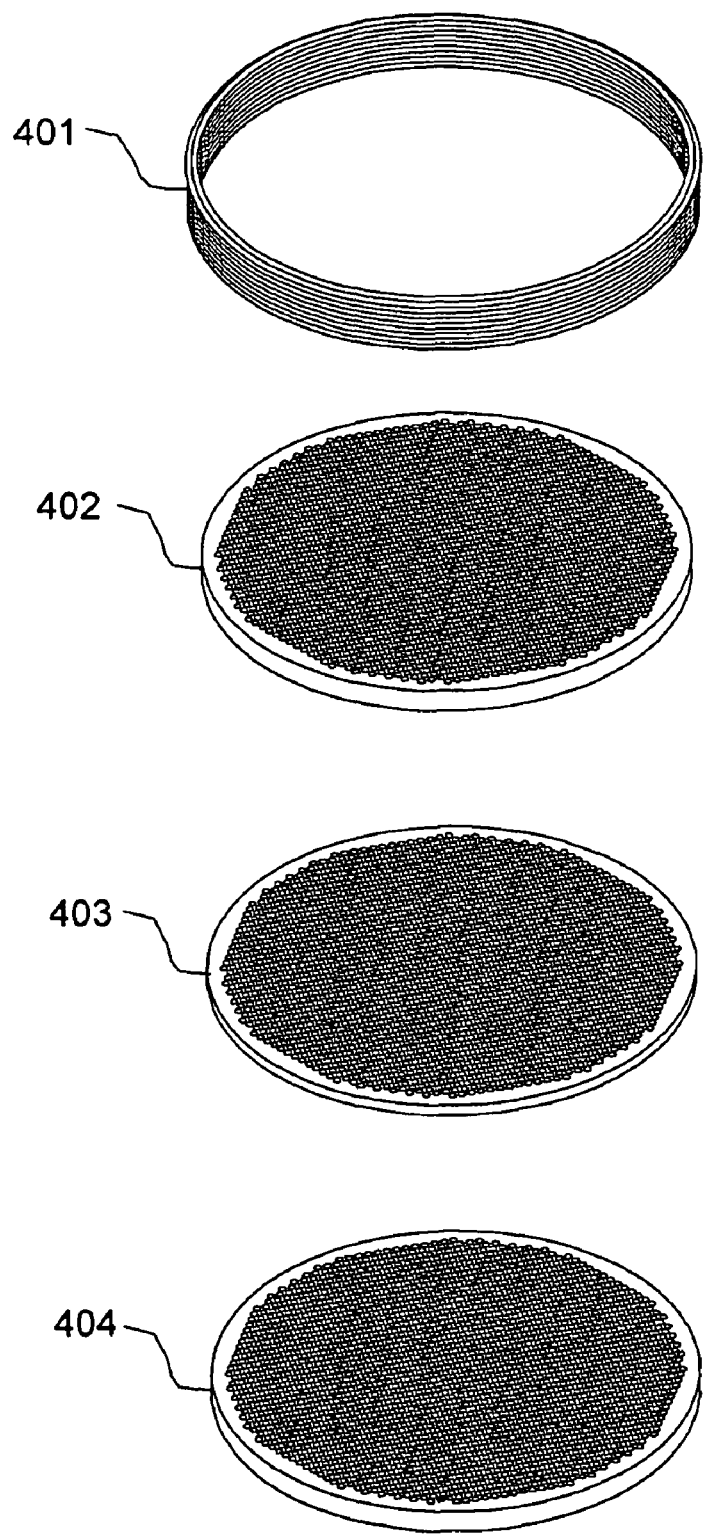
FIG. 4A is an exploded view of an actuator device including an array of moving elements each constrained to travel alternately back and forth along a respective axis in response to an alternating electromagnetic force applied to the array of moving elements by a coil, and a latch, formed as a layer, operative to selectively latch at least one subset of the moving elements in at least one latching position thereby to prevent the individual moving elements from responding to the electromagnetic force.
Figure 5:
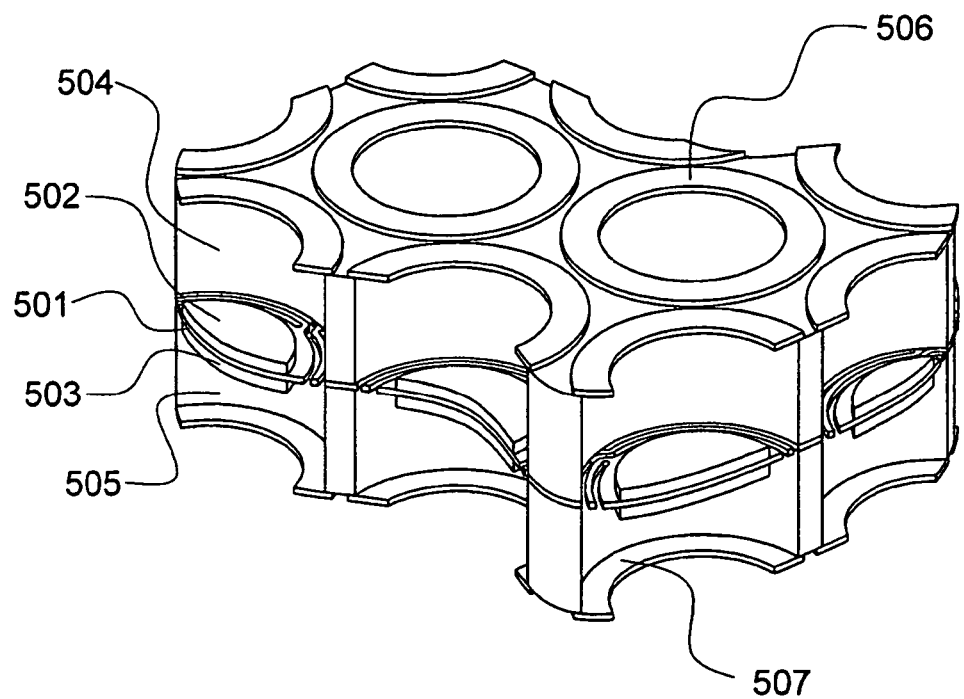
FIG. 5 is an isometric static view of the actuator device of FIG. 4A constructed and operative in accordance with a preferred embodiment of the present invention in which the array of moving elements is formed of thin foil, each moving element being constrained by integrally formed flexures surrounding it.
Figure 6A:
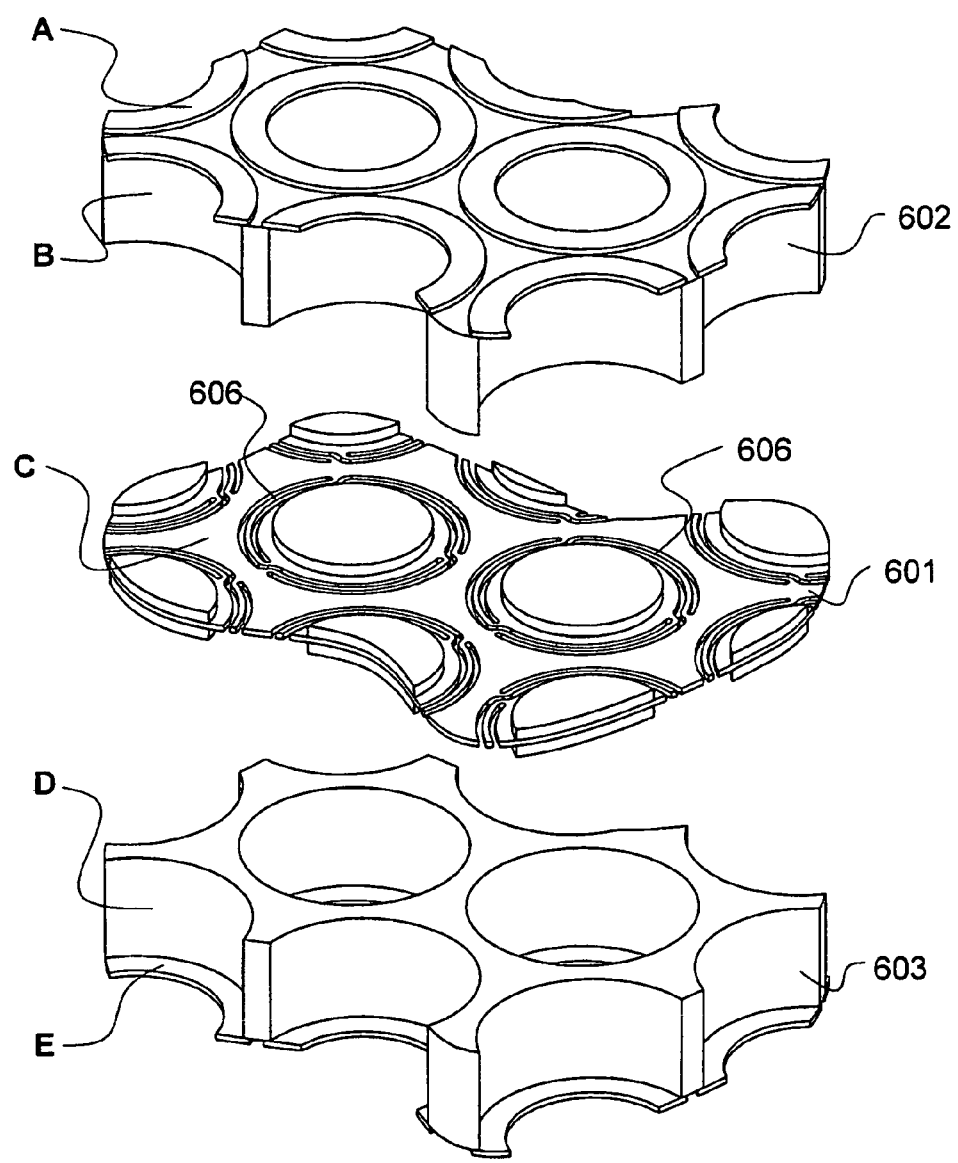
FIG. 6A is an exploded view of a portion of the actuator device of FIG. 5.
Figure 7A:
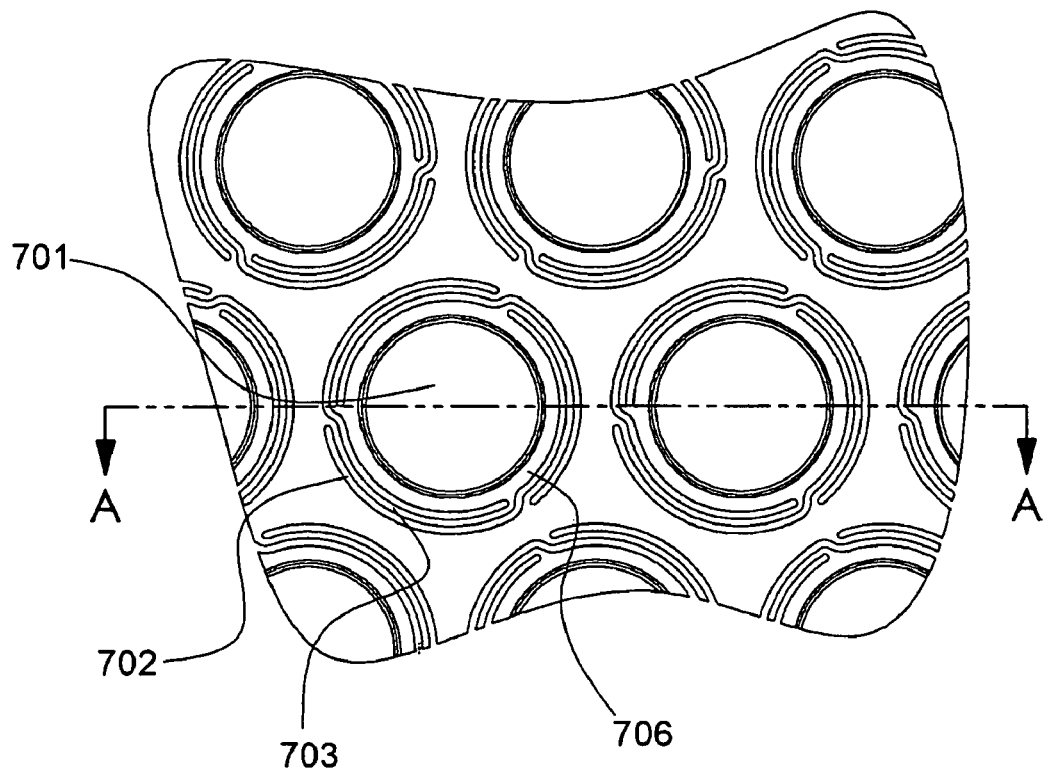
FIG. 7A is a static partial top view illustration of the moving element layer of FIGS. 5-6C.
Figure 7B:
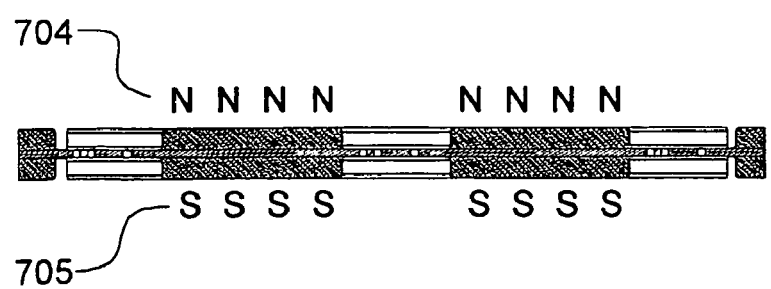
FIG. 7B is a cross-sectional view of the moving element layer of FIGS. 5-6 taken along the A-A axis shown in FIG. 7A.
Figure 8A:
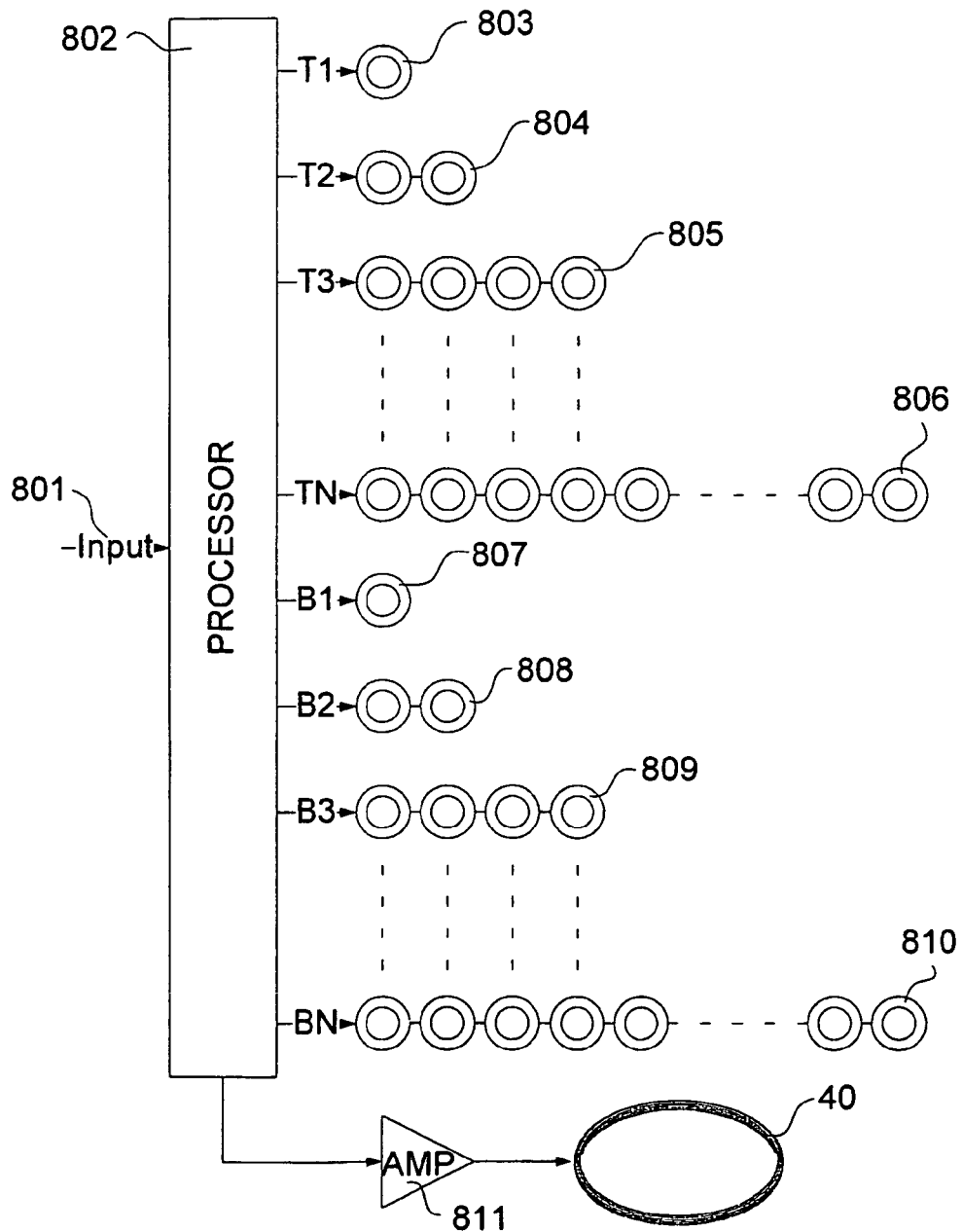
FIG. 8A is a control diagram illustrating control of the latches and of the coil-induced electromagnetic force for a particular example in which the moving elements are arranged in groups that can each, selectively, be actuated collectively, wherein each latch in the latching layer is associated with a permanent magnet, and wherein the poles of all of the permanent magnets in the latching layer are all identically disposed.
Figure 8B:
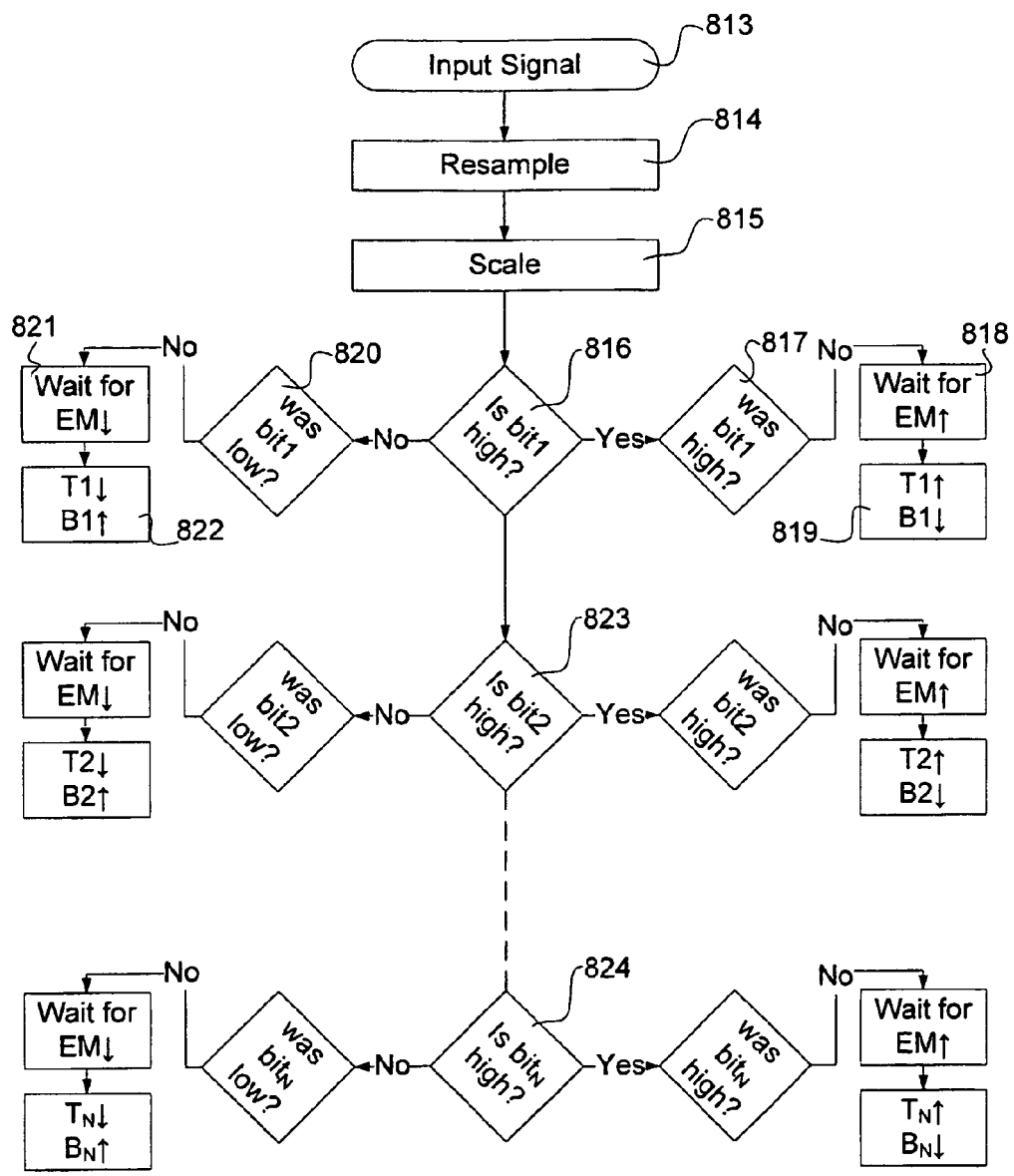
FIG. 8B is a flowchart illustrating a preferred method whereby a latching controller may process an incoming input signal and control moving elements' latches accordingly, in groups.
Figure 9A:
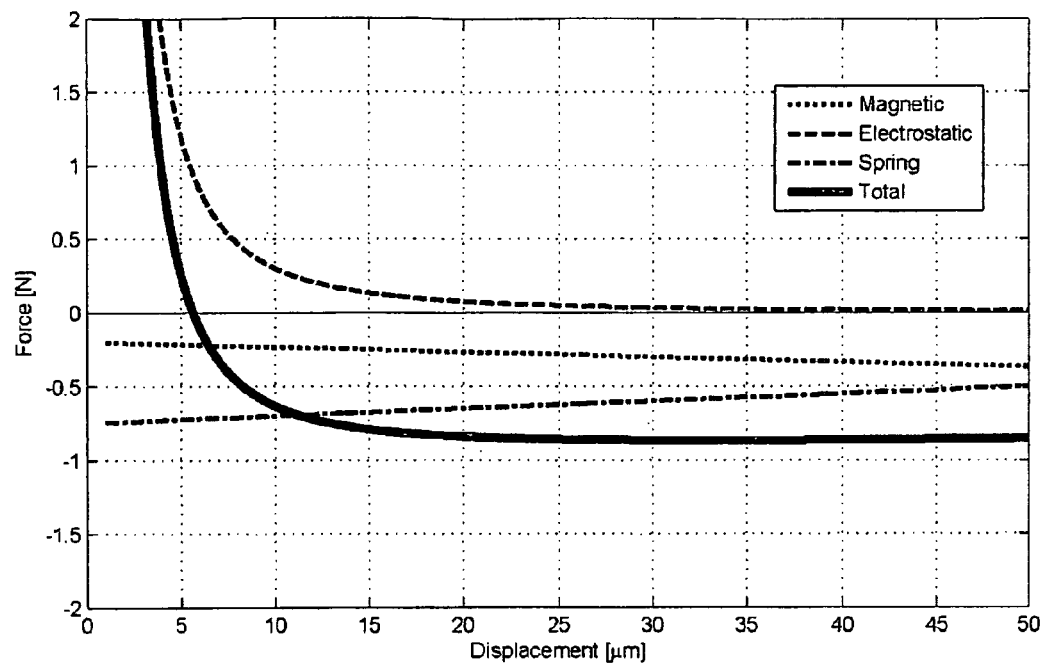
FIG. 9A is a graph summarizing certain, although typically not all, of the forces brought to bear on moving elements in accordance with a preferred embodiment of the present invention.

FIG. 4A is an exploded view of a device constructed and operative in accordance with a preferred embodiment of the present invention. FIG. 5 is a detailed illustration of a small section of the device constructed and operative in accordance with a preferred embodiment of the present invention. FIG. 6A is an exploded view of the same small section. FIG. 7A is a pictorial illustration of a serpentine and moving elements subassembly constructed and operative in accordance with a preferred embodiment of the present invention. FIG. 7B is an illustrative view of a single element, constructed and operative in accordance with a preferred embodiment of the present invention, in motion. FIG. 8A is a block diagram of a speaker system constructed and operative in accordance with a preferred embodiment of the present invention. FIG. 8B is a flow diagram of the speaker system constructed and operative in accordance with a preferred embodiment of the present invention. FIG. 9A illustrates a preferred relationship between the different forces applied to the moving elements.

Figure 10A:
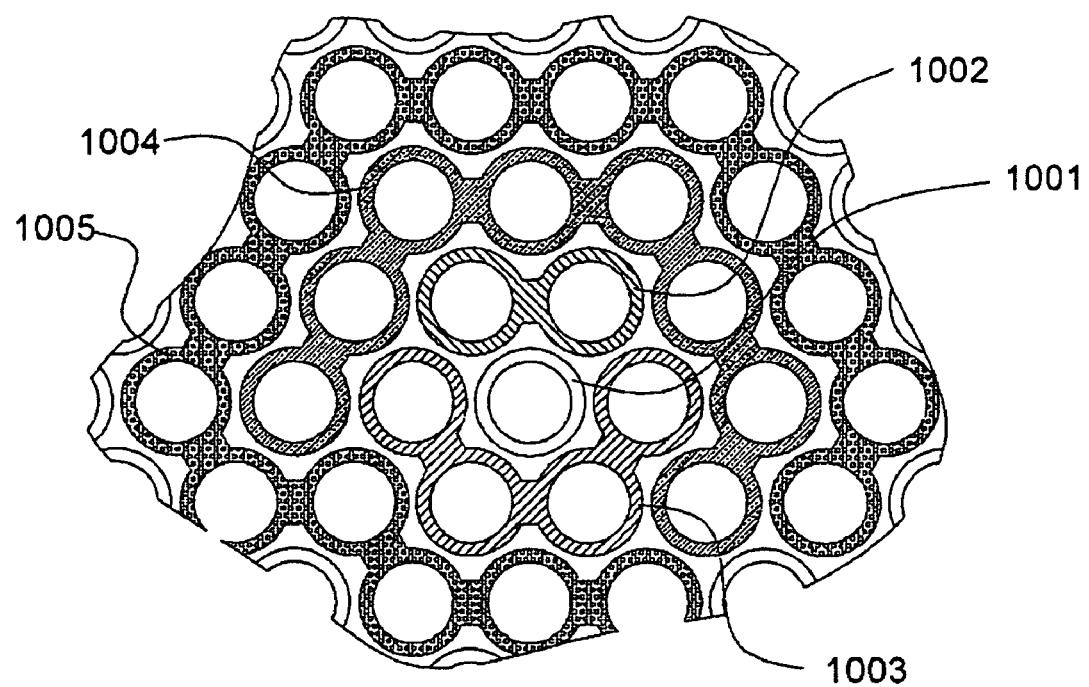
FIG. 10A is a simplified top cross-sectional illustration of a latching layer suitable for latching moving elements partitioned into several groups characterized in that any number of moving elements may be actuated by collectively actuating selected groups from among the partitioned groups, each latch in the latching layer being associated with a permanent magnet, wherein the poles of all of the permanent magnets in the latching layer are all identically disposed.
Figure 10A:
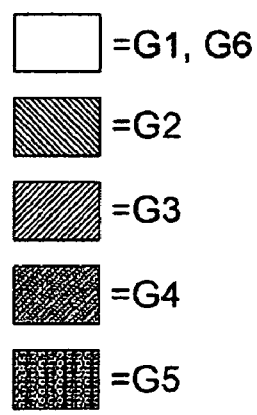
Figure 11A:
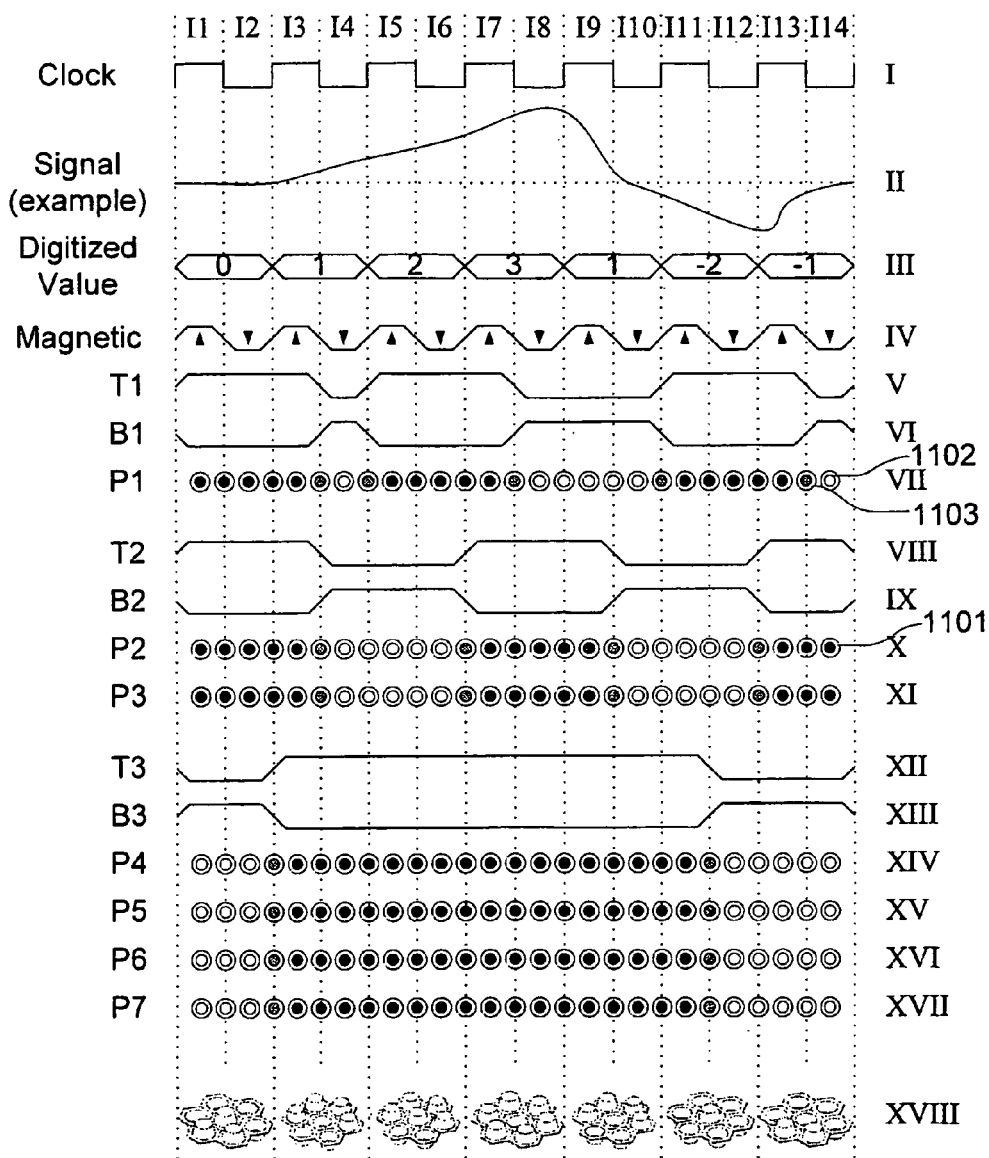
FIG. 11A is a timing diagram showing a preferred control scheme used by the latch controller in uni-directional speaker applications wherein an input signal representing a desired sound is received, and moving elements constructed and operative in accordance with a preferred embodiment of the present invention are controlled responsively, so as to obtain a sound pattern in which the volume in front of the speaker is greater than in other areas, each latch in the latching layer being associated with a permanent magnet, and the poles of all of the permanent magnets in the latching layer preferably all or substantially all being similarly or identically disposed.
Figure 12A:
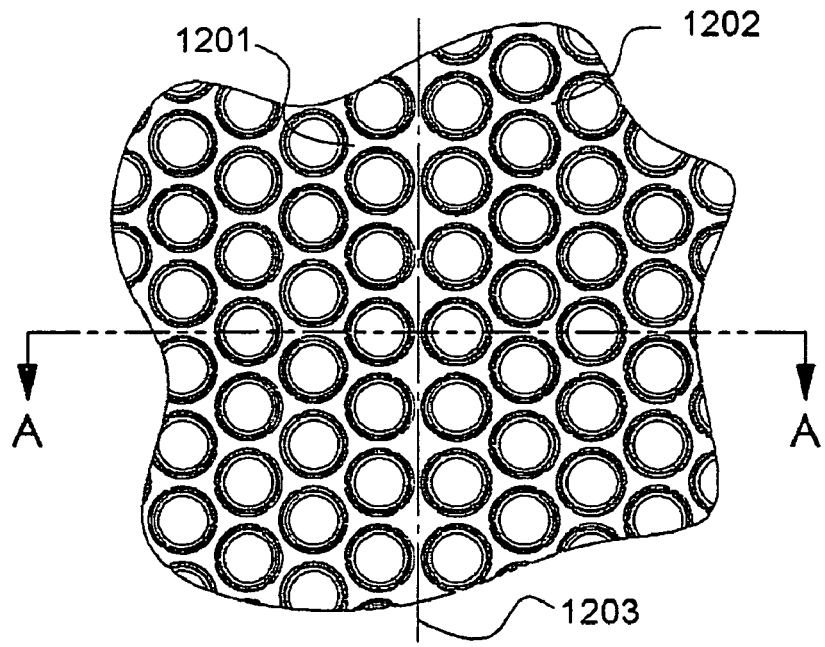
FIGS. 12A and 12B are respectively simplified top view and cross-sectional view illustrations of the moving element layer in accordance with an alternative embodiment in which half of the permanent magnets are placed north pole upward and half north pole downward.
Figure 13:
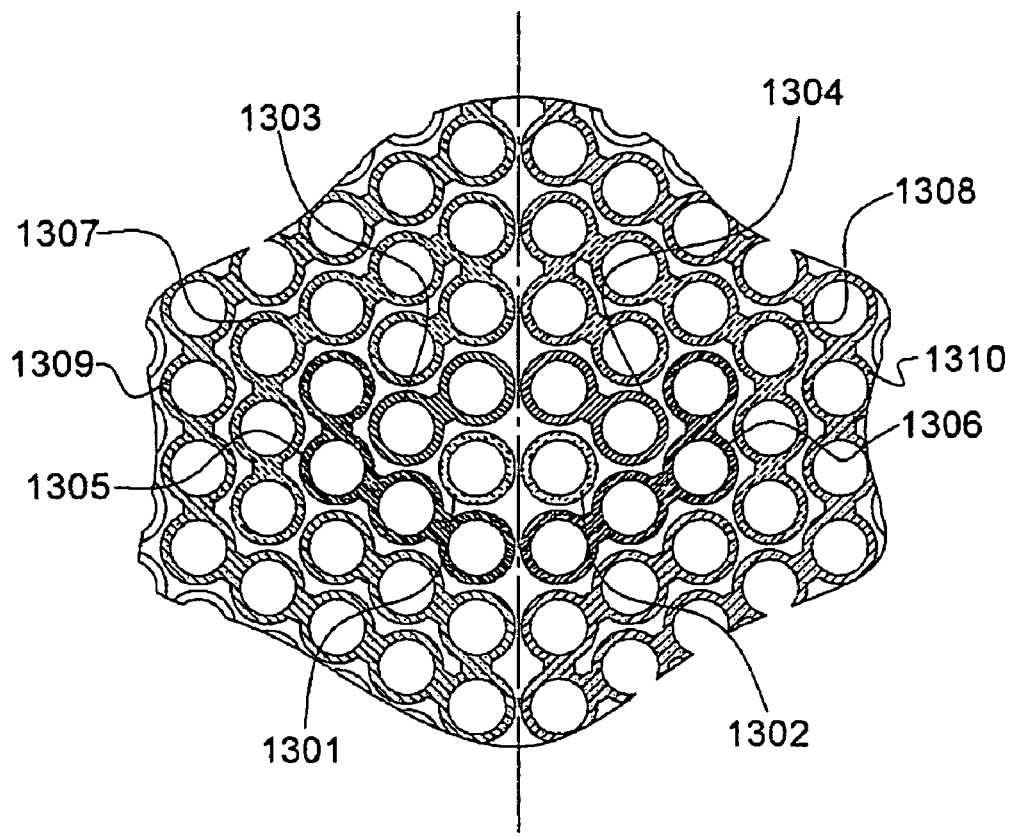
FIG. 13 is a simplified top view illustration similar to FIG. 10A except that half of the permanent magnets in the latching layer are disposed north pole upward and the remaining half of the permanent magnets in the latching layer are disposed north pole downward.
Figure 14:
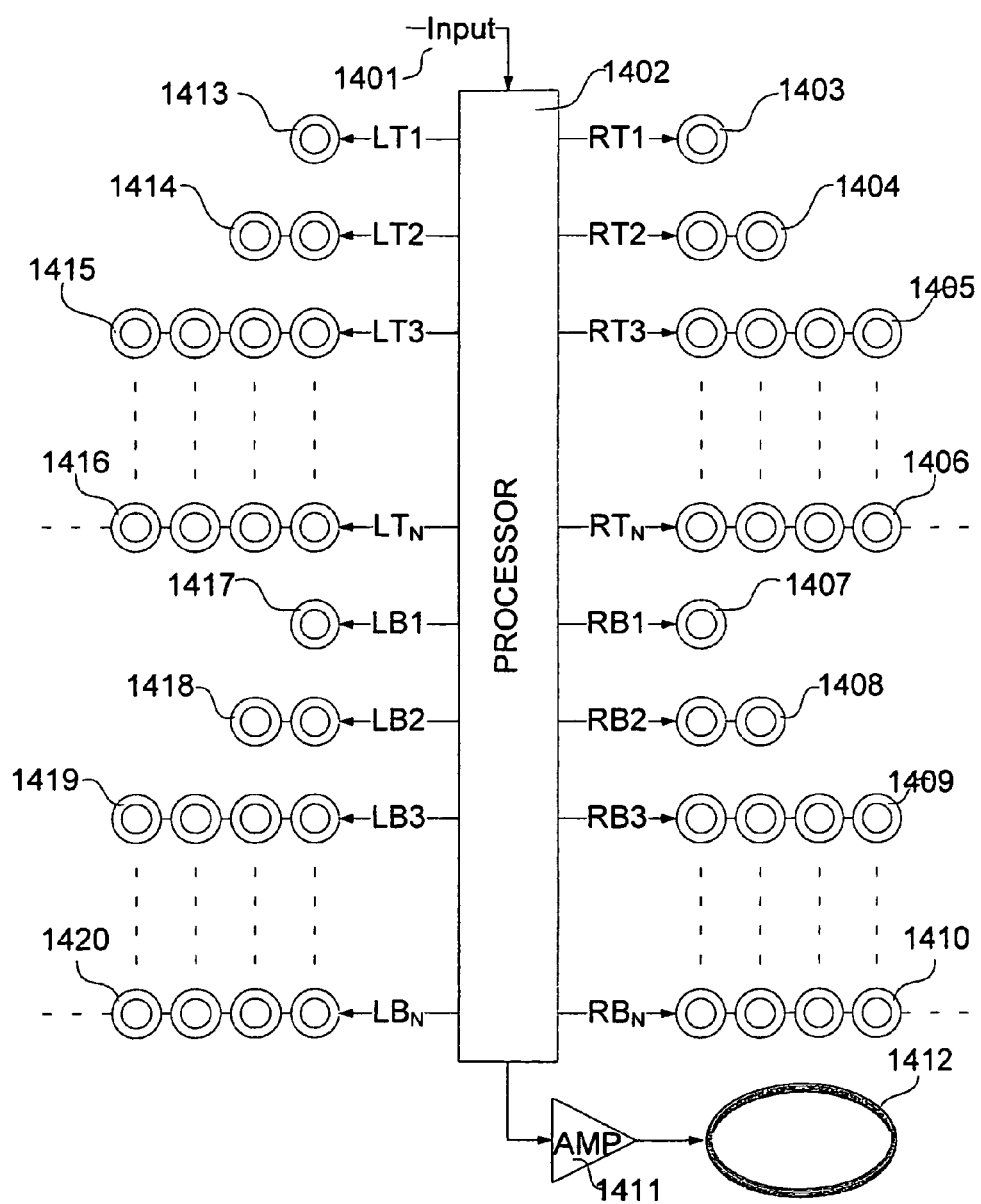
FIG. 14 is a control diagram illustrating control of the latches and of the coil-induced electromagnetic force for a particular example in which the moving elements are arranged in groups that can each, selectively, be actuated collectively, similar to FIG. 8A except that half of the permanent magnets in the latching layer are disposed north pole upward and the remaining half of the permanent magnets in the latching layer are disposed north pole downward.
Figure 15A:
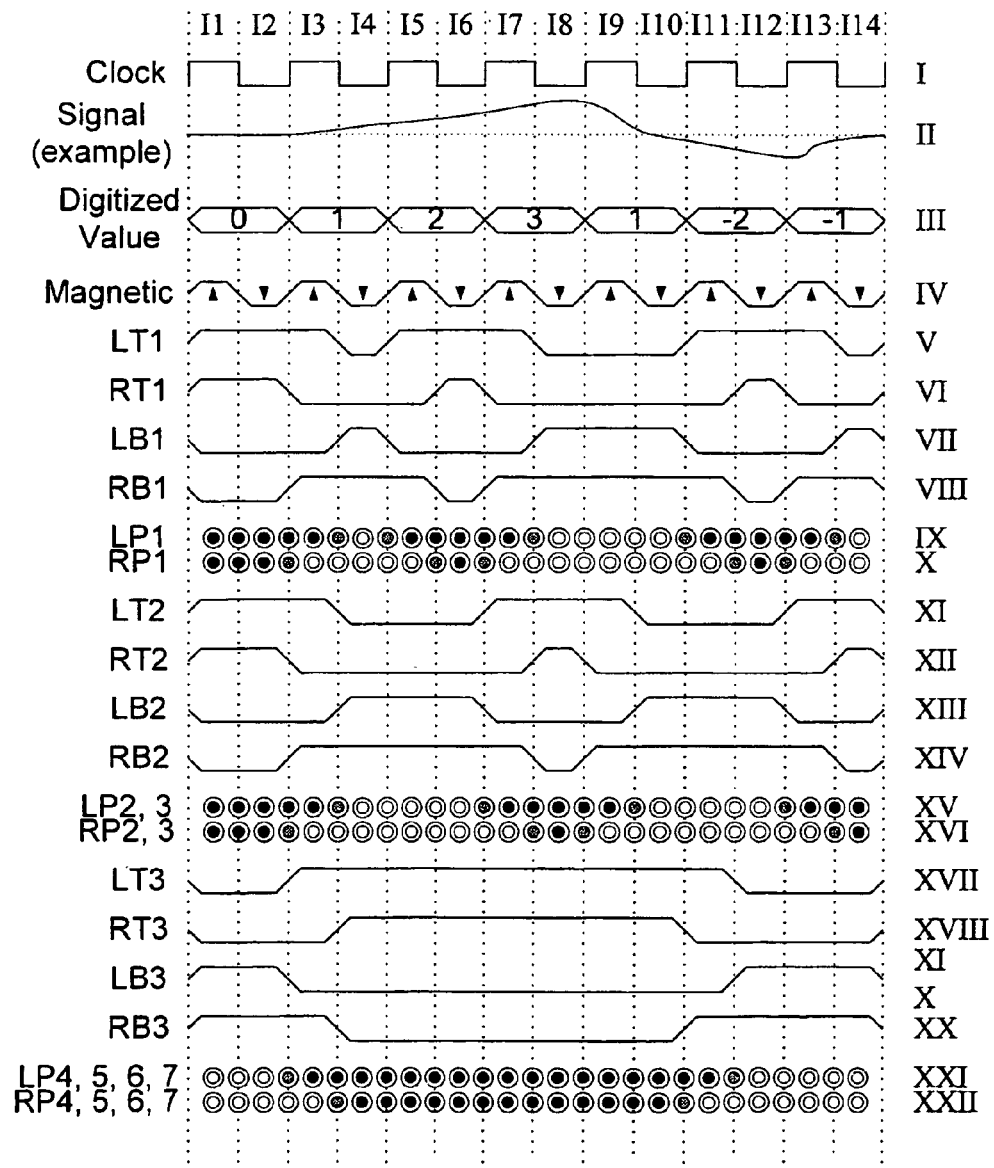
FIG. 15A is a timing diagram showing a preferred control scheme used by the latch controller in uni-directional speaker applications, which is similar to the timing diagram of FIG. 11A except that half of the permanent magnets in the latching layer are disposed north pole upward and the remaining half of the permanent magnets in the latching layer are disposed north pole downward.
Figure 16A:
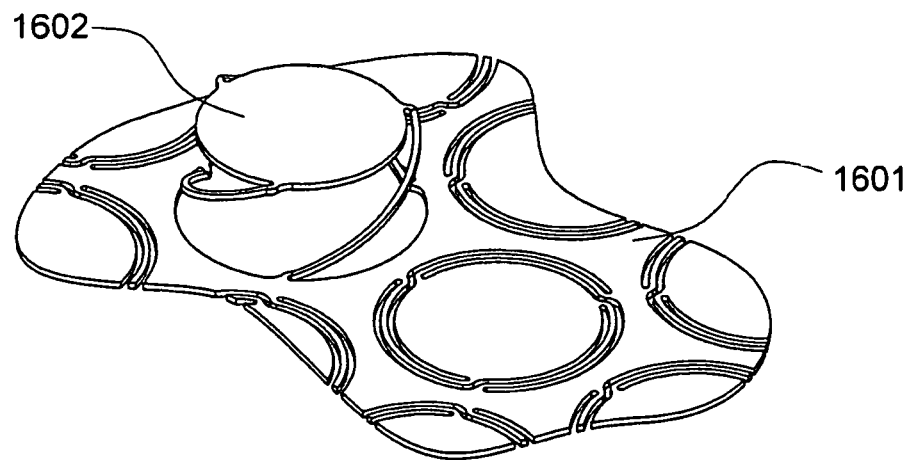
FIG. 16A illustrates a moving element layer which is an alternative to the moving element layer shown in FIGS. 1A and 2A-2C in which the layer is formed from a thin foil such that each moving element comprises a central portion and surrounding portions.
Figure 16B:
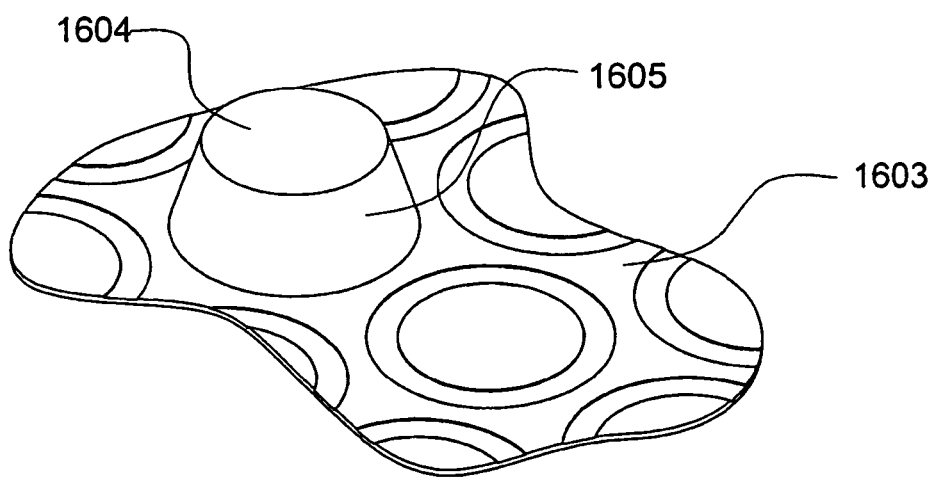
FIG. 16B is still another alternative to the moving element layer shown in FIGS. 1A and 2A-2C in which a sheet of flexible material e.g. rubber capable of enabling motion i.e. there are rigid discs under the magnet. the magnet might be the rigid element but it might not be rigid enough.

FIG. 10A is a grouping view of the electrodes constructed and operative in accordance with a preferred embodiment of the present invention. FIG. 11A is a timing and control chart constructed and operative in accordance with a preferred embodiment of the present invention. FIG. 12A illustrates magnetic properties of moving elements for an alternative addressing embodiment. FIG. 13 illustrates grouping of electrodes in an alternative addressing embodiment. FIG. 14 is a simplified block diagram of the speaker system in an alternative addressing embodiment. FIG. 15A is a timing and control chart for an alternative embodiment. FIG. 16A is a small section of the moving elements subassembly constructed and operative in accordance with a preferred embodiment of the present invention. FIG. 16B is a small section of a different embodiment of the moving elements subassembly, using a flexible substrate constructed and operative in accordance with a preferred embodiment of the present invention.

Figure 17:
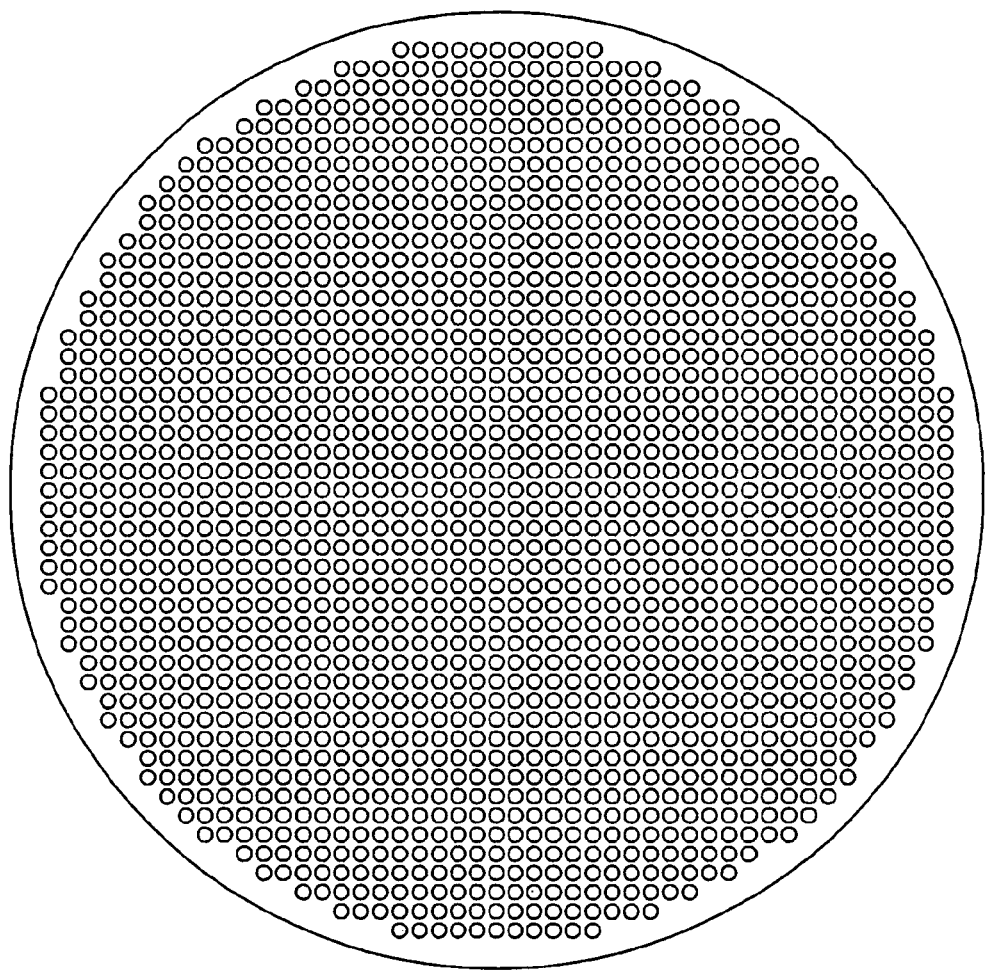
FIG. 17 is a top cross-sectional view illustration of an array of actuator elements similar to the array of FIG. 3A except that whereas in FIG. 3A, consecutive rows of individual moving elements or latches are respectively skewed so as to increase the number of actuator elements that can be packed into a given area, the rows in FIG. 17 are unskewed and typically comprise a rectangular array.
Figure 18:
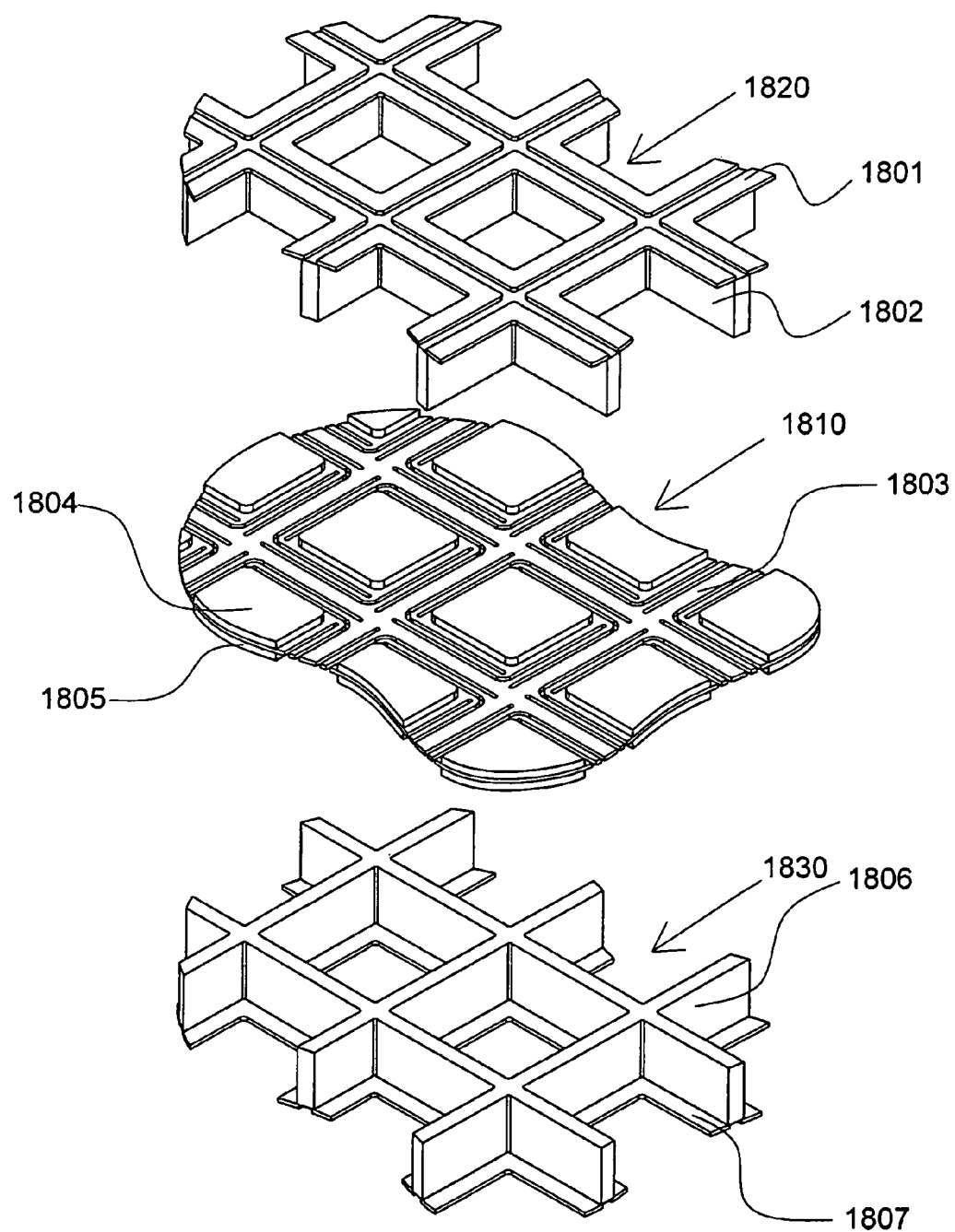
FIG. 18 is an exploded view of an alternative embodiment of an array of actuator elements in which the cross-section of each actuator element is square rather than round.
Figure 19:
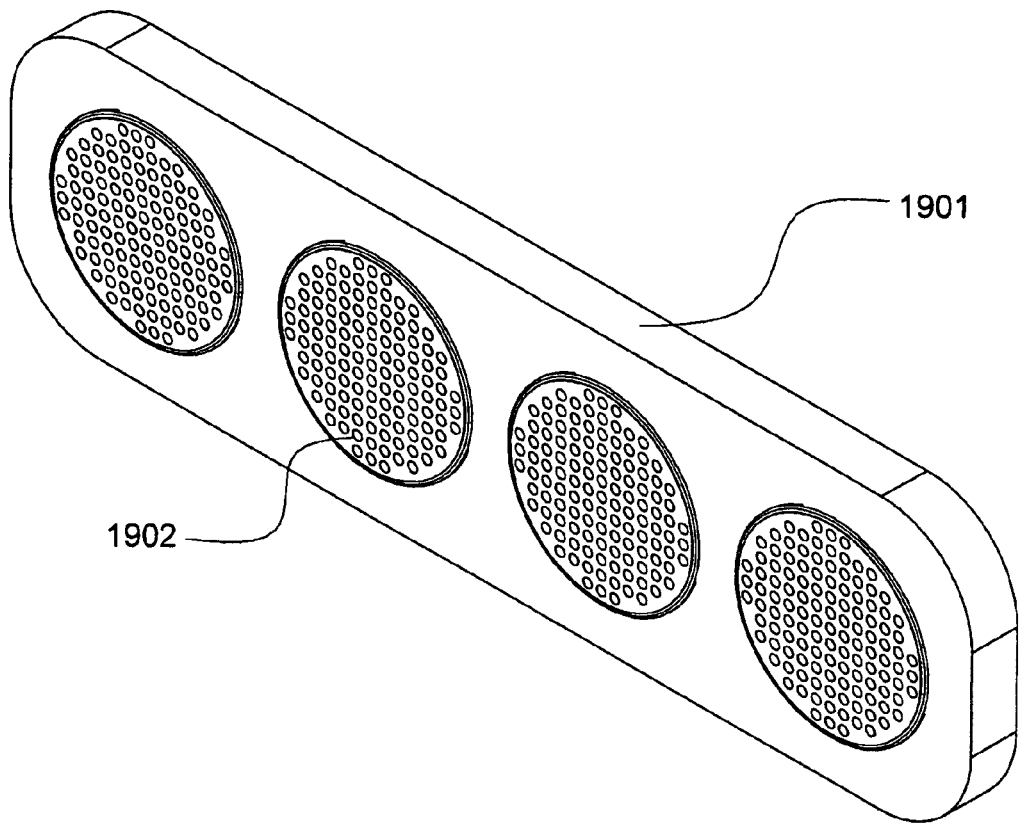
FIG. 19 is an isometric array of actuators supported within a support frame providing an active area which is the sum of the active areas of the individual actuator arrays.

Whereas FIGS. 3A-3C above illustrate an array of elements in a honeycomb construction constructed and operative in accordance with a preferred embodiment of the present invention, FIG. 17 illustrates an array of elements in a square construction, which is constructed and operative in accordance with a preferred embodiment of the present invention. FIG. 18 is an exploded view of a small section of an embodiment using square shaped elements. FIG. 19 illustrates an apparatus using a plurality (array) of devices.

Effective addressing is typically achieved through unique patterns of interconnects between select electrodes and unique signal processing algorithms which typically effectively segments the total number of actuators in a single transducer, into N addressable actuator groups of different sizes, beginning with a group of one actuator followed by a group of double the number of actuators of its previous group, until all N actuators in the transducer have been so grouped.

To attain actuator strokes the transducer is typically encompassed with a wire coil, which, when electrical current is applied, creates an electromagnetic field across the entire transducer. The electromagnetic field causes the moving part of the membrane to move typically in a linear fashion through the actuator channels. If the current alternates its polarity, it causes the moving part of the membrane to vibrate. When electrostatic charge is applied to particular addressable electrode groups, it will typically cause all actuators in that group to lock at the end of the stroke, either on top or bottom of the support structure in accordance with the application requirement. Collectively the displacement provided by the transducer is achieved from the sum total of the N actuators that are not locked at any particular interval (super position).

The transducer construction is typically fully scalable in the number of actuators per transducer, the size of each actuator, and the length of stroke of each actuator, and the number of addressable actuator groups. In certain embodiments, the actuator elements may be constructed by etching various shapes into a particular material, or by using layered metallic disks that have been coated with a flexible material or by using free floating actuator elements The membrane (flexure) materials may include Silicon, Beryllium Copper, Copper Tungsten alloys, Copper Titanium alloys, stainless steel or any other low fatigue material. The addressable electrodes of the support structure may be grouped in any pattern as to attain addressing as appropriate for the transducer application. The addressable electrodes may be affixed such that contact is created with the membrane actuator or in such a manner that there is no physical contact with the membrane. The substrate material may be of any insulating material such as FR4, silicon, ceramic or any variety of plastics. In some embodiments the material may contain ferrite particles. The number of serpentine shapes etched into the membrane, or floating actuator elements and the corresponding channels of the support structure may be round, square or any other shape. The electromagnetic field may be created by winding a coil around the entire transducer, around sections of the transducer or around each actuator element or by placing one or more coils placed next to one or more actuator elements.

In certain embodiments a direct digital method is used to produce sound using an array of micro-speakers. Digital sound reconstruction typically involves the summation of discrete acoustic pulses of energy to produce sound-waves. These pulses may be based on a digital signal coming from audio electronics or digital media in which each signal bit controls a group of micro-speakers. In one preferred embodiment of the current invention, the nth bit of the incoming digital signal controls $2^n$ micro-speakers in the array, where the most significant bit (MSB) controls about half of the micro-speakers and the least significant bit (LSB) controls at least a single micro-speaker. When the signal for a particular bit is high, all of the speakers in the group assigned to the bit are typically activated for that sample interval. The number of speakers in the array and the pulse frequency determine the resolution of the resulting sound-wave. In a typical embodiment, the pulse frequency may be the source-sampling rate. Through the post application of an acoustic low-pass filter from the human ear or other source, the listener typically hears an acoustically smoother signal identical to the original analog waveform represented by the digital signal.

According to the sound reconstruction method described herein, the generated sound pressure is proportional to the number of operating speakers. Different frequencies are produced by varying the number of speaker pulses over time. Unlike analog speakers, individual micro-speakers typically operate in a non-linear region to maximize dynamic range while still being able to produce low frequency sounds. The net linearity of the array typically results from linearity of the acoustic wave equation and uniformity between individual speakers. The total number of non-linear components in the generated sound wave is typically inversely related to the number of micro-speakers in the device.

In a preferred embodiment a digital transducer array is employed to implement true, direct digital sound reconstruction. The produced sound's dynamic range is proportional to the number of micro-speakers in the array. The maximal sound pressure is proportional to the stroke of each micro-speaker. It is therefore desirable to generate long stroke transducers and to use as many as possible. Several digital transducer array devices have been developed over the years. One worth mentioning is a CMOS-MEMS micro-speaker developed at Carnegie Mellon University. Using CMOS fabrication process, they designed an 8-bit digital speaker chip with 255 square micro-speakers, each micro-speaker 216 µm on a side. The membrane is composed of a serpentine Al—SiO2 mesh coated with polymer and can be electrostatically actuated by applying a varying electrical potential between the CMOS metal stack and silicon substrate. The resulting out of plane motion is the source of pressure waves that produce sound. Each membrane has a stroke of about 10 µm. Such short strokes are insufficient and the generated sound levels are too soft for a loudspeaker. Another issue is that the device requires a driving voltage of 40V. Such voltage requires complex and expensive switching electronics. Preferred embodiments of the device described herein overcome some or all of these limitations and generate much louder sound levels while eliminating the need for high switching voltages.

It is believed that the shape of each transducer has no significant effect on the acoustic performance of the speaker. Transducers may be packed in square, triangle or hexagonal grids, inter alia.

The current invention typically makes use of a combination of magnetic and electrostatic forces to allow a long stroke while avoiding the problems associated with traditional magnetic or electrostatic actuators.

The moving elements of the transducer array are typically made to conduct electricity and may be magnetized so that the magnetic poles are perpendicular to the transducer array surface. Moderate conduction is sufficient. A coil surrounds the entire transducer array or is placed next to each element and generates the actuation force. Applying alternating current or alternating current pulses to the coil creates an alternating magnetic field gradient that forces all the moving elements to move up and down at the same frequency as the alternating current. To control each moving element, two electrodes may be employed, one above and one below the moving elements.

The current applied to the coil typically drives the moving elements into close proximity with the top and bottom electrode in turn. A small electrostatic charge is applied to the moving elements. Applying an opposite charge to one of the electrodes generates an attracting force between the moving element and the electrode. When the moving element is very close to the electrode, the attracting force typically becomes larger than the force generated by the coil magnetic field and the retracting spring and the moving element is latched to the electrode. Removing the charge or some of it from the electrode typically allows the moving element to move along with all the other moving elements, under the influence of the coil magnetic field and the flexures.

In accordance with certain embodiments, the actuator array may be manufactured from 5 plates or layers:
Top electrode layer
Top spacers (together shown as layer 402)
Moving elements 403
Bottom spacers
Bottom electrode layer (together shown as layer 404)

In accordance with certain embodiments, the array is surrounded by a large coil 401. The diameter of this coil is typically much larger than that of traditional coils used in prior art magnetic actuators. The coil can be manufactured using conventional production methods.

In certain embodiments the moving element is made of a conductive and magnetic material. Moderate electrical conduction is typically sufficient. The moving element may be manufactured using many types of materials, including but not limited to rubber, silicon, or metals and their alloys. If the material cannot be magnetized or a stronger magnet is desired, a magnet may be attached to it or it may be coated with magnetic material. This coating is typically done by application, using a screen printing process or other techniques known in the art, by epoxy or another resin loaded with magnetic powder. In some embodiments, screen printing can be performed using a resin mask created through a photolithographic process. This layer is typically removed after curing the resin/magnetic powder matrix. In certain embodiments the epoxy or resin is cured while the device is subjected to a strong magnetic field, orienting the powder particles in the resin matrix to the desired direction. The geometry of the moving elements can vary. In yet other embodiments, part of the moving elements may be coated with the magnet and cured with a magnetic field oriented in one direction while the rest are coated later and cured in an opposite magnetic field causing the elements to move in opposite directions under the same external magnetic field. In one preferred embodiment, the moving element comprises a plate that has a serpentine shape surrounding it, typically cut out from thin foil. Alternatively, in certain embodiments it is possible to use a thick material thinned only in the flexure area or by bonding relatively thick plates to a thin layer patterned as flexures. This shape allows part of the foil to move while the serpentine shape serves as a compliant flexure. In certain other embodiments, the moving part is a cylinder or a sphere, free to move about between the top and bottom electrodes.

FIG. 1B, which illustrates a conceptual overview of small section of the device in accordance with certain embodiments of the invention, serves to provide a conception overview of the complete transducer array structure. In the illustrated embodiment the moving elements are pistons 101 which are typically magnetized so that one pole 102 is on the top and the other 103 at the bottom of each piston. A magnetic field generator (not shown) that typically influences the entire transducer array structure creates a magnetic field across the entire transducer array, typically causing pistons 101 to move up and down, thereby forcing the air out of the cavity 104. An electrostatic electrode typically resides on both the top 105 and bottom 106 of each cavity. The electrodes serve as latching mechanisms that attract and hold each piston as it nears its end of stroke typically preventing the piston from moving until the latch is released, while allowing the pushed air to easily pass through. In certain embodiments, the pistons 101 are made of an electrically conductive material or coated with such material. At least one of the elements, the piston and/or the electrostatic electrode is typically covered by an dielectric layer to avoid shorting as pull-down occurs.

FIGS. 2A-2C, taken together, illustrate the element movement according to a preferred embodiment of the present invention. In this embodiment a coil (not shown) typically surrounds the entire transducer array structure, creating a magnetic field across the entire transducer array which causes any magnetic element with freedom of movement to travel according to the alternating direction of the field. This causes the pistons to move typically up and down.

In FIG. 2A the magnetic field 201 direction is downwards. The magnetic field creates a force, driving the pistons 101 of the entire array downwards.

In FIG. 2B the magnetic field 202 direction has changed and is pointing upwards. The magnetic field creates a force, driving the pistons 101 of the entire array upwards.

In FIG. 2C a positive electric charge is applied to one of the top electrodes 205. The positive charge typically attracts the electrons in the piston 204, causing the top of the piston 206 to be negatively charged. The opposite charges 205 and 206 create an attraction force which, when the gap is below a critical distance, typically act to pull-down the two elements together. The magnetic field 203 direction has changed again and is pointing downwards. The piston 204 is typically held in place due to magnetic attraction while the rest of the pistons are free to move, and move to the bottom due to the influence of the magnetic field 203. In this particular embodiment the charge applied to the electrode is positive. Alternatively, a negative charge may be applied to the electrodes, which will induct a negative charge to accumulate in the near-side of the adjacent piston.

FIGS. 3A-3C show top, cross-sectional and perspective views of one preferred embodiment.

In certain embodiments a coil 304 wrapped around the entire transducer array generates an electromagnetic field across the entire array structure, so that when current is applied, the electromagnetic field causes the pistons 302 to move up 301 and down 303.

FIG. 4A shows an exploded view of the device constructed and operative in accordance with certain embodiments of the invention. As shown, the exploded view of a transducer array structure reveals that it comprises the following primary parts:

(a) A coil surrounding the entire transducer array 401 generates an electromagnetic field across the entire array structure when voltage is applied to it. A preferred embodiment for the coil is described herein with reference to FIGS. 9B-9D.

(b) In certain embodiments a top layer construction 402 may comprise a spacer layer and electrode layer. In a certain embodiment this layer may comprise a printed circuit board (herein after "PCB") layer with an array of accurately spaced cavities each typically having an electrode ring affixed at the top of each cavity.

(c) The moving elements ("pistons") 403 in the current embodiment may be comprised of a thin foil of conductive magnetized material cut or etched with many very accurate plates typically surrounded by "serpentine" shapes that serve as compliant flexures that impart the foils with a specific measure of freedom of movement.

(d) A bottom layer construction 404 may comprise a spacer layer and electrode layer. In a certain embodiment this layer may comprise a dielectric layer with an array of accurately spaced cavities each typically having an electrode ring affixed at the bottom of each cavity.

FIG. 5 shows details of a small section of a device constructed and operative in accordance with a preferred embodiment of the present invention. A cross section detailed dimensional view of the transducer array according to the illustrated embodiment shows the following structure: the moving elements ("pistons"), typically made from a thin foil 501 that has been cut or etched into precise plate and serpentine shapes having a magnetized layer on the top 502 and bottom 503, is accurately positioned so the center of each plate shape is precisely aligned with the center of each of the cavities of a top layer dielectric 504 and the bottom layer dielectric cavity 505 that collectively serve as travel guides and air ducts. At the external edges of each duct both on the top 506 and on the bottom 507 is a copper ring ("electrode") latching mechanism which, when electrostatic charge is applied, typically attracts each moving element to create contact between the moving elements ("pistons") and latches and holds each moving element ("piston") as it nears the end of each stroke, thereby preventing the moving element ("piston") from moving until the latch is released typically by terminating the electrostatic charge to the electrode.

FIG. 6A shows an exploded view of the same small section as shown in FIG. 5. and reveals that in this embodiment the thin foil which has been etched with precise serpentine shapes to create a moving element ("piston") with the center of each shape affixed with a magnetized layer on the top and bottom, is centered and enclosed in the cavities of mirror image on the top 602 and bottom 603 dielectric.

FIG. 7A shows a serpentine shape and moving elements subassembly constructed and operative in accordance with a preferred embodiment of the present invention. A top static view of the thin foil shows the moving element in this embodiment is typically constructed by etching a precise round serpentine shape that allows the center of the shape 701 freedom of movement restrained by the flexures of the shapes 703 which have been etched out of the material, thereby to form interspersing cavities 702. A cross sectional view reveals that the foil typically has polar aligned layers of magnets, affixed to both the top 704 and the bottom 705 of the tin foil moving element layer. As an alternative to this embodiment, a layer of magnets may be affixed only to one side of the thin foil.

FIG. 7B is an illustrative view of a single element in motion, showing the upward freedom of movement of certain embodiments where the magnetized center 706 of a single serpentine shape is free to extend upward while being guided and restrained by the serpentine etched flexures 707. Not shown in the illustration is the opposite (downward) movement of the serpentine shape as it travels in the opposite direction, and by doing so the flexures extend downward.

In certain embodiments the top of each shape center 708 and the bottom of each layer 709 are affixed magnetized layers that have been aligned in the same magnetic polarity.

FIG. 8A shows a block diagram of the speaker system in accordance with a preferred embodiment of the present invention. In certain embodiments the digital input signal (common protocols are I2S, I2C or SPDIF) 801 enters into a logic processor 802 which in turn translates the signal to define the latching mechanism of each grouping of moving elements. Group addressing is typically separated into two primary groups, one for latching the moving elements at the top, and one for latching the moving elements at the bottom of their strokes. Each group is typically then further separated into logical addressing groups typically starting with a group of at least one moving element, followed by another group that doubles the moving elements of the previous group, followed by a another group which again doubles the number of elements of the previous, and so on, until all moving elements of the entire array have been grouped. The Nth group comprises $2^{N-1}$ moving elements.

In the embodiment depicted in the block diagram of FIG. 8A, the top group of one element group 803, a two element group 804 and then a four element group 805 are shown and so on, until the total numbers of moving elements in the transducer array assembly have been addressed to receive a control signal from the processor 802.

The same grouping pattern is typically replicated for the bottom latching mechanisms where a one element group 807 may be followed by a two element group 808 and then a four element group 809 and so on, until the total numbers of moving elements in the transducer array assembly have been addressed to receive a control signal from the processor 802.

The processor 802 may also control an alternating current flow to the coil that surrounds the entire transducer array 812, thus creating and controlling the magnetic field across the entire array. In certain embodiments a power amplifier 811 may be used to boost current to the coil.

FIG. 8B illustrates a flow diagram of the speaker system. In certain embodiments where the sampling rate of the digital input signal 813 might be different from the device natural sampling rate, the resampling module 814 may re-sample the signal, so that it matches the device's sampling-rate. Otherwise, the resampling module 814 passes the signal through as unmodified.

The scaling module 815 typically adds a bias level to the signal and scales it, assuming the incoming signal 813 resolution is M bits per sample, and the sample values X range between $-2^{(M-1)}$ and $2^{(M-1)}-1$.

It is also assumed that in certain embodiments the speaker array has N element groups (numbered 1 ... N), as described in FIG. 8A.

K is defined to be: K=N−M

Typically, if the input resolution is higher than the number of groups in the speaker (M>N), K is negative and the input signal is scaled down. If the input resolution is lower than the number of groups in the speaker (M<N), K is positive and the input signal is scaled up. If they are equal, the input signal is not scaled, only biased. The output Y of the scaling module 815 may be: $Y=2^K[X+2^{M-1}]$. The output Y is rounded to the nearest integer. The value of Y now ranges between 0 and 2N−1.

The bits comprising the binary value of Y are inspected. Each bit controls a different group of moving elements. The least significant bit (bit1) controls the smallest group (group 1). The next bit (bit2) controls a group twice as big (group 2). The next bit (bit3) controls a group twice as big as group 2 etc. The most significant bit (bitN) controls the largest group (group N). The states of all the bits comprising Y are typically inspected simultaneously by blocks 816, 823, ... 824.

The bits are handled in a similar manner. Following is a preferred algorithm for inspecting bit1:

Block 816 checks bit1 (least significant bit) of Y. If it is high, it is compared to its previous state 817. If bit1 was high previously, there is no need to change the position of the moving elements in group 1. If it was low before this, the processor waits for the magnetic field to point upwards, as indicated by reference numeral 818 and then, as indicated by reference numeral 819, the processor typically releases the bottom latching mechanism B1, while engaging the top latching mechanism T1, allowing the moving elements in group 1 to move from the bottom to the top of the device.

If block 816 determines that bit1 of Y is low, it is compared to its previous state 820. If bit1 was low previously, there is no need to change the position of the moving elements in group 1. If its previous state was high, the processor waits for the magnetic field to point downwards, as indicated by reference numeral 821 and then, as indicated by reference numeral 822, the processor releases the top latching mechanism T1 while engaging the top latching mechanism B1, allowing the moving elements in group 1 to move from the top to the bottom of the device.

FIG. 9A shows typical relationships between the different major forces applied to moving elements. The different forces being applied to the moving elements typically work in harmony to counterbalance each other in order to achieve the desired function. Forces toward the center are shown as negative forces, while forces driving the element further away from the center (either toward the up or down latching mechanisms) are shown as positive forces.

In the present embodiment the moving element is influenced by 3 major forces:

a. Magnetic force, created by the interaction of the magnetic field and the hard magnet. The direction of this force depends on the polarity of the moving element magnet, the direction of the magnetic field and the magnetic field gradient.

b. Electrostatic force, typically created by applying a certain charge to the electrode and an opposite charge to the moving element. The direction of this force is such as to attract the moving element to the electrode (defined as positive in this figure). This force increases significantly when the distance between the moving element and the electrode becomes very small, and/or where this gap comprises material with a high dielectric constant.

c. Retracting force created by the flexures, (which act as springs). The direction of this force is always towards the center of the device (defined as negative in this figure). This force is relatively small since the flexures are compliant, and is linear in nature.

The relationship between the forces shows that typically, as the moving element increasingly nears the end of its stroke, the electrostatic force (generated by the latching mechanism) increases, ultimately achieving sufficient force to attract and latch the moving element. When the latch is released, the retracting and magnetic forces are typically able to pull the moving element away from the latch toward the center, thereby inducing travel of the moving element. As the moving element travels to the center, typically, the retracting force of the flexure diminishes and ultimately is overcome, and is then controlled by the electromagnetic force and the kinetic energy of the moving element.

FIG. 10A shows a sectional view of the grouping pattern applied in certain embodiments to the moving element ("pistons") for purposes of digital addressing, as described previously in FIG. 8. In this embodiment there is a group of one element in the center 1001 followed by a two element group 1002, followed by a four element group 1003, followed by a eight element group 1004, followed by a 16 element group 1005, and so on.

As shown in this embodiment, to the extent possible each increasing group has been arranged to extend around the previous group, however this geometrical configuration can be altered in order to accomplish different audio and/or constructive objectives. For example moving the "epicenter" to the outer circumference of the transducer array enables easier wire routing between each group and the processor 802 (refer to FIGS. 8A-8B).

FIG. 11A shows a preferred timing and control chart. The time chart describes preferred logic and algorithms for generating a specific sound waveform. In the scope of this description, the timeline is divided into slots, numbered I1, I2 and so on. This simple example shows a device that uses 7 moving elements divided into 3 groups. The first group comprises one moving element "P1" and is controlled by the top latching mechanism "T1" and the bottom latching mechanism "B1". The second group comprises two moving elements "P2" and "P3" which are synchronized and move together. This group is controlled by the top latching mechanism "T2" and the bottom latching mechanism "B2". The second group comprises four moving elements "P4", "P5", "P6" and "P7", which are synchronized and move together. This group is controlled by the top latching mechanism "T3" and the bottom latching mechanism "B3".

The "clock" chart at the top of the figure represents the system clock. This clock is typically generated outside the device and is transferred to the processor 802 (refer to FIG. 8) alongside the sound signal. In a typical embodiment, the sampling rate of the device is 44100 Hz. In such a case, the duration of each clock interval is 22 μsec and the clock changes its state every 11 μsec.

The "signal" shown in this example is the analog waveform that the device is generating. The "value" chart shows the digital sample value of the signal at each clock interval. The "magnetic" chart shows the direction (polarity) of the magnetic field generated by the coil. The polarity changes synchronously with the system clock.

This figure shows the state of each moving element using the following display convention: An element ("P" ... "P7") that is latched at the top 1101 is colored in black. An element that is latched at the bottom 1102 is colored in white and an element that is moving 1103 is hatched.

The digital sample value dictates how many elements may be latched to the top and how many to the bottom of the array. In this example, digital sample values of −3, −2, −1, 0, 1, 2, 3, and 4 are possible. Each value is represented by 0, 1, 2, 3, 4, 5, 6 and 7 elements, respectively, latched to the top.

In time slice I1 the digital sample value is 0. This requires 3 elements latched to the top and 4 to the bottom. The magnetic field polarity is up. The top latching mechanisms T1 and T2 are engaged and so is the bottom latching mechanism B3. At the same time, the bottom latching mechanisms B1 and B2 are disengaged and so is the top latching mechanism T3. Moving elements P1, P2 and P3 are latched to the top while P4, P5, P6 and P7 are latched to the bottom.

In time slice I3, the digital sample value changes to 1. This requires 4 elements latched to the top and 3 to the bottom. The magnetic field polarization is up. The bottom latch B3 is disengaged, releasing elements P4, P5, P6 and P7 to move freely. At the same time, the top latching mechanism T3 is engaged. The elements move upwards under the influence of the magnetic field and are latched by the currently engaged T3.

At this point, all 7 moving elements are latched to the top. In the next slice I14, the moving elements P1, P2 and P3 would be latched to the bottom, to ensure the device is in the desired state (4 elements at the top and 3 at the bottom). In slice I4, the polarity of the magnetic field changes and is directed downwards. The top latching mechanisms T1 and T2 disengage and release the moving elements P1, P2 and P3. At the same time, the bottom latching mechanisms B1 and B2 are engaged and the approaching moving elements P1, P2 and P3 are latched to the bottom position. The moving elements P4, P5, P6 and P7 are held in place by the top latching mechanism T3 and are therefore restrained from moving downwards along with the other moving elements. The state of the device at this point is: P1, P2 and P3 are latched to the bottom and P4, P5, P6 and P7 are latched to the top. In time slices I5 to I4, the latching mechanisms are engaged and disengaged to allow the moving elements to move and change their state according to the digital sample values.

FIG. 12A shows preferred magnetic properties of moving elements for addressing an alternative embodiment. A static top view of the moving element foil shows one possible alternative embodiment to the moving elements. In this embodiment two distinct group segments of the moving elements 1201 and 1202 have been created, enabling a single transducer array to process and generate a louder signal, or alternatively two separate signals (such as the left and right audio signal of stereo). The cross section view shows that in order to accomplish the two groups of this embodiment (discernible by the separated line 1203), each distinct group segment typically has opposite magnetic polarity.

In one section group 1201 the layer of magnets affixed to the moving element of the thin foil has been polarized so that North (N) is on the top side of the foil 1204 and South (S) is on the bottom side 1205; while in the second section group 1202 the layer of magnets of the thin foil moving element have been polarized so that South (S) is on the top side of the foil 1206 and North (N) is on the bottom side 1207.

FIG. 13 shows grouping of electrodes in an alternative embodiment. Similar to FIG. 10A, FIG. 13 depicts an alternative addressing scheme for the alternative embodiment that is described in FIG. 12A. In this case the grouping pattern applied to the moving element for purposes of digital addressing is divided into two primary group segments, half the transducer array in one primary segment group, and the other half in another primary segment group, as described in FIG. 12A.

In this embodiment there are two equal groups each with an equal number of moving elements beginning with two groups 1301 and 1302 of one moving element each followed by two groups 1303 and 1304 with two elements in each group followed by two groupings 1305 and 1306 of four elements in each group, followed by two grouping 1307 and 1308 of eight elements in each group, followed by two groupings 1309 and 1310 of sixteen elements in each group and so on, until all moving elements of the transducer array have been grouped and addressed.

As shown in the current embodiment, to the extent possible, each increasing group has been arranged to extend around the previous group, however this geometrical configuration can be altered in order to accomplish different audio and/or constructive objectives, for example moving the "epicenters" to the primary groups to opposite sides of the outer circumference of the transducer array enables easier wire routing between each group and the processor 1402 (refer to FIG. 14). It also enables the device to operate in two modes: monophonic, where both groups are used to generate one waveform at twice the amplitude, and stereophonic, where each group generates a separate sound wave, as to allow reconstruction of a stereophonic signal.

FIG. 14 shows a block diagram of the speaker system in an alternative addressing embodiment. FIG. 14 describes addressing of the alternative embodiment shown in FIGS. 12 and 13. The digital input signal (I2S, I2C or SPDIF protocols) 1401 enters a logic processor 1402 which in turn translates the signal to define the latching mechanism of each the two primary grouping of moving elements. Each addressing group is separated into two primary groups, one for top and one for bottom latching mechanisms. Each group is then further separated into logical addressing groups starting with a group of one moving element, followed by another group that doubles the moving elements of the previous group, followed by a another group of double the number of elements of the previous group, and so on, until all moving elements of the entire array have been grouped.

In the embodiment depicted in the block diagram of FIG. 14, the top stroke of one primary segments of moving elements begins with a one element group 1403, and then a two element group 1404, and then a four element group 1405, and so on, until the total numbers of moving elements in the transducer array assembly have been addressed to receive a control signal from the processor 1402.

The same grouping pattern is replicated for the down stroke where a group of one element 1407 is followed by a two element group 1408, and then a four element group 1409, and so on, until the total numbers of moving elements in the transducer array assembly have been addressed to receive a control signal from the processor 1402.

This same pattern is replicated for the second primary segment of moving elements with the top stroke group starting with a one element group 1413, and then a two element group 1414, and then a four element group 1415, and so on, until the total numbers of moving elements in the transducer array assembly have been addressed to receive a control signal from the processor 1402.

This is replicated for the down stroke of the second segment beginning with a group of one element 1417, followed by a two element group 1418, and then a four element group 1419, and so on, until the total numbers of moving elements in the transducer array assembly have been addressed to receive a control signal from the processor 1402.

The processor 1402 will also control an alternating current flow to the coil that typically surrounds the entire transducer array, including both primary segments 1412, thus creating and controlling the magnetic field across the entire array. In certain embodiments a power amplifier 1411 may be used to boost current to the coil.

FIG. 15A shows a timing and control chart for an alternative embodiment. A time chart, describing the logic and algorithms, may be used to generate a specific sound waveform in the alternative embodiment described in FIGS. 12 through 14. The display conventions are similar to those used in FIG. 1IA, and the same signal is reproduced.

The timeline is divided into slots, numbered I1, I2 and so on. This simple example shows a device that uses 14 moving elements divided into two major groups (L and R), each divided into 3 minor groups 1, 2 and 3.

The digital sample value dictates how many elements may be latched to the top and how many to the bottom of the array. In this example, digital sample values of −3, −2, −1, 0, 1, 2, 3, and 4 are possible. Each value is represented by 0, 2, 4, 6, 8, 10, 12 and 14 elements, respectively, latched to the top.

On time slice I3, the digital sample value changes from 0 to 1. This requires 8 elements latched to the top and 6 to the bottom. The magnetic field polarization is up. The top latches RT1 and RT2 as well as the bottom latch LB3 are disengaged, releasing elements RP1, RP2, RP3, LP4, LP5, LP6 and LP7 to move freely. The magnetic polarity of LP4, LP5, LP6 and LP7 creates an upwards force, driving these elements upwards. The magnetic polarity of RP1, RP2 and RP3 is opposite and the driving force is downwards. At the same time, the latching mechanisms opposite to the element movement are engaged to grab the approaching moving elements and latch them in place.

On slice I4, the polarity of the magnetic field changes and is directed downwards. The top latches LT1 and LT2 as well as the bottom latch RB3 are disengaged, releasing elements LP1, LP2, LP3, RP4, RP5, RP6 and RP7 to move freely. The magnetic polarity of RP4, RP5, RP6 and RP7 creates an upwards force, driving these elements upwards. The magnetic polarity of LP1, LP2 and LP3 is opposite and the driving force is downwards. At the same time, the latching mechanisms opposite to the element movement are engaged to grab the approaching moving elements and latch them in place.

On time slices I5 to I14, the latching mechanisms are engaged and disengaged to allow the moving elements to move and change their state according to the digital sample values.

Figure 15B:
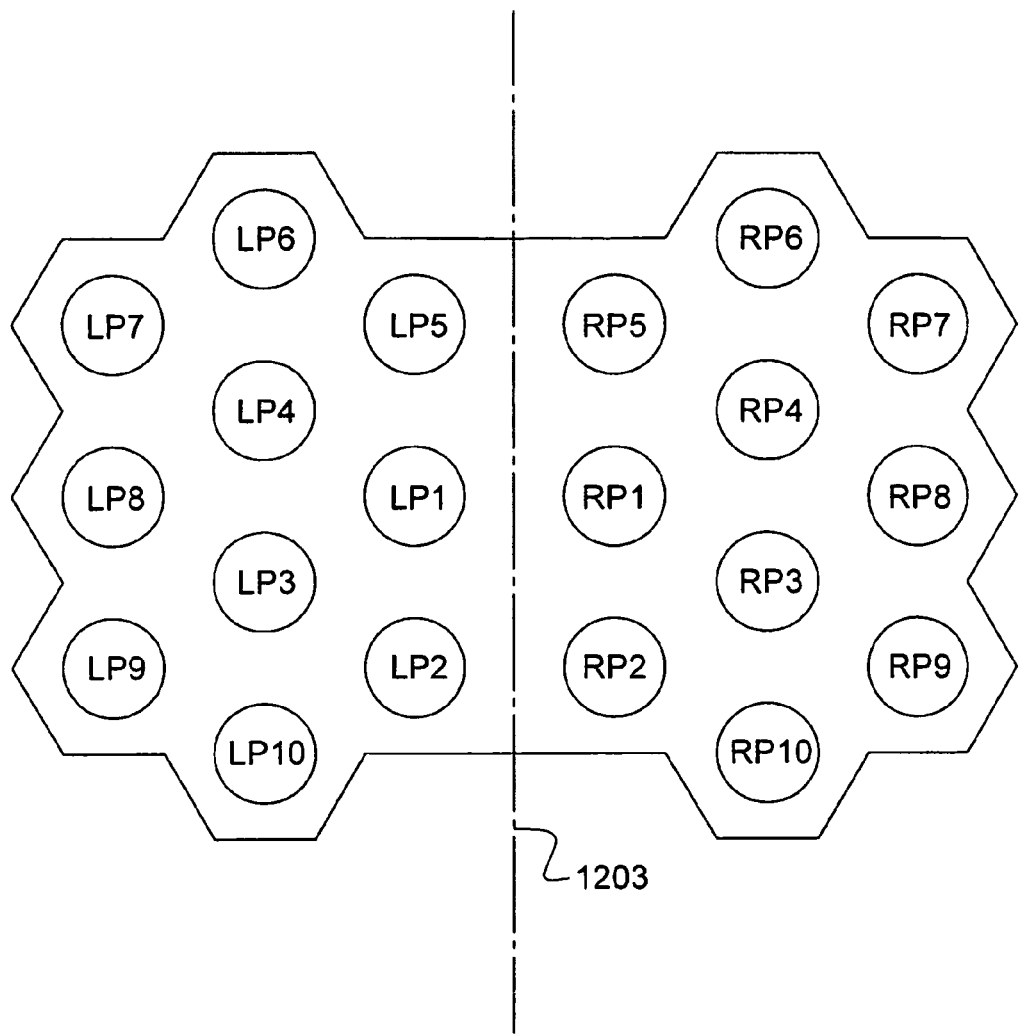
FIG. 15B is a schematic illustration of an example array of moving elements to which the timing diagram of FIG. 15A pertains.
Figure 15C:
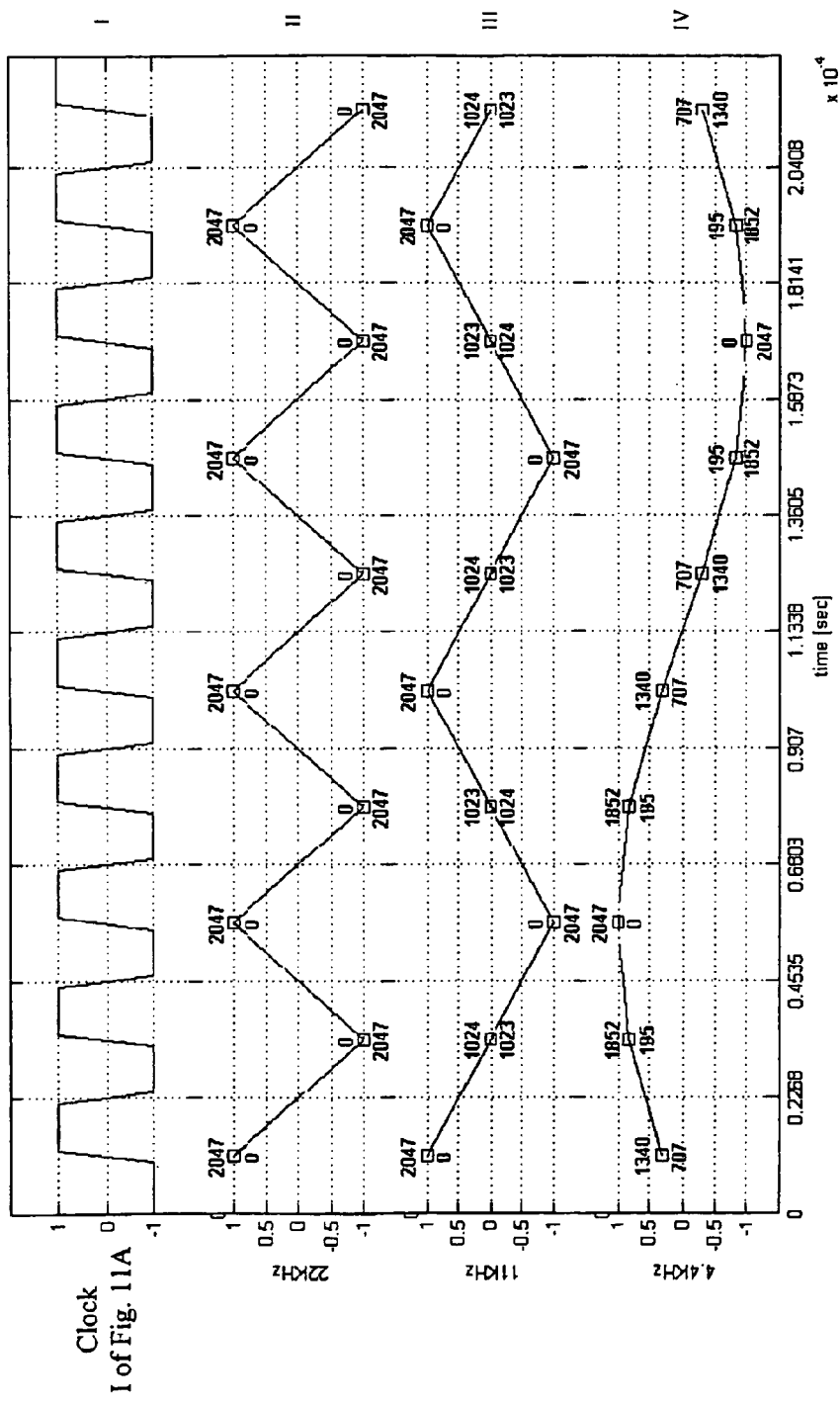
FIG. 15C is a graph showing changes in the number of moving elements disposed in top and bottom extreme positions at different times and as a function of the frequency of the input signal received by the latching controller of FIG. 8C.

FIG. 15C illustrates production of three different pitches (22 KHz, 11 KHz and 4.4 KHz) of sound graphs II-IV respectively. Graph I shows the system clock which, in the illustrated example is 44 KHz. In the illustrated embodiment, the speaker used to generate these pitches has 2047 moving elements. When the 22 KHz sound (half of the clock) is generated, all 2047 elements change position (from top to bottom or vice versa) at each clock. When the 11 KHz (quarter of the clock) sound is generated, half of the 2047 moving elements change position at each clock. For example, if in the first clock all 2047 moving elements are in their top position, in the second clock, 1023 of these are lowered, in the third clock the remaining 1024 elements are lowered, in the fourth clock 1023 are raised, in the fifth clock the remaining 1024 elements are raised, and so forth. When the 4.4 KHz (⅒ of the clock) sound is generated, the numbers of elements which are in their top position at each clock (1340, 1852, . . . ) are shown on top of Graph IV whereas the numbers of elements which are in their bottom position at each clock (707, 195, . . . ) are shown on the bottom of Graph IV.

FIG. 16A shows a small section of the moving elements subassembly.

FIGS. 16A and 16B provide illustrated views of the moving elements in different embodiments.

The embodiment shown in FIG. 16A is of moving elements ("Pistons") constructed from a thin foil material 1601 with a precise round serpentine shape etched into the material which enables the center of the shape 1602 freedom of movement that is restrained by the flexures of the shape.

FIG. 16B shows a small section of a different embodiment of the moving elements subassembly, using a flexible substrate. This embodiment is of moving elements ("pistons") constructed from a material with sufficient elasticity, such as rubber polyethylene material 1603, which either has magnetic material deposits in specific shapes and dimensions on the top and bottom of the material surface, or the material is affixed to a magnetized disk of particular dimensions 1604, enabling freedom of movement that is restrained by the material itself.

FIG. 2C shows a small section of a different embodiment of the moving elements subassembly, using free-floating components. This embodiment is of free floating moving elements ("pistons") constructed from magnetized material with polar opposites at each end. In this particular embodiment North is on top and South on the bottom.

FIG. 3B illustrates a top view of a complete transducer array structure in certain embodiments, based on a honeycomb design, which enables a fill factor of 48 percent of the surface area. FIG. 17 illustrates a top view of a completed transducer array structure in certain embodiments, based on a square design, which enables a fill factor of 38 percent of the surface area.

FIG. 18 shows an exploded view of a small section of an embodiment using square shaped elements. This embodiment shows a transducer array structure that utilizes square shape elements intended to increase the fill factor and allow higher sound pressure levels per transducer area.

As in previous embodiments, the same structural elements are used. A coil surrounds the entire transducer array (not shown). When voltage is applied, the coil generates an electromagnetic actuation force across the entire array structure.

A top layer construction, typically comprising a dielectric layer with an array of accurately spaced cavities 1802, each having an electrode ring, is affixed at the top of each cavity, to create an electrostatic latching mechanism 1801.

The moving elements ("pistons") in this embodiment comprises a thin foil of conductive magnetized material cut or etched with many very accurate "serpentine" shapes, that imparts the foils a specific measure of freedom of movement 1803 with a magnetized top 1804 and bottom 1805. Each moving element is guided and restrained by four flexures.

A bottom layer construction, typically comprising a dielectric layer with an array of accurately spaced cavities 1806, each having an electrode ring affixed at the bottom of each cavity, creates an electrostatic latching mechanism 1807.

FIG. 19 shows an apparatus including a plurality (array) of devices. The structure shows the use of plurality in certain embodiments of array transducers 1902 as to create a device 1901 capable of generating louder sound pressure levels or use beam-forming techniques (which extend beyond the scope of this invention) to create directional sound waves.

The array may have any desired shape, and the round shapes in the description are only for illustrative purposes.

The device constructed and operative in accordance with one embodiment of the present invention and described above with reference to FIGS. 1B, 2A-2C, 3A-3C, 4A, 5, 6A, 7A-7B, 8A-8B, 9A, 10A, 11A, 12A, 13, 14, 15A, 16A-C, 17-19 is now described both more generally, e.g. with reference to FIG. 1A, and in further detail. Alternative embodiments are also described.

Reference is now made to FIG. 1A which is a simplified functional block diagram illustration of actuator apparatus for generating a physical effect, at least one attribute of which corresponds to at least one characteristic of a digital input signal sampled periodically in accordance with a clock. According to a preferred embodiment of the present invention, the apparatus of FIG. 1A comprises at least one actuator device, each actuating device including an array 10 of moving elements each typically constrained to travel alternately back and forth along a respective axis in response to an alternating electromagnetic force applied to the array 10 of moving elements. Each moving element is constructed and operative to be responsive to electromagnetic force. Each moving element may therefore comprise a conductor, may be formed of a ferro magnetic material, may comprise a permanent magnet e.g. as shown in FIG. 6C, and may comprise a current-bearing coil.

A latch 20 is operative to selectively latch at least one subset of the moving elements 10 in at least one latching position thereby to prevent the individual moving elements 10 from responding to the electromagnetic force. An electromagnetic field controller 30 is operative to receive the clock and, accordingly, to control application of the electromagnetic force by a magnetic field generator, 40, to the array of moving elements. A latch controller 50 is operative to receive the digital input signal and to control the latch accordingly. The latch controller 50, in at least one mode of latch control operation, is operative to set the number of moving elements 10 which oscillate freely responsive to the electromagnetic force applied by the magnetic field generator, e.g. coil 40 to be substantially proportional to the intensity of the sound, coded into the digital input signal it receives. Preferably, when the intensity of sound coded into the digital input signal is at a positive local maximum, all moving elements are latched into a first extreme position. When the intensity of sound coded into the digital input signal is at a negative local maximum, all moving elements are latched into a second, opposing, extreme position.

Preferably, a physical effect, e.g. sound, resembling the input signal is achieved by matching the number of moving elements in an extreme position e.g. a top position as described herein, to the digital sample value, typically after resampling and scaling as described in detail below. For example, if the digital sample value is currently 10, 10 moving elements termed herein ME1, . . . ME10 may be in their top positions. If the digital sample value then changes to 13, three additional moving elements termed herein ME11, ME12 and ME13 may be raised to their top position to reflect this. If the next sample value is still 13, no moving elements need be put into motion to reflect this. If the digital sample value then changes to 16, 3 different moving elements (since ME11, ME12 and ME13 are already in their top positions), termed herein M14, M15 and M16, may be raised to their top positions to reflect this.

In some embodiments, as described in detail below, moving elements are constructed and operative to be operated collectively in groups, such as a set of groups whose number of moving elements are all sequential powers of two, such as 31 moving elements constructed to be operated in groups having 1, 2, 4, 8, 16 moving elements, respectively, each. In this case, and using the above example, when the sample value is, say, 10, the two groups including 8 and 2 moving elements respectively are both, say, up i.e. all moving elements in them are in their top positions. When the sample value changes to 13; however, it is typically impractical to directly shift 3 moving elements from their bottom positions to their top positions since in this example, due to the binary grouping, this can only be done by raising the two groups including 1 and 2 moving elements respectively, however, the group including 2 moving elements is already raised. But the number of top pixels may be otherwise matched to the sample value, 13: Since 13=8+4+1, the two groups including 4 and 1 pixels may be raised, and the group including 2 pixels may be lowered, generating a net pressure change of +3, thereby to generate a sound resembling the input signal as desired, typically after re-sampling and scaling.

More generally, moving elements translated toward a first extreme position such as upward generate pressure in a first direction termed herein positive pressure. Moving elements translated toward the opposite extreme position such as downward generate pressure in the opposite direction termed herein negative pressure. A certain amount of positive or negative pressure may be obtained either by translating the appropriate number of moving elements in the corresponding direction, or by translating n moving elements in the corresponding direction and others, m in number, in the opposite direction, such that the difference n−m corresponds to e.g. equals the sampled signal value, typically after re-sampling and scaling.

The moving elements are typically formed of a material which is at least moderately electrically conductive such as silicon or silicon coated by a metal such as gold.

If the moving elements comprise permanent magnets, the permanent magnets are typically magnetized during production such that the magnetic poles are co-linear to the desired axes of motion. A coil that typically surrounds the entire transducer array generates the actuation force. To control each moving element, two latch elements (typically comprising electro static latches or "electrodes") are typically used, e.g. one above and one below the moving elements.

According to one embodiment, the actuator is a speaker and the array of moving elements 10 is disposed within a fluid medium. The controllers 30 and 50 are then operative to define at least one attribute of the sound to correspond to at least one characteristic of the digital input signal. The sound has at least one wavelength thereby to define a shortest wavelength present in the sound and each moving element 10 typically defines a cross section which is perpendicular to the moving element's axis and which defines a largest dimension thereof, the largest dimension of each cross-section typically being small relative to, e.g. an order of magnitude smaller than, the shortest wavelength. FIG. 1B is an isometric illustration of the array 10 of moving elements constructed and operative in accordance with a preferred embodiment of the present invention. In this embodiment, each moving element 10 comprises a magnet and each is constrained to travel, except when and if latched, alternately back and forth along a respective axis in response to an alternating electromagnetic force applied to the array of moving elements 10 by the magnetic field generator 40.

Figure 1F:
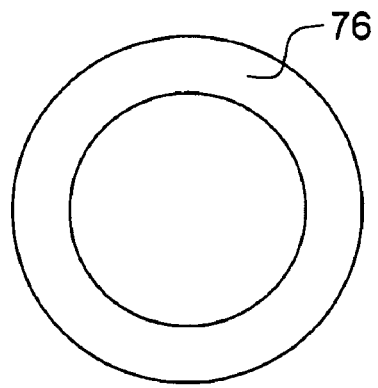
FIGS. 1C-1G are simplified top view illustrations of latches constructed and operative in accordance with five alternative embodiments of the present invention which can serve as alternatives to the latch specifically shown in FIG. 1B.
Figure 1D:
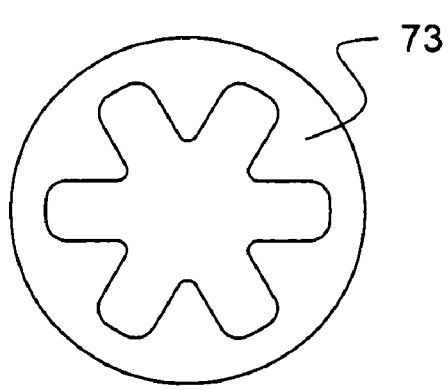
Figure 1C:
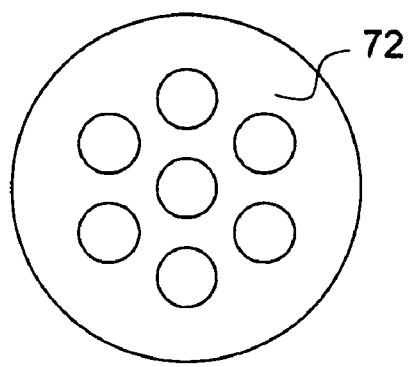
Figure 1E:
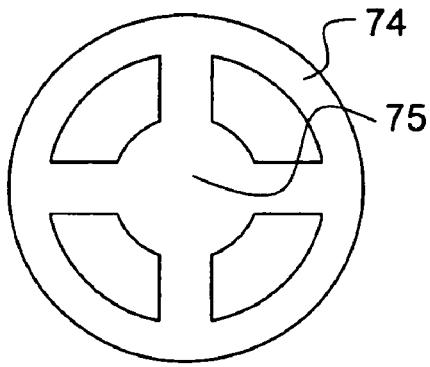
Figure 1G:
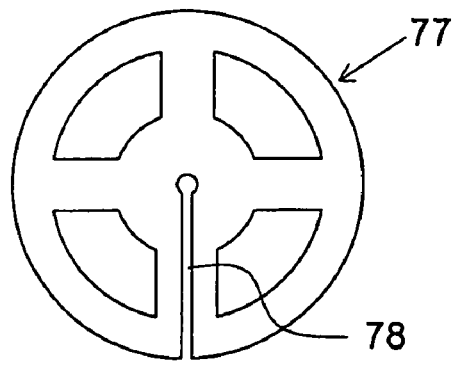

FIGS. 1C-1G are simplified top view illustrations of latch elements 72, 73, 74, 76, and 77, any of which may, in combination with similar or dissimilar others form the electrostatic latch 20 in accordance with alternative embodiments of the present invention. At least one of the latch elements, 72, may have a perforated configuration, as shown in FIG. 1C. In FIG. 1D, a latch element 73 is shown having a notched configuration as to allow concentration of electrostatic charge at the sharp portions of the latch thereby to increase the latching force applied to the corresponding moving element. In FIG. 1E, at least one latch element, 74, has a configuration which includes a central area 75 which prevents air from passing so as to retard escape of air, thereby to cushion contact between the moving element 10 and the latching element itself. At least one latch element, 76, may have a ring configuration, as shown in FIG. 1F and, by way of example, in FIG. 1B. Latch element 77 of FIG. 1G is still another alternative embodiment which is similar to latch element 74 of FIG. 1E except that at least one radial groove 78 is provided so as to eliminate induced current in the latch.

FIG. 2A shows the array of FIG. 1B in a first, bottom extreme position responsive to an electromagnetic force applied, by coil or other magnetic field generator 40 of FIG. 1A, downward. FIG. 2B shows the array of FIG. 1B in a second, top extreme position responsive to an electromagnetic force applied, by coil or other magnetic field generator 40 of FIG. 1A, upward. FIG. 2C is similar to FIG. 2B except that one of the individual moving magnets, 204, is not responding to the upward force applied by magnetic field generator 40 because that individual magnet is latched into its top extreme position by a corresponding electric charge disposed above the individual moving element and functioning as a top latch. It is appreciated that in the embodiment of FIGS. 1A-2C, the latch 20 comprises an electrostatic latch, however this need not be the case.

Typically, the apparatus of FIGS. 2A-2C comprises a pair of latch elements 205 and 207 for each moving element, termed herein "top" and "bottom" latch elements for simplicity although one need not be above the other, the latch elements including one or more electrodes and a space maintainer 220 separating the electrodes. In embodiments in which the latch 20 comprises an electrostatic latch, the space maintainer 220 may be formed of an insulating material.

Each pair of latching elements is operative to selectively latch its individual moving element 10 in a selectable one of two latching positions, termed herein the first and second latching positions or, for simplicity the "top" and "bottom" latching positions, thereby to prevent the individual moving elements from responding to the electromagnetic force. If the axis along which each moving element 10 moves is regarded as comprising a first half-axis and a second co-linear half-axis, the first latching position is typically disposed within the first half-axis and the second latching position is typically disposed within the second half-axis as shown e.g. in FIGS. 2A-2C.

FIGS. 3A-3C are respective top, cross-sectional and isometric views of a skewed array of moving elements 10 each constrained to travel alternately back and forth along a respective axis in response to an alternating electromagnetic force applied to the array of moving elements 10 e.g. by a coil 40 wrapped around the array as shown. FIG. 4A is an exploded view of a layered actuator device including an array of moving elements 403 each constrained to travel alternately back and forth along a respective axis in response to an alternating electromagnetic force applied to the array of moving elements 403 by a coil 401, and a latch, formed as at least one layer, operative to selectively latch at least one subset of the moving elements 403 in at least one latching position thereby to prevent the individual moving elements 403 from responding to the electromagnetic force. Typically, the electromagnetic force is generated using a coil 401 that surrounds the array 403 as shown.

The latch typically comprises a pair of layers: a top latch layer 402 and bottom latch layer 404 which, when charged, and when the moving elements are in an appropriate electromagnetic field as described herein, latch the moving elements into top and bottom extreme positions respectively. Each of the latch layers 402 and 404 typically comprises an electrode layer and spacer layer as shown in detail in FIGS. 5-6A. The spacer layers 402 and 404 may generally be formed from any suitable dielectric material. Optionally, ferrite or ferro-magnetic particles may be added to the dielectric material to decrease undesirable interaction between the magnets in the magnet layer.

In FIGS. 5-6A, both flexures and annular magnets or conductors or ferromagnets are provided, however it is appreciated that this is not intended to be limiting. Alternatively, for example, other shaped magnets may be provided, or the annular elements may be replaced by coils, and free-floating moving elements may be provided without flexures, or the moving elements may have a peripheral elastic or flexible portion or be associated with a peripheral elastic or flexible member, all as shown and described in detail herein.

Figure 4B:
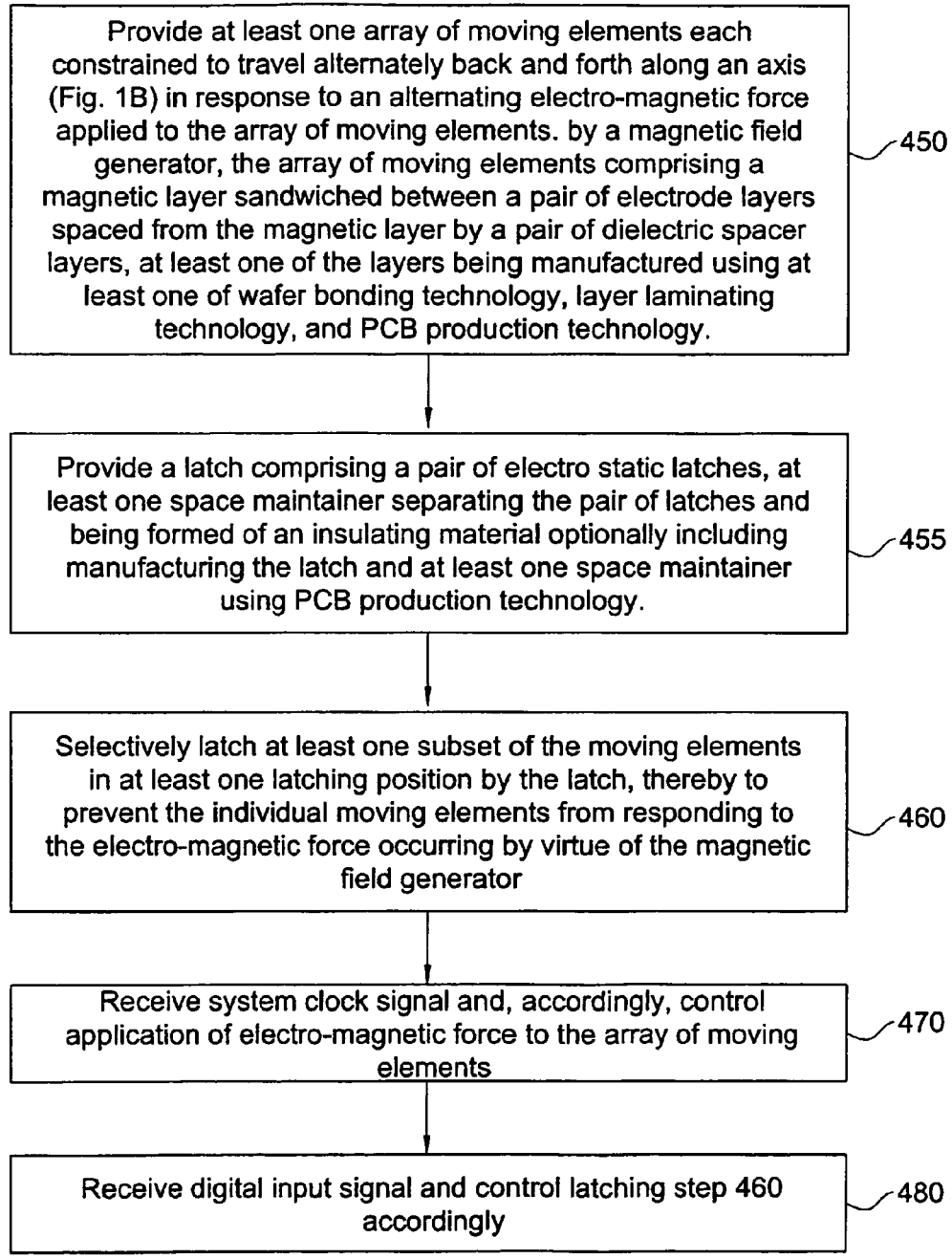
FIG. 4B is a simplified flowchart illustration of a preferred actuation method operative in accordance with a preferred embodiment of the present invention.

FIG. 4B is a simplified flowchart illustration of a preferred actuation method operative in accordance with a preferred embodiment of the present invention. In FIG. 4B, a physical effect is generated, at least one attribute of which corresponds to at least one characteristic of a digital input signal sampled periodically in accordance with a system clock signal. As shown, the method typically comprises (step 450) providing at least one array of moving elements 10 each constrained to travel alternately back and forth along an axis 15 (FIG. 1B) in response to an alternating electromagnetic force applied to the array of moving elements 10 e.g. by magnetic field generator 40. In step 460, at least one subset of the moving elements 10 is selectively latched in at least one latching position by a latch 20 thereby to prevent the individual moving elements 10 from responding to the electromagnetic force applied by magnetic field generator 40. In step 470, the system clock signal is received and, accordingly, application of the electromagnetic force to the array of moving elements is controlled. In step 480, the digital input signal is received, and the latching step 460 is controlled accordingly. Typically, as described above, the latch 20 comprises a pair of layers, each layer comprising an array of electrostatic latch elements and at least one space maintainer layer separates the electrostatic latch layers and is formed of an insulating material. Typically, the latch and at least one space maintainer are manufactured using PCB production technology (FIG. 4B, step 450). The array of moving elements typically comprises a magnetic layer 403 sandwiched between a pair of electrode layers spaced from the magnetic layer by a pair of dielectric spacer layers. Typically, at least one of the layers is manufactured using wafer bonding technology, layer laminating technology, and/or PCB production technology and/or combination of these technologies (FIG. 4B, step 455).

FIG. 5 is an isometric static view of the actuator device of FIG. 4A constructed and operative in accordance with a preferred embodiment of the present invention in which the array of moving elements 10 is formed of thin foil, each moving element being constrained by integrally formed flexures 606 surrounding it. The flexures typically include foil portions 703 interspersed with cut-out portions 702. FIG. 6A is an exploded view of a portion of the actuator device of FIG. 5.

According to a preferred embodiment of the present invention, 3 flexures are provided since at least three flexures are required to define a plane. In the case of the moving elements shown and described herein, the plane defined by the flexures is typically a plane perpendicular to the desired axes of motion of the moving elements or any plane suitably selected to constrain the moving elements to travel along the desired axes.

Generally, it is desired to minimize the area of the flexures so as to exploit the available area of the device for the moving elements themselves since the process of actuation is performed by the moving elements such that, from the point of view of the functionality of the device, the area of the flexures is overhead. For example, if the actuator is a speaker, the moving elements push air thereby to create sound whereas the flexures and the gaps defining them do not. Therefore, it is generally desirable that the total length of the flexures be similar to the perimeter of the moving elements (e.g. as opposed to being double the perimeter of the moving elements). Therefore, it may be desired to treat the total length of the flexures as given and consequently, the more flexures provided, the shorter each flexure which translates into higher stress under the same translation i.e. to achieve the same amplitude of motion of the moving elements.

As a result, it is believed to be preferable to provide only three flexures i.e. no more than the minimum number of flexures required to securely hold the moving element, e.g. to define a plane normal to the axis of motion of the moving elements.

Figure 6B:
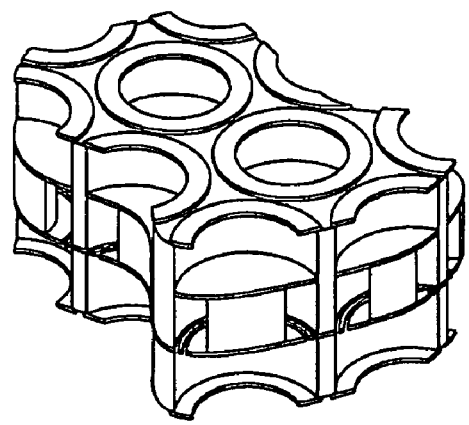
FIGS. 6B and 6C are a perspective view illustration and an exploded view, respectively, of an assembly of moving elements and associated flexures, latches and spacer elements constructed and operative in accordance with a preferred embodiment of the present invention which reduces leakage of air through the flexures.
Figure 6C:
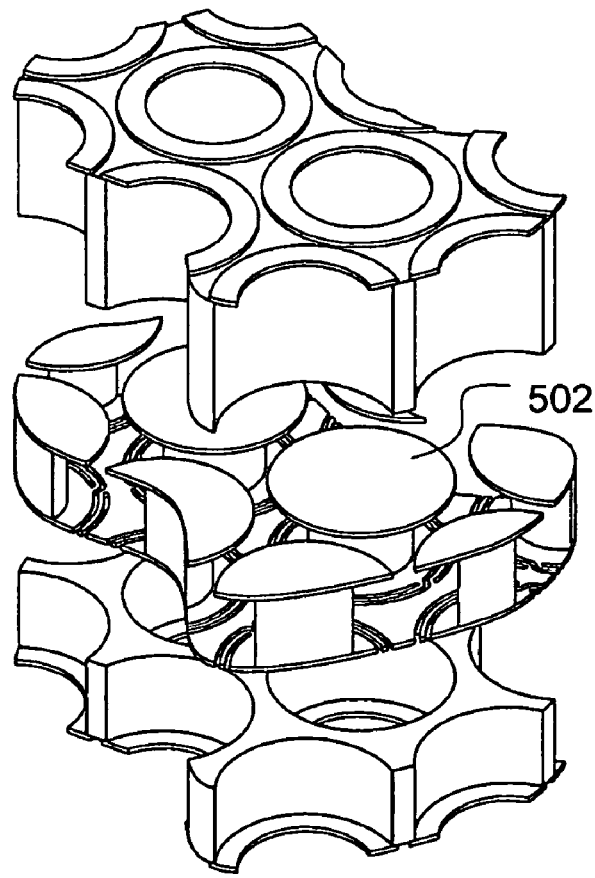

FIGS. 6B and 6C are isometric and exploded view illustrations, respectively, of an assembly of moving elements, latches and spacer elements constructed and operative in accordance with a preferred, low air leakage, embodiment of the present invention. Air leakage refers to air passing from the space above the moving element to the space below the moving element or vice versa.

Figures 6D, 6E:
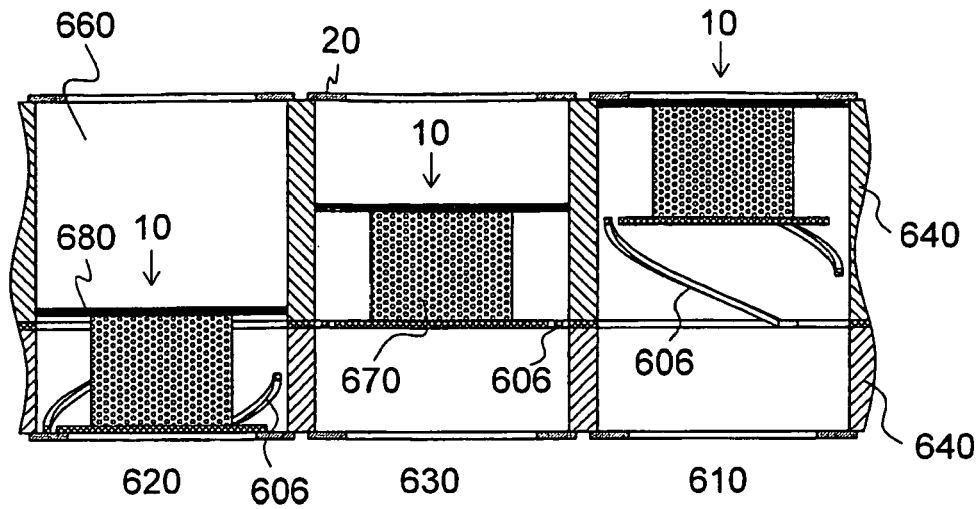
FIG. 6D is a cross-sectional view of the apparatus of FIGS. 6B-6C showing three moving elements in top extreme, bottom extreme and intermediate positions respectively.
FIG. 6E is a legend for FIG. 6D.

FIG. 6D is a cross-sectional view of the apparatus of FIGS. 6B-6C showing three moving elements 10 in top extreme, bottom extreme and intermediate positions 610, 620 and 630 respectively. FIG. 6E is a legend for FIG. 6D. Typically, in the embodiment of FIGS. 6B-6E, at least one of the moving elements is configured to prevent leakage of air through the at least one flexure. As shown, at least one space maintainer 640 is disposed between the array of moving elements 10 and the latching mechanism 20, the space maintainer defining a cylinder 660 having a cross section, and wherein at least one of the moving elements 10 comprises an elongate element 670 whose cross-section is small enough to avoid the flexures and a head element 680 mounted thereupon whose cross-section is similar to the cross-section of the cylinder 660. It is appreciated that for simplicity, only a portion of flexures 606 are shown.

Figure 7C:
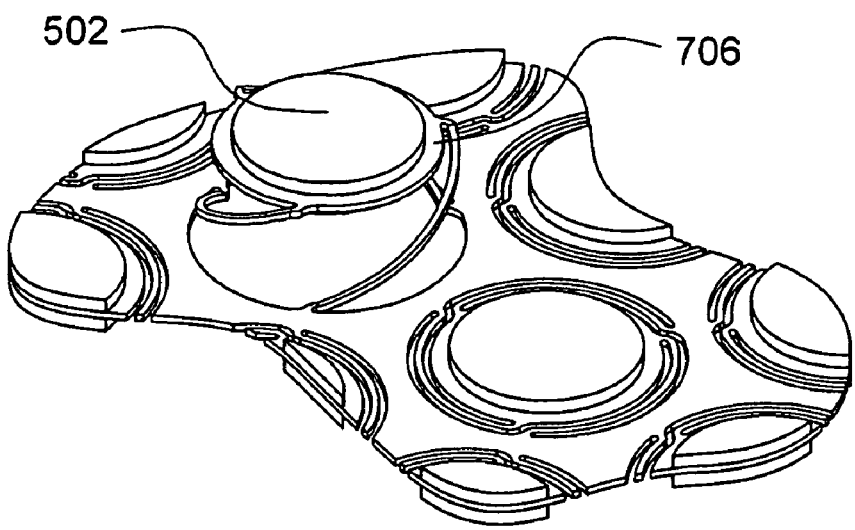
FIG. 7C is a perspective view of the moving element layer of FIGS. 5-7B wherein an individual moving element is shown moving upward toward its top extreme position such that its flexures extend upward out of the plane of the thin foil.

FIG. 7A is a static partial top view illustration of the moving element layer of FIGS. 5-6C. FIG. 7B is a cross-sectional view of the moving element layer of FIGS. 5-6 taken along the A-A axis shown in FIG. 7A. FIG. 7C is a perspective view of the moving element layer of FIGS. 5-7B wherein an individual moving element is shown moving upward toward its top extreme position such that its flexures bend and extend upward out of the plane of the thin foil. As shown, in FIGS. 7A-7C, at least one of the moving elements 10 of FIG. 1A has a cross section defining a periphery 706 and is restrained by at least one flexure attached to the periphery. Typically, at least one moving element 10 and its restraining typically serpentine flexures are formed from a single sheet of material. Alternatively, as shown in FIG. 16B, at least one flexure 1605 may be formed of an elastic material. It is appreciated that the flexure-based embodiment is only one possible embodiment of the present invention. In contrast, as shown e.g. in FIG. 1B, each moving element may simply comprise a free floating element.

Figure 7D:
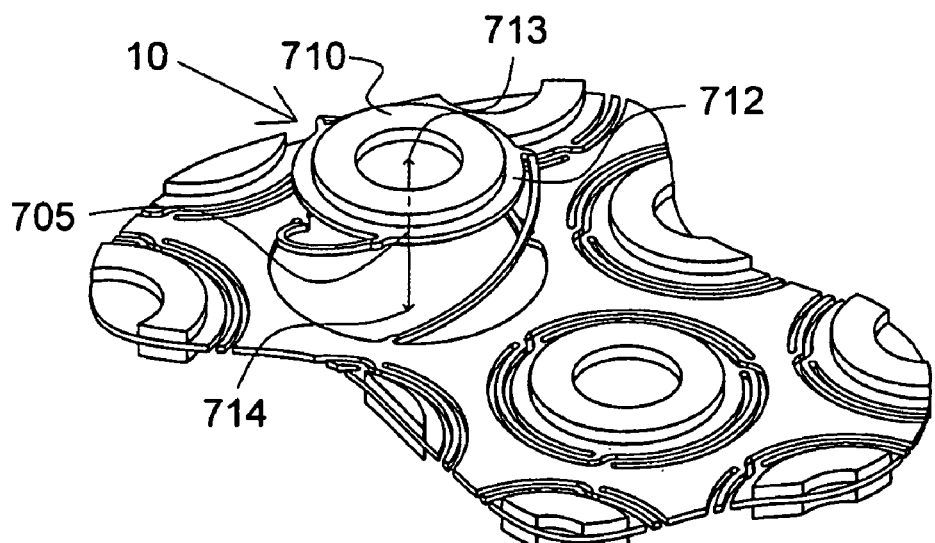
FIG. 7D is a perspective view of a moving element layer constructed and operative in accordance with an alternative embodiment of the present invention in which the disc-shaped permanent magnets of the embodiment of FIGS. 5-7C are replaced by ring-shaped permanent magnets.
Figure 7E:
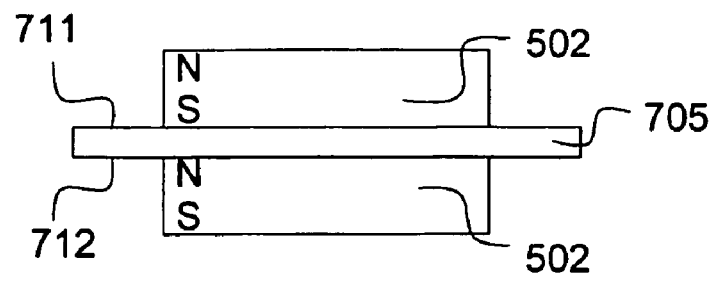
FIG. 7E is a side view illustration of the flexure-restrained central portion of an individual moving element in the embodiment of FIG. 7D.

FIG. 7D is a perspective view of a moving element layer constructed and operative in accordance with an alternative embodiment of the present invention. FIG. 7E is a side view illustration of the flexure-restrained central portion 705 of an individual moving element. In the embodiment of FIGS. 7D-7E, the moving elements 10 of FIG. 1A comprise typically annular permanent magnets 710 rather than the disc-shaped permanent magnets 502 of the embodiments of FIGS. 5-7C. Typically, each moving element 10 has first and second opposing typically circular surfaces 711 and 712 facing first and second endpoints 713 and 714 of the moving element's axis 715 of motion respectively and at least one permanent magnet 710 is disposed on at least one of the first and second circular surfaces 711 and 712. If two permanent magnets 710 are provided, then the two are aligned such that the same pole points in the same direction as shown in FIG. 7E.

FIG. 8A is a control diagram illustrating control of latch 20 by latch controller 50 of FIG. 1A, and of the typically coil-induced electromagnetic force, by controller 30 of FIG. 1A, for a particular example in which the moving elements 10 are arranged in groups G1, G2, . . . GN that can each, selectably, be actuated collectively, wherein each latch in the latching layer is typically associated with a permanent magnet, and wherein the poles of all of the permanent magnets in the latching layer are all identically disposed. The latch typically comprises, for each group or each moving element in each group, a top latch and a bottom latch. The top and bottom latches for group Gk (k=1, . . . , N) are termed Tk and Bk respectively. In FIG. 8A the two controllers are both implemented in processor 802.

FIG. 8B is a flowchart illustrating a preferred method whereby latching controller 50 of FIG. 1A may process an incoming input signal 801 and control latches 20 of moving elements 10 accordingly, in groups. The abbreviation "EM" indicates electromagnetic force applied upward or downward, depending on the direction of the associated arrow, to a relevant group of moving elements. In the embodiment illustrated in FIG. 8B, if at time t, the LSB of the re-scaled PCM signal is 1 (step 816), this indicates that the speaker elements in group G1 may be in the selected end-position. If (step 817) group G1 is already in the selected end-position, no further action is required, however if the group G1 is not yet in the selected end-position, the latching controller 50 waits (step 818) for the electromagnetic field to be upward and then (step 819) releases the bottom latches in set B1 and engages the top latches in set T1. This is also the case, mutatis mutandis, for all other groups G2, . . . GN.

In FIG. 8B, the notation Tk or Bk followed by an upward pointing or downward pointing arrow indicates latching or releasing (upward or downward arrow respectively) of the top or bottom (T or B respectively) latch of the k'th group of moving elements.

Figure 8C:
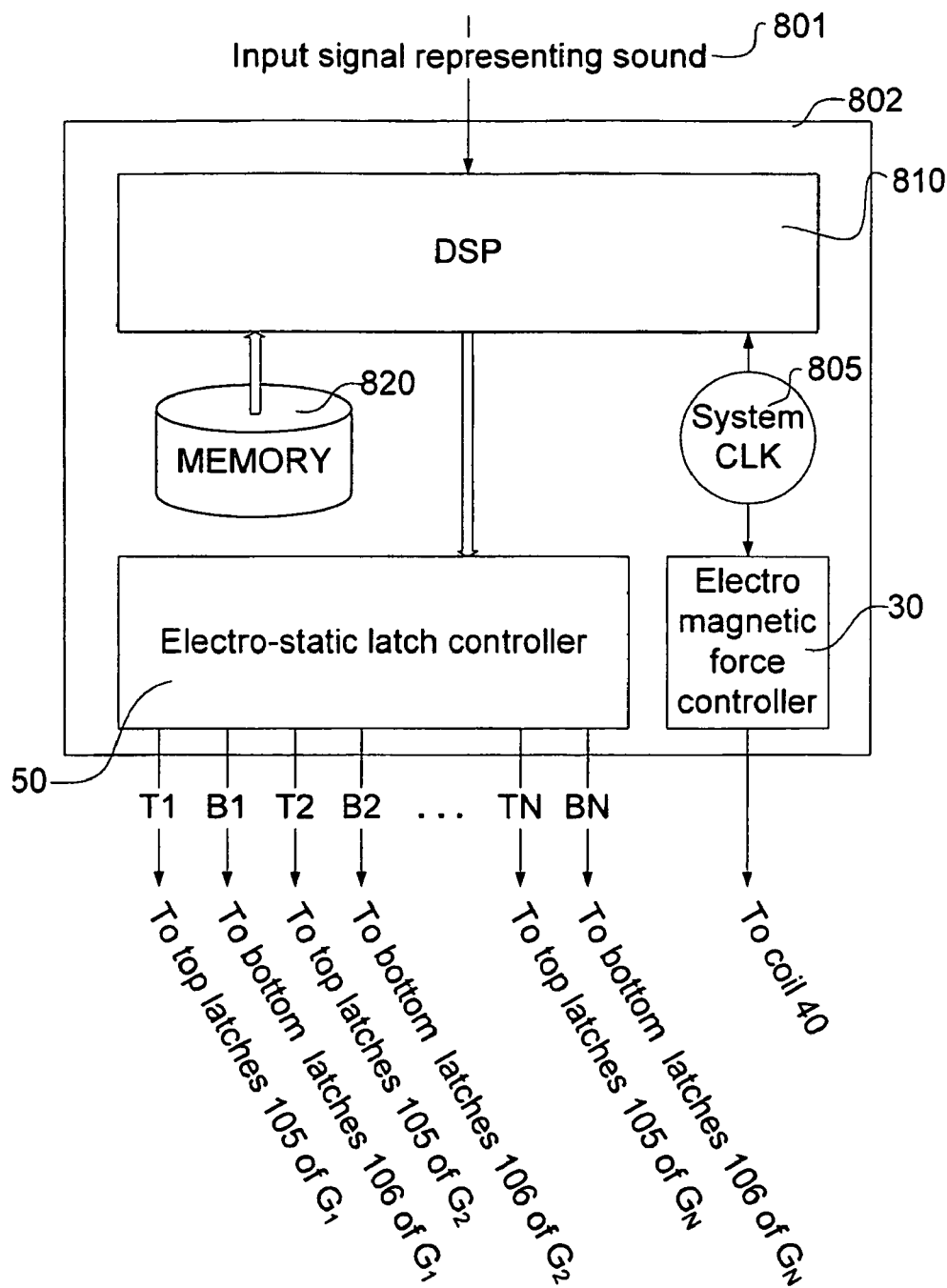
FIG. 8C is a simplified functional block diagram illustration of a processor, such as the processor 802 of FIG. 8A, which is useful in controlling substantially any of the actuator devices with electrostatic latch mechanisms shown and described herein.

FIG. 8C is a simplified functional block diagram illustration of a processor, such as the processor 802 of FIG. 8A, which is useful in controlling substantially any of the actuator devices with electro-static latch mechanisms shown and described herein. A single processor, in the embodiment of FIG. 8C, implements both electromagnetic field controller 30 and latch controller 50. The electromagnetic field controller 30 typically receives the system clock 805 which is typically a square wave and generates a sine wave with the same frequency and phase, providing this to the coil 40 as an actuating signal. The DSP 810 may for example comprise a suitably programmed T1 6000 digital signal processor commercially available from Texas Instruments. The program for the DSP 810 may reside in a suitable memory chip 820 such as a flash memory. The latch controller 50, in at least one mode of latch control operation, is operative to set the number of moving elements which oscillate freely responsive to the electromagnetic force applied by the coil 40 to be substantially proportional to the intensity sound coded in the digital input signal.

The electromagnetic field controller 30 typically controls an alternating current flow to the coil 40 that typically surrounds the entire array of moving elements 10, thus creating and controlling the magnetic field across the entire array. In certain embodiments a power amplifier 811 may be used to boost current to the coil 40. The electromagnetic field controller 30 typically generates an alternating electromagnetic force whose alternation is synchronous with the system clock 805 as described in detail below with reference to FIG. 11A, graph I.

The latch controller 50 is operative to receive the digital input signal 801 and to control the latching mechanism 20 accordingly. Typically, each individual moving element 10 performs at most one transition per clock i.e. during one given clock, each moving element may move from its bottom position to its top position, or move from its top position to its bottom position, or remain at one of either of those two positions. A preferred mode of operation of the latch controller 50 is described below with reference to FIG. 11A. According to a preferred embodiment of the present invention, retention of moving elements 10 in their appropriate end positions is affected by the latching controller 50.

Preferably, the latching controller 50 operates on the moving elements in groups, termed herein "controlled groups". All moving elements in any given group of moving elements are selectably either latched into their top positions, or into their bottom positions, or are unlatched. Preferably, the "controlled groups" form a sequence G1, G2, ... and the number of speaker elements in each controlled group Gk is an integer, such as 2, to the power of (k−1), thereby allowing any desired number of speaker elements to be operated upon (latched upward, downward or not at all) since any given number can be expressed as a sum of powers of, for example, two or ten or another suitable integer. If the total number of speaker elements is selected to be one less than an integral power (N) of 2 such as 2047, it is possible to partition the total population of speaker elements into an integral number of controlled groups namely N. For example, if there are 2047 speaker elements, the number of controlled groups in the sequence G1, G2, ... is 11.

In this embodiment, since any individual value of the re-scaled PCM signal can be represented as a sum of integral powers of 2, a suitable number of speaker elements can always be placed in the selected end-position by collectively bringing all members of suitable controlled groups into that end-position. For example, if at time t the value of the re-scaled PCM signal is 100, then since 100=64+32+4, groups G3, G6 and G7 together include exactly 100 speaker elements and therefore, at the time t, all members of these three groups are collectively brought to the selected end position such as the "up" or "top" position and, at the same time, all members of all groups other than these three groups are collectively brought to the un-selected end position such as the "down" or "bottom" position. It is appreciated that each moving element has bottom and top latches, each typically generated by selectively applying suitable local electrostatic forces, associated therewith to latch it into its "down" and "up" positions respectively. The set of bottom and top latches of the speaker elements in group Gk are termed Bk and Tk latches respectively.

Figure 8D:
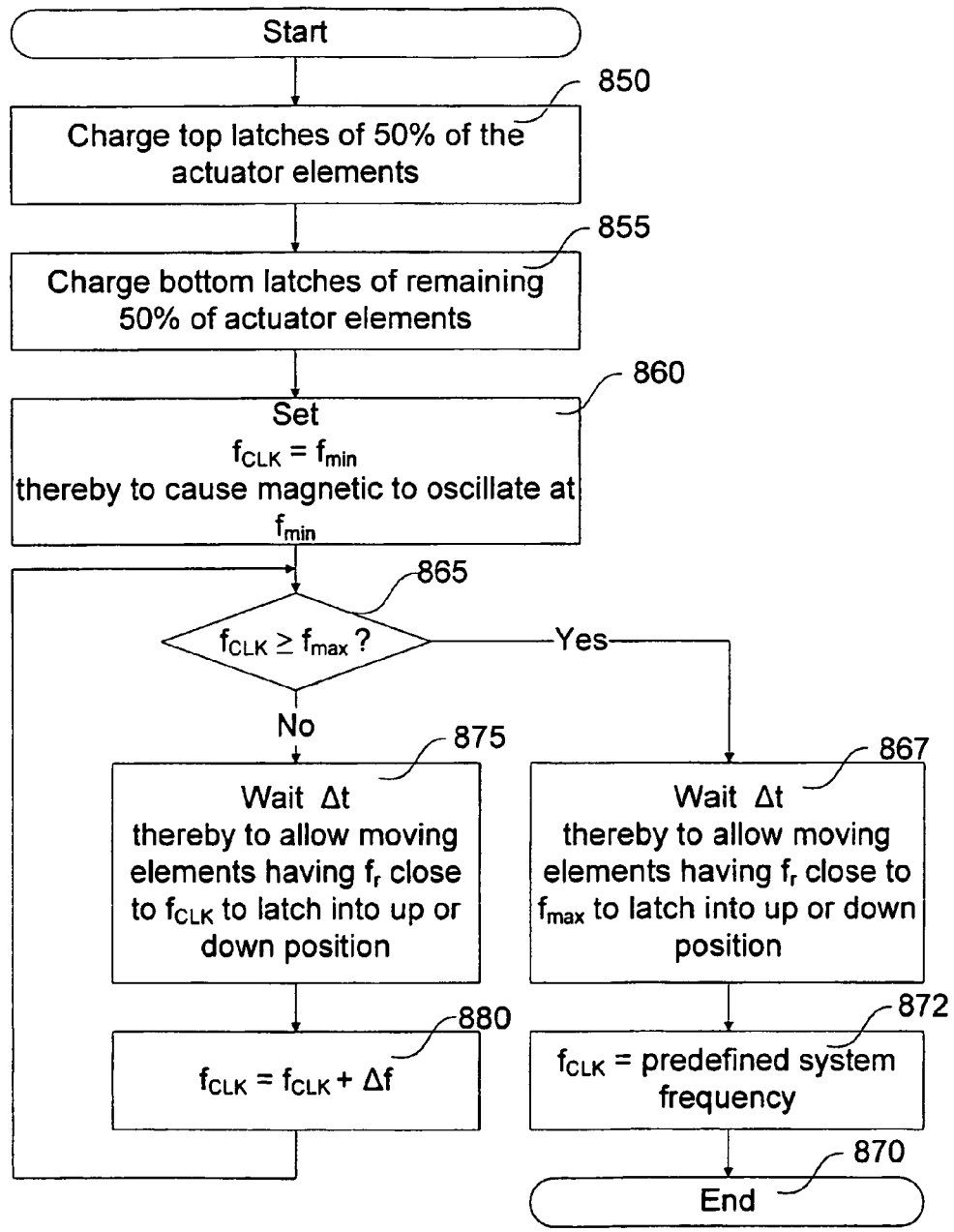
FIG. 8D is a simplified flowchart illustration of a preferred method for initializing the apparatus of FIGS. 1-8C.

FIG. 8D is a simplified flowchart illustration of a preferred method for initializing the apparatus of FIGS. 1A-8C. According to the method of FIG. 8D, the array of moving elements 10 is put into initial motion including bringing each moving element 10 in the array of moving elements into at least one latching position. As described herein, both top and bottom latching positions are typically provided for each moving element 10 in which case the step of bringing each moving element in the array into at least one latching position typically comprises bringing a first subset of the moving elements in the array into their top latching positions and a second subset, comprising all remaining elements in the array, into their bottom latching positions. The first and second subsets are preferably selected such that when the moving elements in the first and second subsets are in their top and bottom latching positions respectively, the total pressure produced by fluid such as air displaced by the moving elements 10 in the first subset is equal in magnitude and opposite in direction to the total pressure produced by fluid such as air displaced by the moving elements in the second subset.

The moving elements 10 typically bear a charge having a predetermined polarity and each of the moving elements defines an individual natural resonance frequency which tends to differ slightly from that of other moving elements due to production tolerances, thereby to define a natural resonance frequency range, such as 42-46 KHz, for the array of moving elements. As described herein, typically, first and second electrostatic latching elements are provided which are operative to latch the moving elements 10 into the top and bottom latching positions respectively and the step of putting the array of moving elements into motion comprises:

Step 850: Charge the first (top or bottom) electrostatic latch of each moving element included in the first subset with a polarity opposite to the pole, on the moving element, facing that latch. The first and second subsets may each comprise 50% of the total number of moving elements.

Step 855: Charge the second (bottom or top) electrostatic latch of each moving element included in the second subset with a polarity opposite to the pole, on the moving element, facing that latch.

Step 860: As described above, the moving elements are designed to have a certain natural resonance frequency, $f_r$. Design tools may include computer aided modeling tools such as finite elements analysis (FEA) software. In step 860, $f_{CLK}$, the frequency of the system clock, which determines the timing of the alternation of the electromagnetic field in which the moving elements are disposed, is set to the natural resonance frequency of the moving element in the array which has the lowest natural resonance frequency, referred to as $f_{min}$ and typically determined experimentally or by computer-aided modeling.

Steps 865-870: The system clock frequency may then be monotonically increased, from an initial value of $f_{min}$ to subsequent frequency values separated by $\Delta f$ until the system clock frequency has reached the natural resonance frequency of the moving element in the array which has the highest natural resonance frequency, referred to as $f_{max}$ and typically determined experimentally or by computer-aided modeling. It is appreciated however that alternatively the system clock frequency might be monotonically decreased, from $f_{max}$ to $f_{min}$, or might be varied non-monotonically.

It is appreciated that when a moving element 10 is excited at its natural resonance frequency, $f_r$, the moving element increases its amplitude with every cycle, until reaching a certain maximal amplitude termed hereinafter $A_{max}$. Typically, the duration $\Delta t$ required for the moving element to reach $A_{max}$ is recorded during set-up and the magnetic force applied during the initialization sequence is selected to be such that $A_{max}$ is twice as large as the gap the moving element needs to travel from its idle state to either the top or bottom latch.

The Q factor or quality factor is a known factor which compares the time constant for decay of an oscillating physical system's amplitude to its oscillation period. Equivalently, it compares the frequency at which a system oscillates to the rate at which it dissipates its energy. A higher Q indicates a lower rate of energy dissipation relative to the oscillation frequency. Preferably, the Q factor of the moving elements is determined either computationally or experimentally. The Q factor as determined describes how far removed the frequency $f_{CLK}$ needs to be from $f_r$ (two possible values, one below $f_r$ and one above $f_r$) before the amplitude drops to 50% of $A_{max}$. The difference between the two possible values is $\Delta f$.

As a result of the above steps, a sequence of electromagnetic forces of alternating polarities is now applied to the array of moving elements. The time interval between consecutive applications of force of the same polarity varies over time due to changes induced in the system clock, thereby to define a changing frequency level for the sequence. This results in an increase, at any time t, of the amplitude of oscillation of all moving elements whose individual natural resonance frequency is sufficiently similar to the frequency level at time t. The frequency level varies sufficiently slowly (i.e. only after a suitable interval $\Delta t$, which may or may not be equal in all iterations) to enable the set S, of all moving elements whose natural resonance frequency is similar to the current frequency level, to be latched before the electromagnetic field alternation frequency level becomes so dissimilar to their natural resonance frequency as to cease increasing the amplitude of oscillation of the set S of moving elements. The extent of variation of the frequency level corresponds to the natural resonance frequency range. Typically, at the end of the initiation sequence (step 872), the system clock $f_{CLK}$ is set to the predefined system frequency, typically being the average or median natural resonance frequency of the moving elements in the array, i.e. 44 KHz.

One method for determining the range of the natural resonance frequencies of the moving elements is to examine the array of moving elements using a vibrometer and excite the array at different frequencies.

Figure 8E:
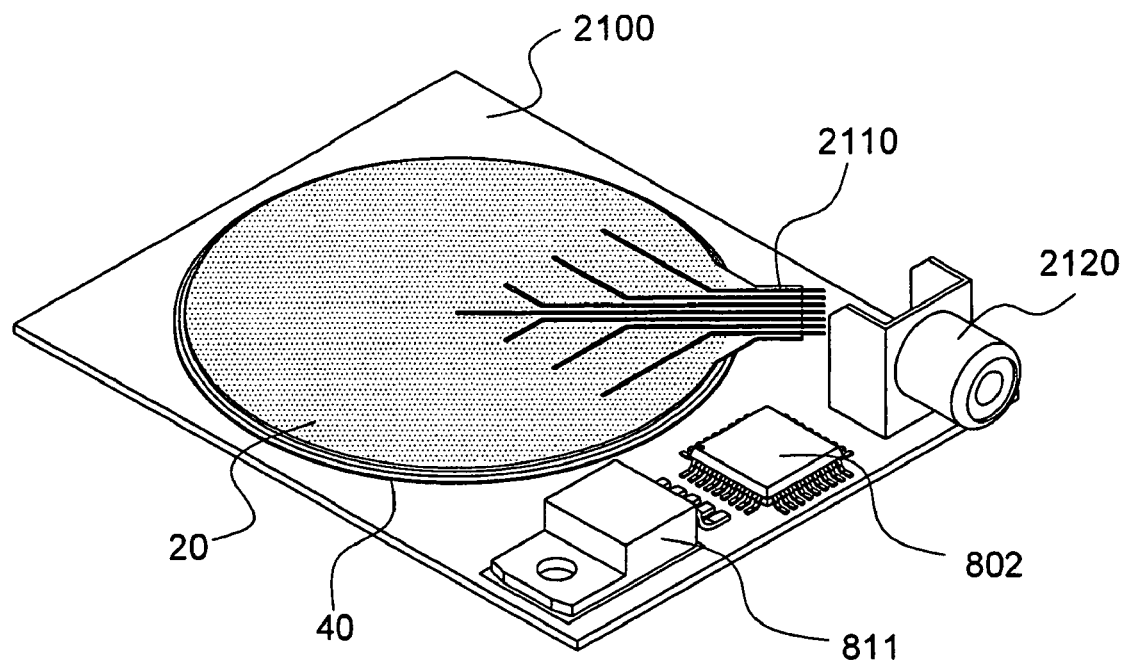
FIG. 8E is a simplified isometric view illustration of an assembled speaker system constructed and operative in accordance with a preferred embodiment of the present invention.

FIG. 8E is a simplified isometric view illustration of an assembled speaker system constructed and operative in accordance with a preferred embodiment of the present invention. Mounted on a PCB 2100 is the array of actuator elements including moving elements 10 (not shown) sandwiched between latching elements 20. The array is surrounded by coil 40. Control lines 2110 are shown over which the latch control signals generated by latch controller 50 (not shown) in processor 802 travel to the latch elements 20. Amplifier 811 amplifies signals provided by the magnetic field generation controller 30 (not shown) in processor 802 to the coil 40. A connector 2120 connects the apparatus of FIG. 8E to a digital sound source. For simplicity, conventional components such as power supply components are not shown.

Figure 8F:
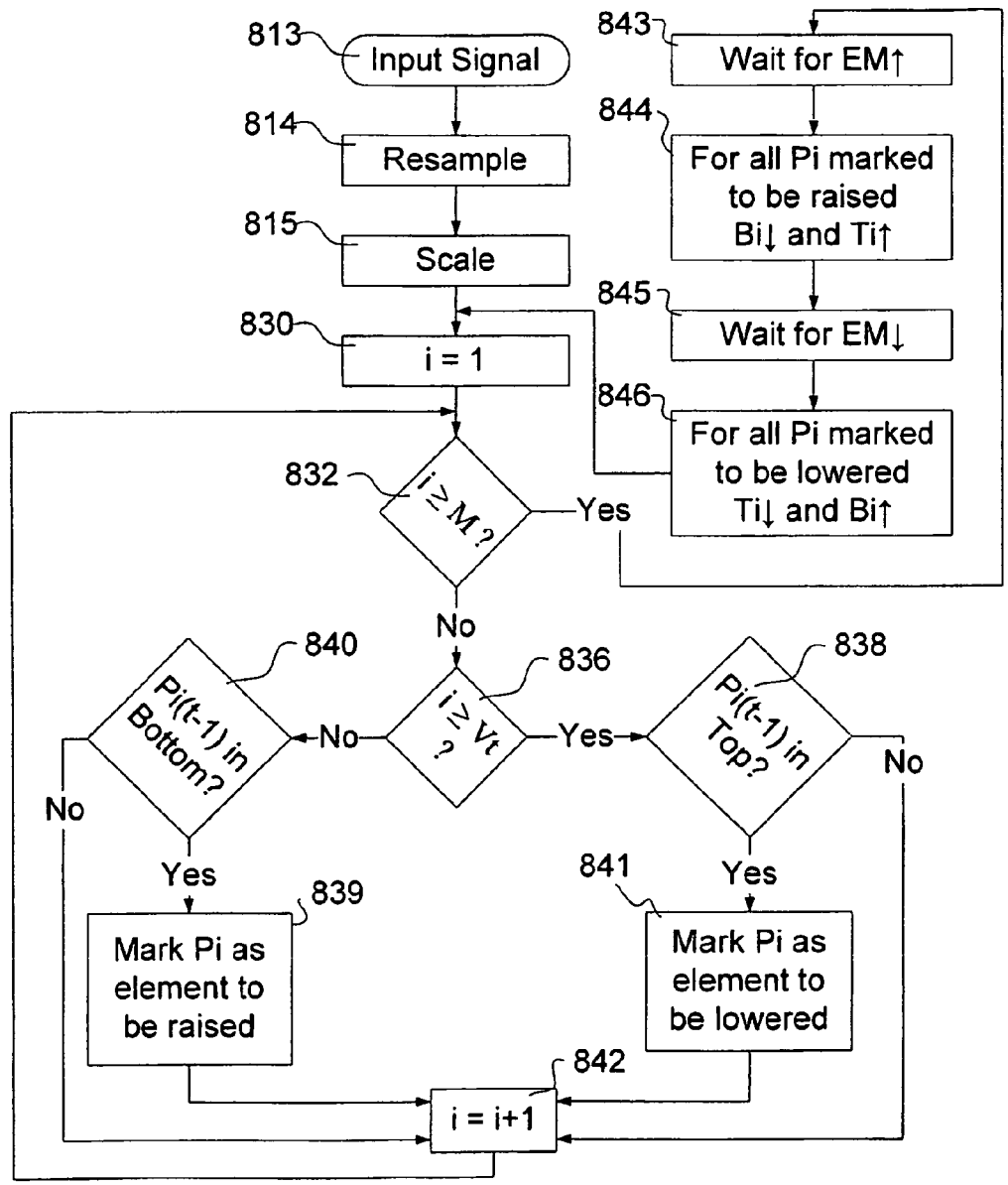
FIG. 8F is a simplified flowchart illustration of a preferred method of operation for generating a sound using apparatus constructed and operative in accordance with an embodiment of the present invention.

A preferred method of operation for generating a sound using apparatus constructed and operative in accordance with an embodiment of the present invention is now described based on FIG. 8F. The method of FIG. 8F is preferably based on the sound's representation in the time domain, typically a PCM (pulse-code modulation) representation.

Resampler 814 of FIG. 8F: Unless the sampling rate of the PCM happens to be the same as the system clock, the PCM is resampled to bring its sampling rate up to or down to the system clock frequency (top row in FIG. 11A) of the apparatus of FIG. 1A.

Generally, any suitable sampling rate may be employed. Specifically, the system of the present invention generates sound waves having at least two different frequencies, one of which is the desired frequency as determined by the input signal and the other of which is an artifact. The artifact frequency is the clock frequency i.e. the sampling rate of the system. Therefore, preferably, the system sampling rate is selected to be outside of the human hearing range i.e. at least 20 KHz. Nyquist sampling theory teaches that the system clock must be selected to be at least double that of the highest frequency the speaker is designed to produce.

Scaler 815: The PCM word length is typically 8, 16 or 24 bits. 8 bit PCM representations are unsigned, with amplitude values varying over time from 0 to 255, and 16 and 24 bit PCM representations are signed, with amplitude values varying over time from −32768 to 32767 and −8388608 to 8388607 respectively. The speaker of FIGS. 1-2C typically employs an unsigned PCM signal and therefore, if the PCM signal is signed e.g. if the PCM word length is 16 or 24 bits, a suitable bias is added to obtain a corresponding unsigned signal. If the PCM word length is 16 bits, a bias of 32768 amplitude units is added to obtain a new range of 0-65535 amplitude units. If the PCM word length is 24 bits, a bias of 8388608 amplitude units is added to obtain a new range of 0-16777215 amplitude units.

The PCM signal is then further re-scaled as necessary such that its range, in amplitude units, is equal to the number of speaker elements in the apparatus of FIGS. 1-2C. For example, if the number of speaker elements is 2047, and the PCM signal is an 8 bit signal, the signal is multiplied by a factor of 2048/256=8. Or, if the number of speaker elements is 2047, and the PCM signal is a 16 bit signal, the signal is multiplied by a factor of 2048/65536=1/32.

Sound is then generated to represent the re-scaled PCM signal by actuating a suitable number of speaker elements in accordance with the current value of the re-scaled PCM signal. It is appreciated that the speaker elements have two possible end-states, termed herein the "down" and "up" end-states respectively, and illustrated schematically in FIGS. 2A and 2B respectively. An individual one of these end-states is selected and the number of speaker elements in that end-state at any given time matches the current value of the re-scaled PCM signal, the remaining speaker elements at the same time being in the opposite end-state. For example, if there are 2047 speaker elements, the selected end-state is "up" and the value of the re-scaled PCM signal at time t is 100, the number of speaker elements in the "up" and "down" end states at time t are 100 and 1947 respectively. According to certain embodiments of the invention, there is no importance to the particular speaker elements selected to be in the "up" state as long as their total number corresponds to the current value of the re-scaled PCM signal.

The following loop is then performed M times each time a sample is generated by scaler 815. M is the number of actuator elements in the apparatus of FIG. 1A. i is the index of the current loop. $V_t$ is used to designate the current sample value exiting scaler 815 (for which M iterations of the loop are being performed). Generally, the number of moving elements to be latched into their top positions, is exactly equal to the value of $V_t$ and all remaining moving elements are to be latched into their bottom positions. Therefore, while i is still smaller than $V_t$, the i'th moving element or pixel, termed in FIG. 8F "Pi" is latched to its top position. This is done by checking (FIG. 8F, step 840) whether, when moving element i was processed in the previous loop (t−1), it was in its top latching position or in its bottom latching position. If the former was the case, nothing needs to be done and the method jumps to incrementation step 842. If the latter was the case, element i is marked as an element which needs to be latched into its top position (step 839). To latch all remaining moving elements into their bottom positions, do the following for all moving elements whose index exceeds $V_t$: check (step 838) which are already in their bottom positions; these moving elements need no further treatment. All others are marked (step 841) as elements which need to be latched into their bottom positions. Once all M elements have been marked or not marked as above, perform the following:

Verify that the magnetic field points upward, or wait for this (step 843), and, for the $V_1$ or less pixels which are to be raised, discharge the bottom latches and charge the top latches (step 844). Next, wait for the magnetic field to point downward (step 845), and, for the $(M-V_t)$ or less pixels which are to be lowered, discharge the top latches and charge the bottom latches (step 846). At this point, the flow waits for the next sample to be produced by scaler 815 and then begins the M iterations of the loop just described for that sample.

It is appreciated that steps preceding step 843 are preferably executed during the half clock cycle in which the magnetic field polarity is downwards. Step 844 is preferably executed at the moment the magnetic field changes its polarity from downwards to upwards. Similarly, step 846 is preferably executed at the moment the magnetic field changes polarity again from upwards to downwards. It is also appreciated that in order for the device to remain synchronized with the digitized input signal, steps 814-846 are all preferably executed in less than one clock cycle.

FIG. 9A is a graph summarizing the various forces brought to bear on moving elements 10 in accordance with a preferred embodiment of the present invention.

Figure 9B:
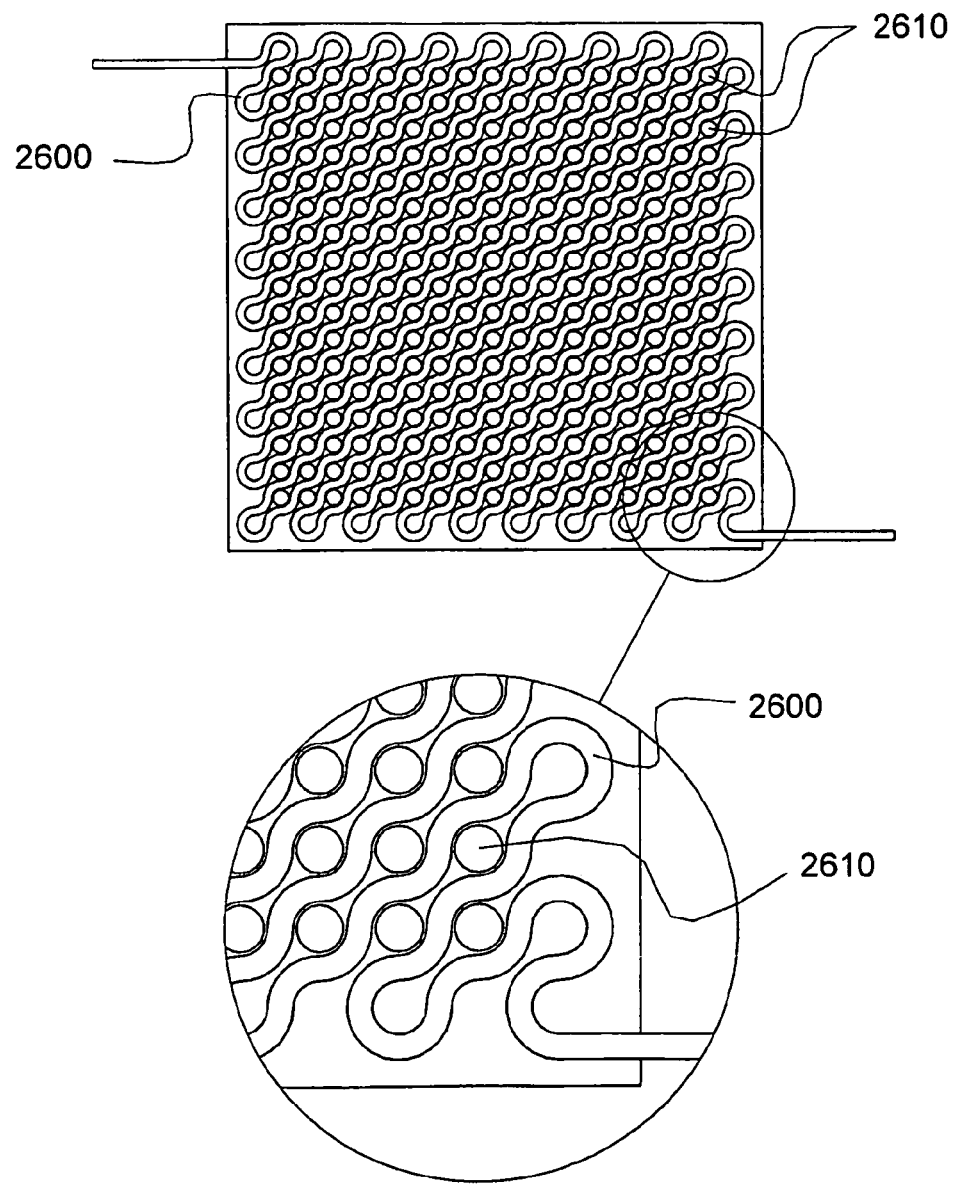
FIG. 9B is a simplified pictorial illustration of a magnetic field gradient inducing layer constructed and operative in accordance with a preferred embodiment of the present invention.

FIG. 9B is a simplified pictorial illustration of a magnetic field gradient inducing layer constructed and operative in accordance with a preferred embodiment of the present invention and comprising at least one winding conductive element 2600 embedded in a dielectric substrate 2605 and typically configured to wind between an array of channels 2610. Typically, there are no channels 2610 along the perimeter of the conductive layer of FIG. 9B so that the gradient induced within channels adjacent the perimeter is substantially the same as the gradient induced in channels adjacent the center of the conductive layer.

If the layer of FIG. 9B is separate from the spacer layers described above, then the channels in the layer of FIG. 9B are disposed opposite and as a continuation of the channels in the spacer layers described in detail above. The cross-sectional dimensions, e.g. diameters, of channels 2610 may be different than the diameters of the channels in the spacer layer. Alternatively, the layer of FIG. 9B may serve both as a spacer layer and as a magnetic field inducing layer in which case the channels 2610 of FIG. 9B are exactly the spacer layer channels described hereinabove. It is appreciated that, for simplicity, the electrodes forming part of the spacer layer are not shown in FIG. 9B.

Figure 9C:
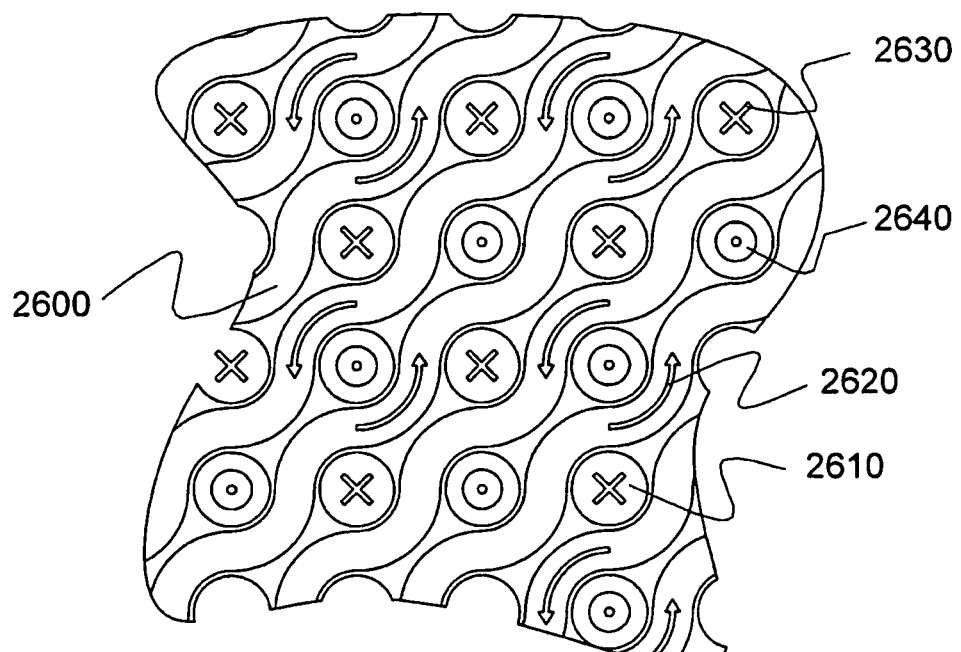
FIGS. 9C-9D illustrate the magnetic field gradient induction function of the conductive layer of FIG. 9B.
Figure 9D:
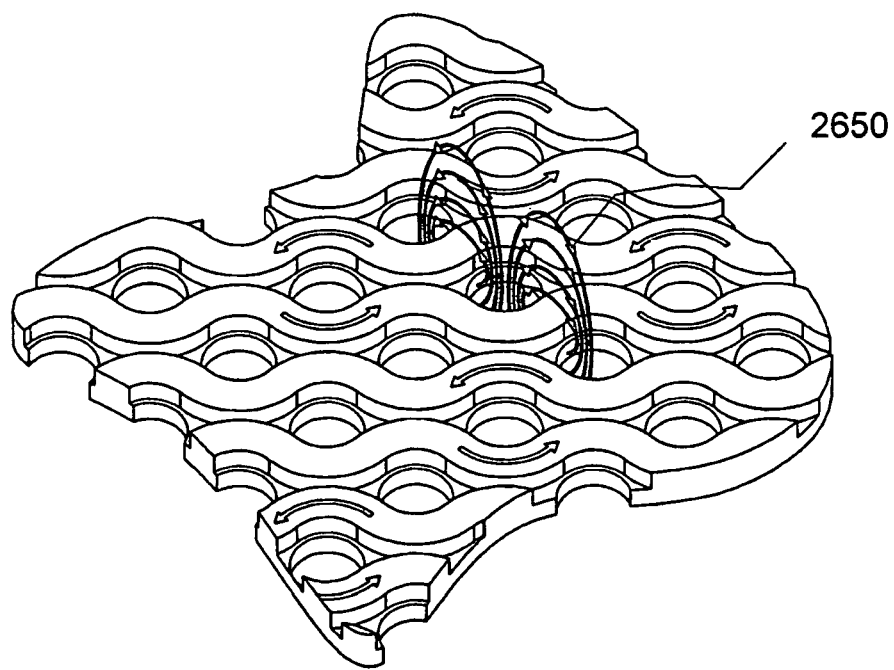

FIGS. 9C and 9D illustrate the magnetic field gradient induction function of the conductive layer of FIG. 9B. In FIG. 9C, the current flowing through the winding element 2600 is indicated by arrows 2620. The direction of the resulting magnetic field is indicated by X's 2630 and encircled dots 2640 in FIG. 9C, indicating locations at which the resulting magnetic field points into and out of the page, respectively.

FIG. 10A is a simplified top cross-sectional illustration of a latching layer included in latch 20 of FIG. 1A in accordance with a preferred embodiment of the present invention. The latching layer of FIG. 10A is suitable for latching moving elements partitioned into several groups G1, G2, . . . whose latches are electrically interconnected as shown so as to allow collective actuation of the latches. This embodiment is typically characterized in that any number of moving elements may be actuated by collectively charging the latches of selected groups from among the partitioned groups, each latch in the latching layer typically being associated with a permanent magnet, wherein the poles of all of the permanent magnets in the latching layer are all identically disposed.

Each group Gk may comprise 2 to the power of (k−1) moving elements. The groups of moving elements may spiral out from the center of the array of moving elements, smallest groups being closest to the center as shown.

Figure 10B:
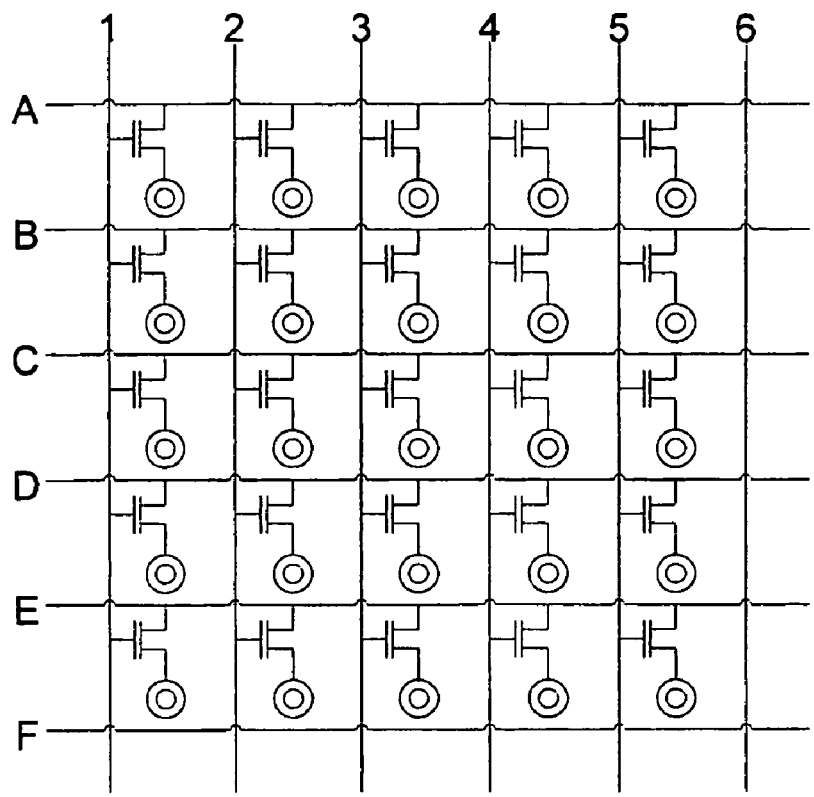
FIG. 10B is a simplified electronic diagram of an alternative embodiment of the latch layer of FIGS. 1-10A in which each latch is individually controlled by the latching controller 50 of FIG. 8C. It is appreciated that the latches are shown to be annular however alternatively may have any other suitable configuration as described herein. The layer of FIG. 10B comprises a grid of vertical and horizontal wires defining junctions. A gate such as a field-effect transistor is typically provided at each junction. To open an individual gate thereby to charge the corresponding latch, voltage is provided along the corresponding vertical and horizontal wires.

FIG. 10B is a simplified electronic diagram of an alternative embodiment of the latching layer of FIG. 10A in which each latch is individually rather than collectively controlled (i.e. charged) by the latching controller 50 of FIG. 1A. It is appreciated that the latches are shown to be annular, however alternatively they may have any other suitable configuration e.g. as described herein. The layer of FIG. 110B comprises a grid of vertical and horizontal wires defining junctions. A gate such as a bi-polar field-effect transistor is typically provided at each junction. To open an individual gate thereby to charge the corresponding latch, suitable voltages are provided along the corresponding vertical and horizontal wires.

Figure 11B:
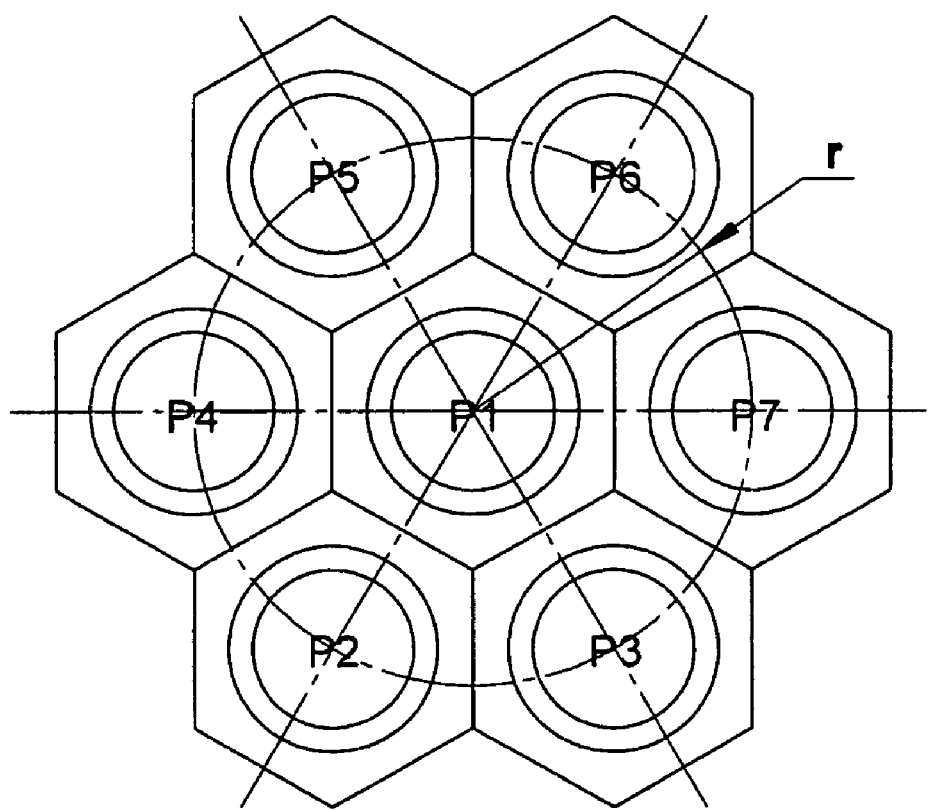
FIG. 11B is a schematic illustration of an example array of moving elements to which the timing diagram of FIG. 11A pertains.

FIG. 1A is a timing diagram showing a preferred charging control scheme which may be used by the latch controller 50 in FIG. 1A in uni-directional speaker applications wherein an input signal representing a desired sound is received, and moving elements 10 constructed and operative in accordance with a preferred embodiment of the present invention are controlled responsively, by appropriate charging of their respective latches, so as to obtain a sound pattern in which the volume in front of the speaker is greater than in other areas, each latch in the latching layer being associated with a permanent magnet, and the poles of all of the permanent magnets in the latching layer all being identically disposed. FIG. 11B is a schematic illustration of an example array of moving elements 10 to which the timing diagram of FIG. 11A pertains.

A preferred mode of operation of the latch controller 50 is now described with reference to FIGS. 11A-B. For clarity, the preferred mode of operation is described merely by way of example with reference to a speaker comprising 7 pixels numbered P1, P2, . . . P7 as shown in FIG. 11B. Further according to the example used to explain the preferred mode of operation of latch controller 50, the 7 pixels are actuated in three groups comprising 1, 2 and 4 pixels respectively. Generally, the latch controller 50 uses various decision parameters, as described in detail herein, to determine how to control each individual moving element in each time interval. Speakers constructed and operative in accordance with a preferred embodiment of the present invention are typically operative to reproduce a sound which is represented by the analog signal of Graph II and is then digitized and supplied to a speaker of the present invention. The values of the digital signal are shown in FIG. 11A, graph III.

Graph IV shows the alternation of the electromagnetic force applied to the moving elements 10 by the coil or other magnetic field generator 40. Graph V is the signal provided by latching controller 50 to the top latch of an individual moving element, P1 seen in FIG. 1 IB, forming, on its own, a first group G1 of moving elements consisting only of P1. Graph VI is the signal provided by latching controller 50 to the bottom latch of P1. The states of P1, due to the operation of the latches associated therewith, are shown in Graph VII, in which black indicates the top extreme position in which the top latch engages P1, white indicates the bottom extreme position in which the bottom latch engages P1, and hatching indicates intermediate positions.

Graph VIII is the signal provided by latching controller 50 to the top latch/es of each of, or both of, moving elements P2 and P3 seen in FIG. 1 IB, which together form a second group GII of moving elements. Graph IX is the signal provided by latching controller 50 to the bottom latch/es of GII. The states of P2 and P3, due to the operation of the latches associated therewith, are shown in Graphs X and XI respectively, in which black indicates the top extreme position in which the top latch engages the relevant moving element, white indicates the bottom extreme position in which the bottom latch engages the relevant moving element, and hatching indicates intermediate positions of the relevant moving element.

Graph XII is the signal provided by latching controller 50 to the top latch/es of each of, or all of, moving elements P4-P7 seen in FIG. 11B, which together form a third group GIII of moving elements. Graph XIII is the signal provided by latching controller 50 to the bottom latch/es of GIII. The states of P4-P7, due to the operation of the latches associated therewith, are shown in Graphs XIV-XVII respectively, in which black indicates the top extreme position in which the top latch engages the relevant moving element, white indicates the bottom extreme position in which the bottom latch engages the relevant moving element, and hatching indicates intermediate positions of the relevant moving element.

Graph XVIII schematically illustrates the moving elements P1-P7 of FIG. 1 IB in their various positions, as a function of time.

For example, in interval I5, the clock is high (graph I), the digitized sample value is 2 (graph III), which indicates that 5 elements need to be in their top positions and 2 elements in their bottom positions as shown in interval I5 of Graph XVIII. Since latch actuation in this embodiment is collective, this is achieved by selecting groups G1 and G3 which together have 5 elements (1+4) to be in their top positions whereas the two moving elements in G2 will be in their bottom positions. The magnetic field points upward in interval I5 as shown in Graph IV. In interval I4, the moving element in G1 was in its bottom position as shown in Graph XVIII and therefore needs to be raised. To do so, control signal B1 is lowered (graph VI) and control signal T1 is raised (graph V). As a result, the moving element of G1 assumes its top position as shown in graph VII. In interval I4, the moving elements in G2 are already in their bottom positions as shown in Graph XVIII and therefore the top control signal T2 remains low as seen in graph VIII, the bottom control signal B2 remains high as seen in graph TX and consequently, as shown in Graphs X and XI respectively, the two moving elements (P2 and P3) in G2, remain in their bottom extreme positions. As for group G3, in interval I4, the moving elements in G3 are already in their top positions as shown in Graph XVIII and therefore the top control signal T3 remains high as seen in graph XII, the bottom control signal B3 remains low as seen in graph XIII and consequently, as shown in Graphs XIV-XVII respectively, the four moving elements (P4-P7) in G3, remain in their top extreme positions.

Preferably, when the input signal in graph II is at a positive local maximum, all moving elements are in their top position. When the input signal is at a negative local maximum, all moving elements are in their bottom position.

Figure 11C:
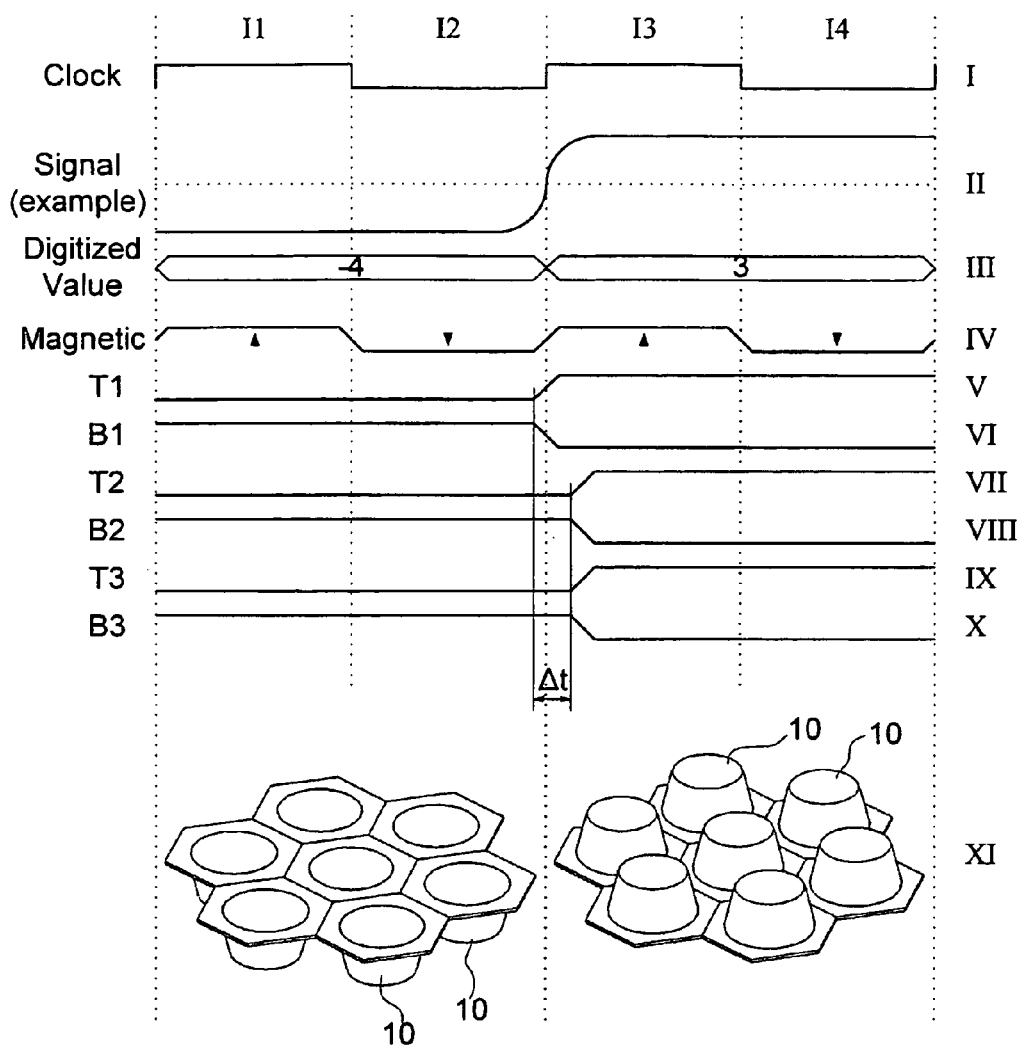
FIG. 11C is a timing diagram showing a preferred control scheme used by the latch controller in omni-directional speaker applications wherein an input signal representing a desired sound is received, and moving elements constructed and operative in accordance with a preferred embodiment of the present invention are controlled responsively, so as to obtain a sound pattern in which the volume in front of the speaker is similar to the volume in all other areas surrounding the speaker.

FIG. 11C is a timing diagram showing a preferred control scheme used by the latch controller 50 in omni-directional speaker applications wherein an input signal representing a desired sound is received, and moving elements constructed and operative in accordance with a preferred embodiment of the present invention are controlled responsively, so as to obtain a sound pattern in which the loudness of the sound in an area located at a certain distance in front of the speaker is similar to the loudness in all other areas surrounding the speaker at the same distance from the speaker.

As shown, the step of selectively latching comprises latching specific moving elements at a time determined by the distance of the specific moving elements from the center of the array (e.g. as indicated by r in the circular array of FIG. 11B). Typically, when it is desired to latch a particular subset of moving elements, typically corresponding in number to the intensity of a desired sound, the moving elements are latched not simultaneously but rather sequentially, wherein moving elements closest to the center are latched first, followed by those moving elements disposed, typically in layers, concentrically outward from the center. Typically, the moving elements in each layer are actuated simultaneously. Typically, the temporal distance $\Delta t$ between the moment at which a particular moving element is latched and between the moment at which the first, central, moving element or elements was or were latched is r/c where c is the speed of sound.

It is appreciated that the moving elements in graph X of FIG. 11C are shown to comprise flexible peripheral portions, however this is merely by way of example and is not intended to be limiting.

Figure 12B:
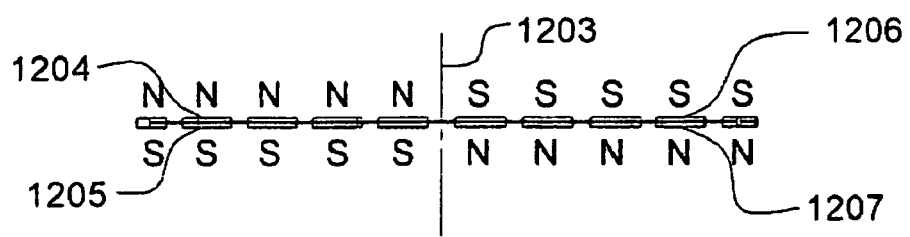

FIGS. 12A and 12B are respectively simplified top view and cross-sectional view illustrations of the moving element layer in accordance with a preferred embodiment of the present invention in which half of the permanent magnets are placed north pole upward and half north pole downward. A particular advantage of this embodiment is that moving elements can be raised both when the electromagnetic field points upward and when it points downward rather than waiting for the field to point upward before lifting a moving element and waiting for the field to point downward before lowering a moving element. Although the illustrated embodiment shows the two subsets separated from one another, this not need be the case. The two subsets may be interleaved with one another.

FIG. 13 is a simplified top view illustration similar to FIG. 10A except that half of the permanent magnets in the latching layer are disposed north pole upward and the remaining half of the permanent magnets in the latching layer are disposed north pole downward. Whereas in the embodiment of FIG. 10A, there was one group each of size 1, 2, 4, . . . (which may be arranged sequentially around the center as shown in FIG. 10A although this need not be the case) in the embodiment of FIG. 13, there are two groups of each size, thereby generating two sequences of groups of size 1, 2, 4, . . . In the illustrated embodiment the groups in the first sequence are termed G1L, G2L, G3L, . . . and the groups in the first sequence are termed G1R, G2R, G3R, . . . Each of these sequences is arranged within one semicircle, such as the left and right semicircles as shown. The arrangement of the groups within its semicircle need not be in order of size of the group extending concentrically outward as shown and can be any desired arrangement, however, preferably, both groups are arranged mutually symmetrically within their individual semicircle. It is appreciated that by using suitable coil designs, the same effect can be achieved using permanent magnets that are all polarized in the same direction while the coil generates magnetic fields having a certain polarization across half of the moving elements and having an opposite polarization across the other half.

A particular feature of the embodiments of FIGS. 10A and 13 is that latch elements corresponding to certain moving elements are electrically interconnected thereby to form groups of moving elements which can be collectively latched or released by collectively charging or discharging, respectively, their electrically interconnected latches.

FIG. 14 is a control diagram illustrating control of the latches and of the coil-induced electromagnetic force for a particular example in which the moving elements are arranged in groups that can each, selectively, be actuated collectively, similar to FIG. 8A except that half of the permanent magnets in the latching layer are disposed north pole upward and the remaining half of the permanent magnets in the latching layer are disposed north pole downward as shown in FIG. 13, whereas in FIG. 8A, the poles of all of the permanent magnets in the latching layer are all identically disposed. As shown in FIG. 14, latching signals are provided to all of groups G1L, G2L, G3L, . . . and G1R, G2R, G3R. The top latching signals for these groups are indicated as LT1, LT2, LT3, . . . and RT1, RT2, RT3 respectively. The bottom latching signals for these groups are indicated as LB1, LB2, LB3, . . . and RB1, RB2, RB3.

FIG. 15A is a timing diagram showing a preferred control scheme used by the latch controller 50 in unidirectional speaker applications, which is similar to the timing diagram of FIG. 11A except that half of the permanent magnets in the latching layer are disposed north pole upward and the remaining half of the permanent magnets in the latching layer are disposed north pole downward as shown in FIG. 13 whereas in FIG. 11A the poles of all of the permanent magnets in the latching layer are all identically disposed. FIG. 15B is a schematic illustration of an example array of moving elements to which the timing diagram of FIG. 15A pertains.

As described above, a particular advantage of the embodiment of FIGS. 13-15A as opposed to the embodiment of FIGS. 8A, 10A and 11A is that moving elements can be raised both when the electromagnetic field points upward and when it points downward rather than waiting for the field to point upward before lifting a moving element and waiting for the field to point downward before lowering a moving element. It is appreciated that no elements move in 50% of the time slots in FIG. 11A which may introduce distortion of sound and is relatively inefficient. In contrast, elements move in 100% of the time slots in FIG. 15A (other than slots in which no motion is required since the digital signal value is unchanged) thereby preventing distortion and enhancing efficiency.

For example, in interval I5, the digitized signal value changes from 1 to 2 as shown in graph II of FIGS. 11A and 15A. Consequently, moving element P1 in FIG. 11A needs to be raised i.e. released from its current, bottom extreme position and latched into its top extreme position, however whereas in I5, control signal B1 is lowered and control signal T1 is raised, in interval I6 nothing happens. In FIG. 15A, in contrast, where moving elements LP1 (and RP1) need to be raised, control signal LB1 is lowered and control signal LT1 is raised in interval I5, and immediately afterward, in interval I6, the RB1 control signal is lowered and the RT1 signal is raised, resulting in upward motion of RP1 without the delay incurred in FIG. 11A.

Generally in the embodiment of FIGS. 13-15A, since half of the magnets (say, the left half) point north up and the remaining (right) half point north down, when it is desired to move elements 10 upward, this can always be done without delay. If the magnetic field points up, the moving elements in the left half of the array can be moved upward before those in the right half, whereas if by chance the magnetic field is found to be pointing down, the moving elements in the right half of the array can be moved upward before those in the left half.

FIG. 15C is a graph showing changes in the number of moving elements disposed in top and bottom extreme positions at different times and as a function of the frequency of the input signal received by the latching controller 50 of FIG. 1A.

FIG. 16A is an isometric view illustration of a moving element layer which is an alternative to the moving element layer shown in FIGS. 1A and 2A-2C in which the layer is formed from a thin foil such that each moving element comprises a central portion and surrounding portions.

FIG. 16B is an isometric view illustration of still another alternative to the moving element layer shown in FIGS. 1A and 2A-2C in which the flexure structure at the periphery of each moving element comprises a sheet of flexible material e.g. rubber. The central area of each moving element comprises a magnet which may or may not be mounted on a rigid disc.

Figure 16C:
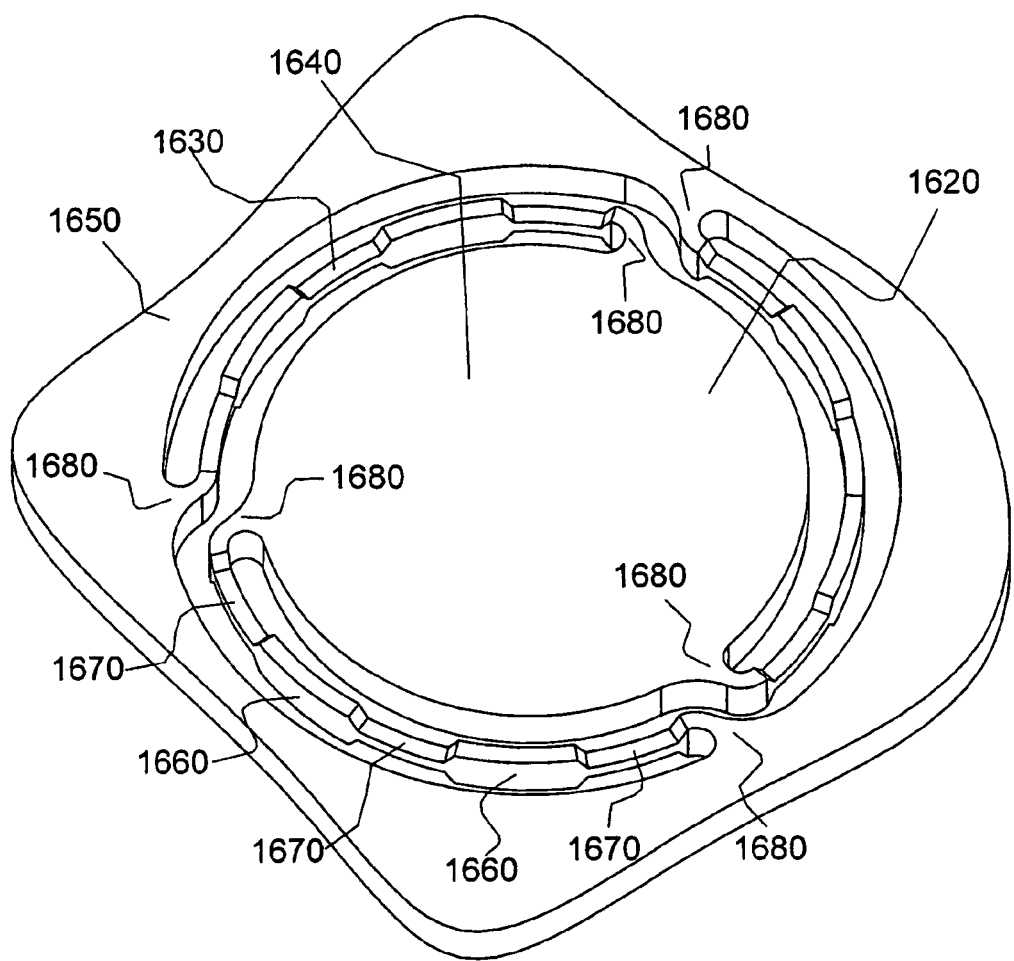
FIG. 16C is an isometric view of a preferred embodiment of the moving elements and surrounding flexures depicted in FIGS. 7A-7E or 16A in which flexures vary in thickness.

FIG. 16C is an isometric view of a preferred embodiment of the moving elements and surrounding flexures depicted in FIGS. 7A-7E or 16A in which flexures vary in thickness. In FIG. 16C, for simplicity, the component which causes the moving element 1620 to be affected by the magnetic field, which component may preferably comprise a magnet or alternatively, a ferro-magnet, conductive material or coil, is not shown. As shown, the moving element 1620 comprises serpentine peripheral flexures 1630 having portions of varying thicknesses connecting a central portion 1640 of the moving element to a sheet 1650 interconnecting all or many moving elements. For example, the portions of varying thicknesses may include thicker portions 1660 and thinner portions 1670 respectively as shown. For example, if the diameter of the central portion 1640 of each moving element is 300 microns and the sheet is silicon, then under certain conditions, portions 1670 may be 50 microns thick whereas portions 1660 may be 100 microns thick. More generally, thicknesses are computed as a function of materials to provide application-specific flexibility and strength levels, e.g. using FEA (finite element analysis) tools.

Figure 16D:
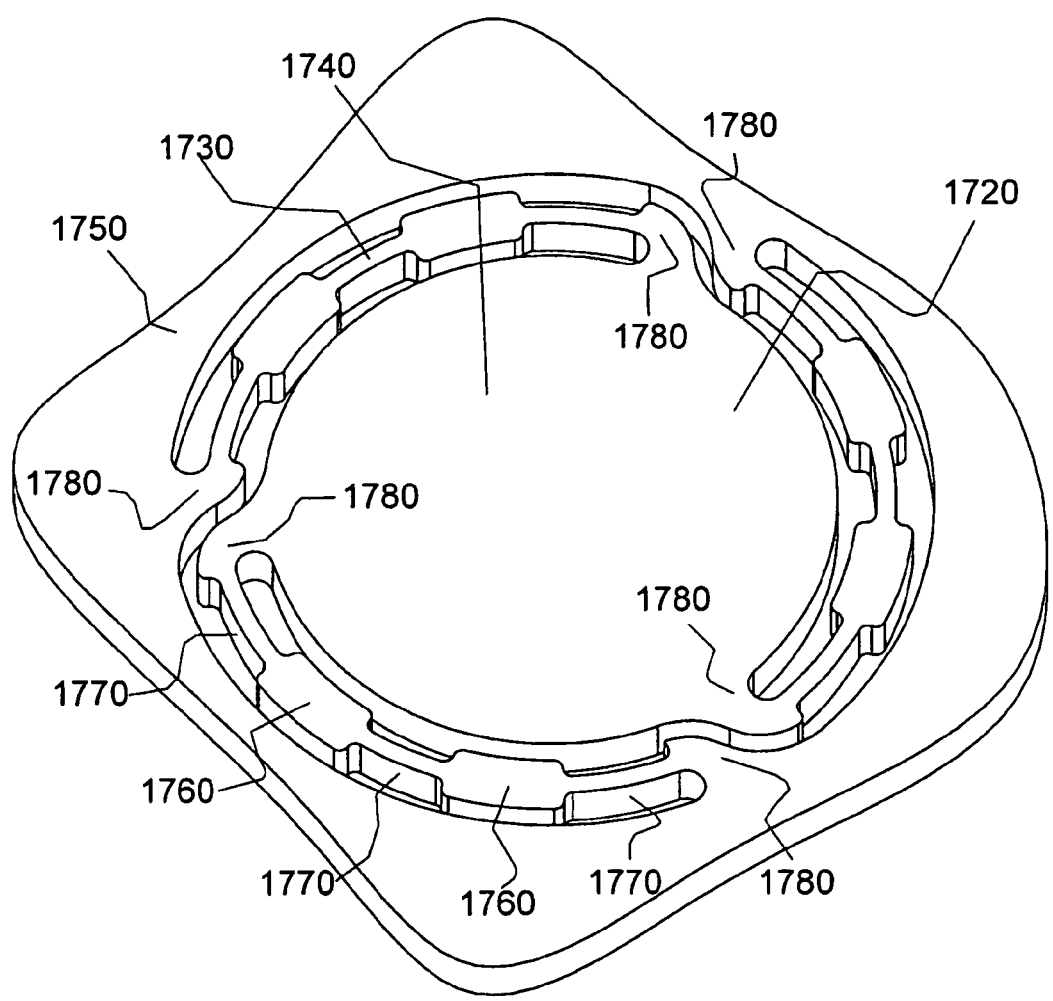
FIG. 16D is an isometric illustration of a cost effective alternative to the apparatus of FIG. 16C in which flexures vary in width.

FIG. 16D is an isometric illustration of a cost effective alternative to the apparatus of FIG. 16C in which flexures vary in width. As in FIG. 16C, for simplicity, the component which causes the moving element 1720 to be affected by the magnetic field, which component may preferably comprise a magnet or alternatively, a ferro-magnet, conductive material or coil, is not shown. As shown, the moving element 1720 comprises serpentine peripheral flexures 1730 having portions of varying widths connecting a central portion 1740 of the moving element to a sheet 1750 interconnecting all or many moving elements. For example, the portions of varying widths may include wider portions 1760 and narrower portions 1770 respectively as shown. For example, if the diameter of the central portion 1740 of each moving element is 300 microns and the sheet is silicon, then under certain conditions, portions 1770 may be 20 microns wide whereas portions 1760 may be 60 microns wide. More generally, widths are computed as a function of materials to provide application-specific flexibility and strength levels, e.g. using FEA (finite element analysis) tools.

It is appreciated that the embodiments of FIGS. 16C and 16D may be suitably combined, e.g. to provide flexures with varying thicknesses and varying widths, and/or varied, e.g. to provide flexures whose widths and/or thicknesses vary either continuously or discontinuously as shown, and either regularly as shown or irregularly.

In the above description, "thickness" is the dimension of the flexure in the direction of motion of the moving element whereas "width" is the dimension of the flexure in the direction perpendicular to the direction of motion of the moving element.

A particular advantage of the embodiments of FIGS. 16C and 16D is that in flexures of varying cross-sections, e.g. varying thicknesses or widths, the stress is not concentrated at the roots 1680 or 1780 of the flexures and is instead distributed over all the thin and/or narrow portions of the flexures. Also, generally, the stress on the flexures as a result of bending thereof is a steep function of the thickness, typically a cubic function thereof, and is also a function of the width, typically a linear function thereof. It is believed to be impractical, at least for certain materials such as silicon and at least for certain applications employing large displacement of the moving elements, e.g. public address speakers, to select flexure dimensions which are uniformly thin enough or narrow enough to provide sufficiently low stress so as to prevent breaking, and simultaneously stiff enough to allow natural resonance frequency at a desirable range e.g. 44 KHz. For this reason as well, it is believed to be advantageous to use flexures of varying thicknesses and/or widths e.g. as illustrated in FIGS. 16C-16D.

FIG. 17 is a top cross-sectional view illustration of an array of actuator elements similar to the array of FIG. 3A except that whereas in FIG. 3A, consecutive rows of individual moving elements or latches are respectively skewed so as to increase the number of actuator elements that can be packed into a given area, the rows in FIG. 17 are unskewed and typically comprise a rectangular array in which rows are mutually aligned.

FIG. 18 is an exploded view of an alternative embodiment of an array of actuator elements, including a layer 1810 of moving elements sandwiched between a top latching layer 1820 and a bottom latching layer 1830. The apparatus of FIG. 18 is characterized in that the cross-section of each actuator element is square rather than round. Each actuator element could also have any other cross-sectional shape such as a hexagon or triangle.

FIG. 19 is an isometric array of actuators supported within a support frame providing an active area which is the sum of the active areas of the individual actuator arrays. In other words, in FIG. 19, instead of a single one actuating device, a plurality of actuating devices is provided. The devices need not be identical and can each have different characteristics such as but not limited to different clock frequencies, different actuator element sizes and different displacements. The devices may or may not share components such as but not limited to coils 40 and/or magnetic field controllers 30 and/or latch controller 50.

The term "active area" refers to the sun of cross-sectional areas of all actuator elements in each array. It is appreciated that generally, the range of sound volume (or, for a general actuator other than a speaker, the gain) which can be produced by a speaker constructed and operative in accordance with a preferred embodiment of the present invention is often limited by the active area. Furthermore, the resolution of sound volume which can be produced is proportional to the number of actuator elements provided, which again is often limited by the active area Typically, there is a practical limit to the size of each actuator array e.g. if each actuator array resides on a wafer.

If the speaker is to serve as a headphone, only a relatively small range of sound volume need be provided. Home speakers typically require an intermediate sound volume range whereas public address speakers typically have a large sound volume range, e.g. their maximal volume may be 120 dB. Speaker applications also differ in the amount of physical space available for the speaker. Finally, the resolution of sound volume for a particular application is determined by the desired sound quality. e.g. cellphones typically do not require high sound quality, however space is limited.

According to certain embodiments of the present invention, layers of magnets on the moving elements may be magnetized so as to be polarized in directions other than the direction of movement of the element to achieve a maximum force along the electromagnetic field gradient aligned with the desired element moving direction.

Referring again to FIGS. 12A-15B inter alia, it is appreciated that if the coil used is of a design that utilizes conductors carrying current on both sides of the elements, and the magnets are all polarized in the same direction, then the elements on one side of each conductor would move in opposite directions when current flows in the coil.

A particular feature of a preferred embodiment of the present invention is that the stroke of motion performed by the moving elements is relatively long because the field applied thereto is magnetic hence decays at a rate which is inversely proportional to the distance between the moving elements and the current producing the magnetic field. In contrast, an electrostatic field decays at a rate which is inversely proportional to the square of the distance between the moving elements and the electric charge producing the electrostatic field. As a result of the long stroke achieved by the moving elements, the velocity achieved thereby is increased hence the loudness that can be achieved increases because the air pressure generated by the high velocity motion of the moving elements is increased.

It is appreciated that the embodiments specifically illustrated herein are not intended to be limiting e.g. in the sense that the moving elements need not all be the same size, the groups of moving elements, or individual moving elements if actuated individually, need not operate at the same resonance nor with the same clock, and the moving elements need not have the same amplitude of displacement.

The speaker devices shown and described herein are typically operative to generate a sound whose intensity corresponds to intensity values coded into an input digital signal. Any suitable protocol may be employed to generate the input digital signal such as but not limited to PCM or PWM (SACD) protocols. Alternatively or in addition the device may support compressed digital protocols such as ADPCM, MP3, AAC, or AC3 in which case a decoder typically coverts the compressed signal into an uncompressed form such as PCM.

Design of digital loudspeakers in accordance with any of the embodiments shown and described herein may be facilitated by application-specific computer modeling and simulations. Loudness computations may be performed conventionally, e.g. using fluid dynamic finite-element computer modeling and empiric experimentation.

Generally, as more speaker elements (moving elements) are provided, the dynamic range (difference between the loudest and softest volumes that can be produced) becomes wider, the distortion (the less the sound resembles the input signal) becomes smaller and the frequency range becomes wider. On the other hand, if less speaker elements are provided, the apparatus is smaller and less costly.

Generally, if the moving elements have large diameters, the ratio between active and inactive areas (the fill factor) improves, and there is less stress on the flexures if any, assuming that the vibration displacement remains the same, which translates into longer life expectancy for the equipment. On the other hand, if the moving elements have small diameters, more elements are provided per unit area, and due to the lesser mass, less current is required in the coil or other electromagnetic force generator, translating into lower power requirements.

Generally, if the vibration displacement of the moving elements is large, more volume is produced by an array of a given size, whereas if the same quantity is small, there is less stress on the flexures, if any, and the power requirements are lower.

Generally, if the sample rate is high, the highest producible frequency is high and the audible noise is reduced. On the other hand, if the sample rate is low, accelerations, forces, stress on flexures if any and power requirements are lower.

Three examples of application-specific speakers are now described.

EXAMPLE 1

It may be desired to manufacture a mobile phone speaker which is very small, is low cost, is loud enough to be heard ringing in the next room, but has only modest sound quality. The desired small size and cost suggest a speaker with relatively small area, such as up to 300 mm². If a relatively high target maximal loudness such as 90 dB SPL is desired, this suggests large displacement. Acceptable distortion levels (10%) and dynamic range (60 dB) in mobile phone speakers dictate a minimal array size of 1000 elements (computed using: $M=10^{(60/20)}$). Therefore, a suitable speaker may comprise 1023 moving elements partitioned into 10 binary groups, each occupying an area of about 0.3 mm². The cell size would therefore be about 550 μm×550 μm.

For practical reasons, the largest moving element that fits this space may have a diameter of 450 μm. Reasonable displacement for such a moving element may be about 100 μm PTP (peak to peak) which enables the target loudness to be achieved. The sample rate may be low, e.g. 32 KHz, since mobile phones sound is limited by the cellular channel to 4 KHz.

EXAMPLE 2

It may be desired to manufacture high fidelity headphones having very high sound quality (highest possible) and very low noise, and which are additionally small enough to be worn comfortably, and finally, cost-effective to the extent possible.

To achieve high sound quality, wide dynamic range (at least 96 dB), wide frequency range (20 Hz-20 KHz) and very low distortion (<0.1%) may be used. The minimal number of elements may be, given these assumptions, 63000. So, for example, the speaker may have 65535 elements divided into 16 binary groups. Maximal loudness can be kept low (80 dB) so as to allow displacements of about 30 μm PTP. The smallest moving element capable of such displacements is about 150 μm in diameter. Such an element may occupy a cell of 200 μm×200 μm or 0.04 mm² such that 65535 elements fit into an area of 2621 mm² e.g. 52 mm×52 mm. The sample rate is typically at least twice the highest frequency the speaker is meant to produce, or 40 KHz. The closest standard sample rate is 44.1 KHz.

EXAMPLE 3

It may be desired to manufacture a public address speaker, e.g. for a dance club, which is very loud, has a wide frequency range, extends to very low frequencies, and has low distortion. Therefore, PA speakers typically have many large moving elements. 600 μm moving elements may be used, which are capable of displacements of 150 μm PTP. Such elements occupy cells of 750 μm×750 μm or 0.5625 mm². Due to the low frequency requirement, a minimum of 262143 moving elements, partitioned into 18 binary groups, may be used. The size of the speaker may be about 40 cm×40 cm. This speaker typically reaches maximal loudness levels of 120 dB SPL and extends down to 15 Hz.

It is appreciated that the electromagnetic field controller 30 is preferably designed to ensure that the alternating current flowing through the coil maintains appropriate magnetic field strength at all times and under all conditions so as to allow sufficient proximity between the moving elements 10 and the electrostatic latches 20 to enable latching, while preventing the moving elements 10 from moving too fast and damaging themselves or the latches 20 as a result of impact.

With specific reference to the Figures, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a to fundamental understanding of the invention. The description taken with the drawings makes apparent to those skilled in the art how the several forms of the invention may be embodied in practice.

Features of the present invention which are described in the context of separate embodiments may also be provided in combination in a single embodiment. Conversely, features of the invention which are described for brevity in the context of a single embodiment may be provided separately or in any suitable subcombination. For example, moving elements may be free floating, or may be mounted on filament-like flexures or may have a surrounding portion formed of a flexible material. Independently of this, the apparatus may or may not be configured to reduce air leakage therethrough as described above. Independently of all this, the moving element may for example comprise a conductor, coil, ring- or disc-shaped permanent magnet, or ring- or disc-shaped ferromagnet and the magnets, if provided, may or may not be arranged such that the poles of some e.g. 50% thereof are oppositely disposed to the poles of the remaining e.g. 50% of the magnets. Independently of all this, the latch shape may, in cross-section, be solid, annular, perforated with or without a large central portion, or notched or have any other suitable configuration. Independently of all this, control of latches may be individual or by groups or any combination thereof. Independently of all this, there may be one or more arrays of actuator elements which each may or may not be skewed and the cross-section of each actuator element may be circular, square, triangular, hexagonal or any other suitable shape.

The present invention has been described with a certain degree of particularity, but those versed in the art will readily appreciate that various alterations and modifications may be carried out to include the scope of the following Claims:

The invention claimed is:

1. Actuator apparatus for generating a physical effect, at least one attribute of which corresponds to at least one characteristic of a digital input signal sampled periodically in accordance with a clock, the apparatus comprising at least one actuator device, each actuating device including:

a plurality of moving elements, wherein each individual moving element is responsive to alternating magnetic fields and is constrained to travel alternately back and forth along a respective axis responsive to an electromagnetic force operative upon said individual moving element when in the presence of an alternating magnetic field, wherein a magnetic field control system operative to control application of said electromagnetic force to said plurality of moving elements;

at least one latch operative to selectively latch at least one subset of said moving elements in at least one latching position thereby to prevent said subset of moving elements from responding to said electromagnetic force;

a latch controller operative to receive said digital input signal and to control said at least one latch accordingly, wherein at least one magnetic field control system and the latch controller is operative to define at least one attribute of the physical effect to correspond to at least one characteristic of the digital input signal; and a magnetic field control system operative to control application of said electromagnetic force to said plurality of moving elements, wherein at least one of the magnetic field control system and the latch controller is operative to define at least one attribute of the physical effect to correspond to at least one characteristic of the digital input signal.

2. Apparatus according to claim 1, herein said plurality of moving elements is disposed within a fluid medium.

3. Apparatus according to claim 2, wherein the physical effect comprises a sound having at least one wavelength thereby to define a shortest wavelength present in the sound and wherein each said moving element defines a cross section which is perpendicular to its axis of movement and which defines a largest dimension thereof and wherein the largest dimension of each said cross-section is small relative to said shortest wavelength.

4. Apparatus according to claim 1, wherein said at least one latch comprises an electrostatic latch.

5. Apparatus according to claim 1, wherein said at least one latch comprises at least one electrode and at least one space maintainer disposed between said plurality of moving elements and said at least one electrode.

6. Apparatus according to claim 5, wherein at least one space maintainer is formed of an insulating material.

7. Apparatus according to claim 1, wherein said at least one latch comprises two latches for each moving element operative to latch said moving element in two latching positions respectively.

8. Apparatus according to claim 1, wherein at least one of said moving elements comprises a permanent magnet.

9. Apparatus according to claim 1, wherein at least one of said moving elements comprises a conductor.

10. Apparatus according to claim 1, wherein at least one of said moving elements is formed of a ferro magnetic material.

11. Apparatus according to claim 1, wherein said latch controller, in at least one mode of latch control operation, is operative to set the number of moving elements which oscillate freely responsive to the electromagnetic force to be substantially proportional to sound signal intensity information coded in the digital input signal.

12. Apparatus according to claim 1, wherein said plurality of moving elements comprises more than one rows of moving elements wherein consecutive rows are mutually skewed.

13. Apparatus according to claim 7, wherein each said axis comprises a first half-axis and a second co-linear half-axis and said two latching positions includes a first latching position disposed within said first half-axis and a second latching position disposed within said second half-axis.

14. Apparatus according to claim 1, and wherein said magnetic field control system also comprises a magnetic field generator generating a magnetic field across at least a portion of the plurality of moving elements and a magnetic field controller which controls said generator according to said clock.

15. Apparatus according to claim 1, wherein said latch controller is operative to collectively address at least one group of moving elements which is a subset of said plurality of moving elements.

16. Apparatus according to claim 15, wherein, said latch controller is operative to collectively address each of a sequence of groups characterized in that each n'th group in the sequence contains M times as many moving elements as the preceding (n−1)th group where M is an integer.

17. Apparatus according to claim 1, wherein at least one of said moving elements has a cross section defining a periphery and is restrained by at least one flexure attached to said periphery.

18. Apparatus according to claim 17, wherein at least one moving element and its restraining flexures are formed from a single sheet of material.

19. Apparatus according to claim 17, wherein at least one flexure is serpentine.

20. Apparatus according to claim 17, wherein said at least one flexure is formed of an elastic material.

21. Apparatus according to claim 1, wherein said moving element comprises a free floating element.

22. Apparatus according to claim 1, and also comprising a coil that surrounds said plurality of moving elements which is operative to generate said electromagnetic force.

23. Apparatus according to claim 1, wherein the latch is operative to selectively latch at least individual ones of said moving elements in a selectable one of two latching positions thereby to prevent said individual moving elements from responding to said electromagnetic force.

24. Apparatus according to claim 14, wherein said magnetic field generator comprises at least one conductor.

25. Apparatus according to claim 24, wherein said conductor comprises a coil having at least one turn.

26. Apparatus according to claim 14, wherein said magnetic field generator comprises at least one power source connected to at least one conductor.

27. Apparatus according to claim 17, wherein said at least one flexure consists of 3 flexures.

28. Apparatus according to claim 1, wherein at least one latch has a notched configuration.

29. Apparatus according to claim 1, wherein at least one latch has a ring configuration.

30. Apparatus according to claim 1, wherein at least one latch has a perforated configuration.

31. Apparatus according to claim 1, wherein at least one latch has a configuration which includes a central area which prevents air from passing so as to retard escape of air, thereby to cushion contact between at least one moving element and the latch.

32. Apparatus according to claim 17, wherein at least one of said moving elements is configured to prevent leakage of air through the at least one flexure.

33. Apparatus according to claim 32 and also comprising at least one space maintainer disposed between said plurality of moving elements and said latch, said space maintainer defining a cylinder having a cross section, and wherein at least one of the moving elements comprises an elongate element whose cross-section is small enough to avoid the flexures and a head element mounted thereupon whose cross-section is similar to the cross-section of the cylinder.

34. Apparatus according to claim 8, wherein at least one permanent magnet is annular.

35. Apparatus according to claim 8, wherein at least one moving element has first and second sides facing first and second ends of its axis respectively and wherein at least one permanent magnet is disposed on at least one of said first and second sides.

36. Apparatus according to claim 1, wherein said plurality of moving elements comprises more than one rows of moving elements wherein consecutive rows are mutually aligned.

37. Apparatus according to claim 1, wherein said at least one actuating device comprises a plurality of actuating devices.

38. Apparatus according to claim 27, wherein said 3 flexures are separated respectively by 120 degrees.

39. Apparatus according to claim 17 wherein said flexures are non-uniform in cross-section.

40. Apparatus according to claim 39 wherein said flexures include first and second portions having different cross-sectional widths.

41. Apparatus according to claim 39 wherein said flexures include first and second portions having different cross-sectional thicknesses.

42. Apparatus according to claim 3, wherein the largest dimension of each said cross-section is an order of magnitude smaller than said shortest wavelength.

43. Apparatus according to claim 1 wherein said magnetic field control system is operative to receive the clock and, accordingly, to control said application of said electromagnetic force to said plurality of moving elements.

* * * * *